(12) United States Patent
Horikoshi

(10) Patent No.: US 8,454,771 B2
(45) Date of Patent: Jun. 4, 2013

(54) SUBSTRATE BONDING APPARATUS AND SUBSTRATE BONDING METHOD

(75) Inventor: Takahiro Horikoshi, Chofu (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/703,714

(22) Filed: Feb. 10, 2010

(65) Prior Publication Data

US 2010/0139836 A1 Jun. 10, 2010

Related U.S. Application Data

(63) Continuation of application No. PCT/JP2008/002146, filed on Aug. 7, 2008.

(30) Foreign Application Priority Data

Aug. 10, 2007 (JP) ................................. 2007-209781
Jul. 1, 2008 (JP) ................................. 2008-172396

(51) Int. Cl.
*B32B 41/00* (2006.01)
(52) U.S. Cl.
USPC ............. 156/64; 156/350; 156/358; 156/360; 156/367; 156/378; 156/379
(58) Field of Classification Search
USPC ..................... 156/64, 350, 358, 360, 378, 379
See application file for complete search history.

(56) References Cited

U.S. PATENT DOCUMENTS

| | | | | |
|---|---|---|---|---|
| 6,168,678 | B1 * | 1/2001 | Plankenhorn et al. | 156/64 |
| 6,214,692 | B1 * | 4/2001 | Thallner | 438/401 |
| 6,557,607 | B2 * | 5/2003 | Yamada et al. | 156/389 |
| 2008/0245843 | A1 | 10/2008 | Suga et al. | |
| 2010/0252615 | A1 | 10/2010 | Suga et al. | |

FOREIGN PATENT DOCUMENTS

| | | |
|---|---|---|
| JP | 06-334022 | 12/1994 |
| JP | 2005-251972 | 9/2005 |
| JP | 2005-311298 | 11/2005 |

OTHER PUBLICATIONS

Sclater, N., Chironis, N. P. (2001). Mechanisms and Mechanical Devices Sourcebook (3rd Edition). (pp. 3). McGraw-Hill. Online version available at: http://knovel.com/web/portal/browse/display?_EXT_KNOVEL_DISPLAY_bookid=659&VerticalID=0.*
Office Action issued on Apr. 8, 2011 in corresponding Chinese Patent Application No. 200880102420.3.
English Language Translation of Office Action issued on Apr. 8, 2011 in corresponding Chinese Patent Application No. 200880102420.3.
Written Opinion of corresponding PCT Application No. PCT/JP2008/002146 dated Nov. 11, 2008.
Second Office Action issued Apr. 23, 2012 by State Intellectual Property Office of People's Republic of China in corresponding Application No. 200880102420.3 (3 pages).
English-language translation of Second Office Action issued Apr. 23, 2012 by State Intellectual Property Office of People's Republic of China in corresponding Application No. 200880102420.3 (6 pages).
International Search Report of corresponding PCT Application No. PCT/JP2008/002146 dated Nov. 11, 2008.
English-language translation of the Written Opinion of corresponding PCT Application No. PCT/JP2008/002146 dated Nov. 11, 2008.

* cited by examiner

*Primary Examiner* — Katarzyna Wyrozebski Lee
*Assistant Examiner* — Joshel Rivera
(74) *Attorney, Agent, or Firm* — Finnegan, Henderson, Farabow, Garrett & Dunner, L.L.P.

(57) ABSTRACT

A substrate bonding apparatus is equipped with a first table that holds one wafer of two wafers, a stage device that holds the other wafer in an orientation capable of opposing to the one wafer and that is movable at least within an XY plane, an interferometer system that measures positional information of the stage device within the XY plane, a first mark detection system that can detect subject marks including alignment marks on the other wafer held by the stage device, and a second mark detection system fixed to a part (the second table) of the stage device that can detect subject marks including alignment marks on the one wafer held by the first table.

41 Claims, 30 Drawing Sheets

SUBSTRATE BONDING APPARATUS AND SUBSTRATE BONDING METHOD

CROSS-REFERENCE TO RELATED APPLICATIONS

This application is a continuation of International Application PCT/JP2008/002146, with an international filing date of Aug. 7, 2008, the disclosure of which is hereby incorporated herein by reference in its entirety, which was not published in English.

BACKGROUND OF THE INVENTION

1. Field of the Invention

The present invention relates to substrate bonding apparatuses and substrate bonding methods, and more particularly, to a substrate bonding apparatus and a substrate bonding method to align and bond two substrates.

2. Description of the Background Art

Recently, the contents of communication/information processing have grown complex from character information into images, sounds and animations, and the need to transmit and process information of large volumes at high speed arises. Therefore, in the field of manufacturing mobile type electronic appliances such as cell phones, notebook-sized personal computers, audio equipments or digital cameras, the mounting technology of semiconductor devices used in the electronic appliances are being improved so as to cope with much higher functionality and further downsizing of the electronic appliances.

In recent years, the mounting technology of semiconductor devices has progressed from the two-dimensional array mounting in which a plurality of semiconductor chips are placed in a planar manner, to a three-dimensional layered mounting in which a plurality of semiconductor chips are sterically layered. Therefore, the wiring between the semiconductor chips has been shortened and the operation speed of the semiconductor devices has been increased, and also the mounting area efficiency of circuit devices mounted on one semiconductor device has been remarkably improved.

Further, in order to improve manufacturing cost performance, as the assembly (packaging) technology of semiconductor devices, not the assembly technology at a chip-level but the assembly technology at a wafer-level has made progress, or more specifically, the technology has made progress in which an assembly process up to re-wiring, encapsulation and terminal processing is performed, without dividing a semiconductor substrate (a wafer), on which a plurality of circuit devices are formed, into individual chips, i.e. in the state of the wafer, and finally the semiconductor substrate is divided into individual chips, and a device is assembled.

Against this background, a substrate bonding apparatus that bonds two substrates such as semiconductor wafers is developed. In this case, the two semiconductor wafers are bonded such that a plurality of electrodes formed on the surfaces of the semiconductor wafers are connected to each other. Accordingly, in the substrate bonding apparatus, the position adjustment (alignment) technology of semiconductor wafers is one of the most important technologies.

Conventionally, as the alignment technology, as is disclosed in the pamphlet of International Publication No. 2005/067046, the method is employed in which the positions of two semiconductor wafers are aligned by detecting fiducial marks arranged on holders that hold the two semiconductor wafers using, for example, a dual-field camera or a dual-field microscope in a state where the surfaces of the two semiconductor wafers are opposed. However, the size of diameter of the semiconductor wafer is increasing to 8 inches, and then to 12 inches, year by year, and therefore in some cases, the positional deviation is generated between a semiconductor wafer and a holder that holds the semiconductor wafer by electrostatic adsorption, in the case such as when the holder to hold the semiconductor wafer is installed on the substrate bonding apparatus. This positional deviation causes alignment error at a level that cannot always be ignored.

SUMMARY OF THE INVENTION

According to a first aspect of the present invention, there is provided a substrate bonding apparatus that bonds two substrates, the apparatus comprising: a first stage that holds one substrate of the two substrates; a second stage that holds the other substrate of the two substrates in an orientation capable of opposing to the one substrate, and is movable relative to the first stage at least within a two-dimensional plane; a position measuring system that measures positional information of the second stage at least within the two-dimensional plane; a first detection system that can detect a subject mark that includes a mark on the substrate held by the second stage; and a second detection system mounted on the second stage, which can detect a subject mark that includes a mark on the substrate held by the first stage.

In this case, the term "substrate" is a concept that includes a semiconductor chip in addition to a substrate such as a semiconductor wafer, and further the substrate is not limited to a semiconductor wafer having a single layer (or a semiconductor chip having a single layer), but includes a substrate on which a plurality of semiconductor wafers (a plurality of semiconductor chips) have been already layered. In the present specification, the term "substrate" is used in such a meaning.

With this apparatus, the two substrates are respectively held by the first and second stages. And, the mark on the substrate held by the first stage can be detected by the second detection system mounted on the second stage that is movable within the two-dimensional plane, and also the mark on the substrate held by the second stage can be detected by the first detection system. Further, the position measuring system measures the positional information of the second stage at least within the two-dimensional plane. Consequently, by using the detection result of the mark on the substrate held by the first stage obtained by the second detection system, the detection result of the mark on the substrate held by the second stage obtained by the first detection system and the measurement result of the position measuring system at the time of detection of each mark, it becomes possible to align and bond the two substrates with high precision.

According to a second aspect of the present invention, there is provided a first substrate bonding method of bonding two substrates, the method comprising: a first process of causing a first member to hold a first substrate that is one of the two substrates; a second process of causing a second member that is movable at least within a two-dimensional plane to which the first member is opposed to hold a second substrate that is the other of the two substrates; a third process of detecting a common fiducial mark using a first detection system and a second detection system that is mounted on the second member, respectively; a fourth process of detecting a plurality of alignment marks on the second substrate held by the second member using the first detection system, and measuring positional information of the second member at the time of detection of each of the alignment marks; a fifth process of detecting a plurality of alignment marks on the first substrate held by the first member using the second detection system, and measuring positional information of the second member at the time of detection of each of the alignment marks; and a sixth process of overlaying the two substrates based on results of the third, fourth and fifth processes.

With this method, the first and second substrates are respectively made to be held by the first member and the second member that is movable at least within the two-dimensional plane to which the first member is opposed. Then, the common fiducial mark is detected using the first and second detection systems. And, a plurality of alignment marks on the second substrate held by the second member are detected using the first detection system, and also the positional information of the second member at the time of detection of each of the alignment marks is measured. Further, a plurality of alignment marks on the first substrate held by the first member are detected using the second detection system, and also the positional information of the second member at the time of detection of each of the alignment marks is measured. Then, the two substrates are overlaid, based on the detection results of the fiducial mark obtained by the first and second detection systems, the detection results of the plurality of alignment marks obtained by the first detection system and the positional information of the second member at the time of the detection, and the detection results of the plurality of alignment marks obtained by the second detection system and the positional information of the second member at the time of the detection. Accordingly, it becomes possible to bond the two substrates in a state where the two substrates are precisely aligned.

According to a third aspect of the present invention, there is provided a second substrate bonding method of bonding two substrates, the method comprising: a first process of causing a first member to hold a first substrate that is one of the two substrates, parallel to a predetermined two-dimensional plane; a second process of measuring positional information that includes a rotational direction within the two-dimensional plane of the first substrate held by the first member; a third process of causing a second member that is movable within the two-dimensional plane to hold a second substrate that is the other of the two substrates; and a fourth process of bonding both the substrates by adjusting a relative position of the second substrate held by the second member with respect to the first substrate held by the first member.

With this method, after the positional information that includes the rotational direction within the two-dimensional plane of the first substrate held by the first member is measured, the second substrate is made to be held by the second member that is movable within the two-dimensional plane, and further, the relative position of the second substrate held by the second member with respect to the first substrate held by the first member is adjusted, and thereby both the substrates are bonded. Therefore, taking into consideration the measurement result of the positional information that includes the rotational direction within the two-dimensional plane of the first substrate held by the first member, it is possible to make the second member hold the second substrate in a state where the position of the second substrate is adjusted or it is possible to adjust the position of the second substrate after the substrate is mounted on the second member. In either case, the two substrates can be aligned and bonded with high precision.

BRIEF DESCRIPTION OF THE DRAWINGS

In the accompanying drawings.

DESCRIPTION OF THE EMBODIMENTS

First Embodiment

Figure 1:
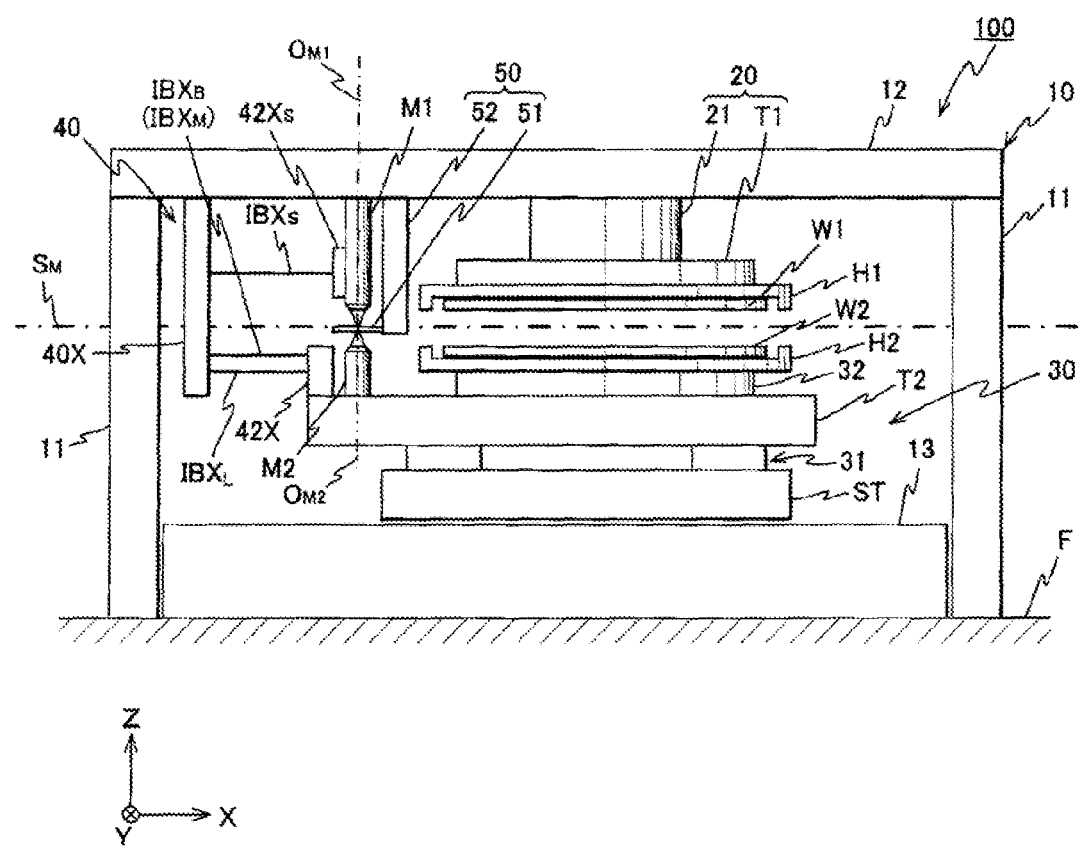
FIG. 1 is a view schematically showing a configuration of a substrate bonding apparatus related to a first embodiment.

A first embodiment of the present invention is described below, referring to FIGS. 1 to 14. FIG. 1 schematically shows a configuration of a substrate bonding apparatus 100 related to the first embodiment.

In substrate bonding apparatus 100, a first mark detection system M1 and an interferometer system 40 are provide (see FIGS. 1 and 2) as is described later on. In the description below, the explanation is given assuming that a direction parallel to an optical axis (which coincides with the detection center) $O_{M1}$ of first mark detection system M1 is a Z-axis direction, a lateral direction of the page surface of FIG. 1 within a plane orthogonal to optical axis $O_{M1}$ is an X-axis direction, a direction orthogonal to the page surface is a Y-axis direction, and rotational (tilt) directions around the X-axis, Y-axis and Z-axis are θx, θy and θz directions, respectively. Incidentally, an XY coordinate system with a reference axis $O_X$ and a reference axis $O_{Y1}$ within a reference plane $S_M$, which is described later on, serving as the X axis and the Y axis, respectively, is used as a reference coordinate system (see FIG. 2).

Substrate bonding apparatus 100 is equipped with a frame 10, a first table device 20, a stage device 30, interferometer system 40, a fiducial mark device 50, and a first mark detection system M1 and a second mark detection system M2, and the like.

Frame 10 is equipped with a top board section 12 horizontally placed (parallel to a floor surface F) above floor surface F that is parallel to an XY plane, and a plurality, e.g. four of leg sections 11 (the leg section in the depth of the page surface of FIG. 1 is not illustrated) that support top board section 12 from below. Further, a stage surface plate 13 is horizontally (parallel to floor surface F) installed on floor surface F.

At a position which is a predetermined distance away on the −X side from the center of the lower surface of top board section 12, first mark detection system M1 described above is fixed facing downward (toward the −Z direction). In this case, mark detection system M1 is configured of a microscope (or an imaging device) having an index. Mark detection system M1 is fixed to the lower surface of top board section 12 such that center axis (optical axis) $O_{M1}$ that passes through the detection center (index center) of mark detection system M1 is orthogonal to reference plane $S_M$ which is described later. The focusing point of mark detection system M1, that is, the detection point to detect a detection subject is adjusted so as to be located on reference plane $S_M$. In substrate bonding apparatus 100 of the present embodiment, two semiconductor wafers (hereinafter, shortly referred to as wafers) W1 and W2 that are bonding subjects are overlaid such that their surfaces coincide with each other in an XY plane (horizontal plane) including the detection point of mark detection system M1, that is, reference plane $S_M$. In other words, in this embodiment, reference plane $S_M$ is a detection plane of mark detection system M1 and also means an overlay reference plane of wafers W1 and W2.

In the image plane inside mark detection system M1 or its conjugate plane, the index is provided and the center of the index serves as the detection center of mark detection system M1. Accordingly, in mark detection system M1, when a subject mark is positioned within the detection field (detection area), the XY position of the subject mark can be measured with the index center (i.e. center axis $O_{M1}$) serving as a reference. Since optical axis $O_{M1}$ of an optical system of mark detection system M1 passes through the index center, optical axis $O_{M1}$ is also referred to as center axis $O_{M1}$ or index center $O_{M1}$.

First table device 2C is arranged at a position slightly away on the +X side from the center of the lower surface of top board section 12. First table device 20 is equipped with a first table T1 horizontally placed below top board section 12 and a first table driving device 21 that supports first table T1 in a suspended state below top board section 12 and also drives first table T1 in a vertical direction (the Z-axis direction). In FIG. 1, wafer W1 is installed on first table T1 via a wafer holder (hereinafter, shortly referred to as a holder) H1. In this case, wafer W1 is held by holder H1 by, for example, electrostatic adsorption, and holder H1 is held by first table T1 by, for example, vacuum suction. However, this is not intended to be limiting, and first table device 20 can hold holder H1 on first table T1 by electrostatic adsorption or a mechanical holding mechanism, or hold wafer W1 on holder H1 by vacuum suction. As is described later on, it is preferable to avoid providing openings in holder H1 as much as possible, in view of the fact that holder H1 is carried to a heating device.

First table driving device 21 drives first table T1 between a position (first position) with which the surface of wafer W1 held by first table T1 coincides with reference plane $S_M$ and a second position (withdrawal position) above (in the +Z direction) the first position.

Stage device 30 is equipped with a stage ST that is movable with a predetermined stroke in the X-axis direction and the Y-axis direction on stage surface plate 13 and is also finely rotatable in the θz direction, a second table driving device 31 installed on stage ST, a second table T2 almost horizontally supported by second table driving device 31, and a wafer mounting section 32 installed on second table T2.

Stage ST is supported by levitation above stage surface plate 13 via a plurality of noncontact bearings, e.g. air bearings arranged on the bottom surface of stage ST, and is driven in the X-axis direction, the Y-axis direction and the θz direction along the upper surface (guide surface) of stage surface plate 13 by a stage driving device 15 (see FIG. 5) including a liner motor or the like. Incidentally, stage driving device 15 is not limited to being configured of the linear motor, but can be configured using any type of driving device such as a combination of a rotary motor and a ball screw (or a feed screw), or a planar motor.

Second table driving device 31 is configured of three Z drive sections 33 (see FIG. 2) respectively installed at three noncollinear points on stage ST. The three Z drive sections 33 each have an actuator, e.g. a voice coil motor or the like, and support second table T2 at three points and finely drive second table T2 in the Z-axis direction at the respective support points. Accordingly, the three Z drive sections 33 configure a Z tilt drive mechanism that finely drives second table T2 in the Z-axis direction, the θx direction and the θy direction.

Wafer mounting section 32 is finely rotatable in the θz direction by a drive mechanism that is not illustrated, and also referred to as a θz table. On wafer mounting section 32, a holder H2 that holds wafer W2 by, for example, electrostatic adsorption, is held (facing upward) so as to be opposed to holder H1 by, for example, vacuum suction. More specifically, on the upper surface of wafer mounting section 32, wafer W2 is held via holder H2.

With the configuration of stage device 30 described above, second table T2 is drivable in all directions of six degrees of freedom (X, Y, Z, θx, θy, θz). More specifically, wafer W2 held by second table T2 is movable in all the directions of six degrees of freedom. Incidentally, second table T2 can be driven by second table driving device 31, within a predetermined range in the Z-axis direction that includes the position of second table T2 with which the surface of wafer W2 held by second table T2 coincides with reference plane $S_M$.

Further, in the vicinity of the end of the upper surface of second table T2 in the −X direction, second mark detection system M2 is mounted facing upward (toward the +Z direction), as shown in FIG. 1. In this embodiment, since second mark detection system M2 is fixed to second table T2, when stage device 30 moves with the XY plane, second mark detection system M2 also moves integrally with stage device 30. In the description below, the explanation about movement of second mark detection system M2 is omitted except for the case when the explanation is especially needed, and only movement of stage device 30 is explained. Incidentally, in FIG. 2, second mark detection system M2 is located below a fiducial mark plate 51 to be described later (in the depth of the page surface of FIG. 2).

Second mark detection system M2 is configured of a microscope (or an imaging device) similar to that of first mark detection system M1. Second mark detection system M2 is fixed onto stage ST such that a center axis (optical axis) $O_{M2}$ that passes through the detection center (index center) of second mark detection system M2 is orthogonal to reference plane $S_M$ when the attitude of second table T2 is set to an attitude (hereinafter, referred to as a reference attitude, for the sake of convenience) in which the upper surface of second table T2 is parallel to the XY plane (and reference plane $S_M$). Accordingly, center axis $O_{M2}$ is parallel to center axis $O_{M1}$ described earlier when second table T2 is in the reference attitude.

In the image plane inside mark detection system M2 or its conjugate plane, the index is provided and the center of the index serves as the detection center of mark detection system M2. In mark detection system M2, when a subject mark is positioned within the detection field (detection area) in a state where the position of second table T2 in the Z-axis direction is adjusted such that the focusing point, that is, the detection point to detect the detection subject is located on reference plane $S_M$, the XY position of the subject mark can be measured with the index center (i.e. center axis $O_{M2}$) serving as a reference. Since optical axis $O_{M2}$ of an optical system of mark detection system M2 passes through the index center, optical axis $O_{M2}$ is also referred to as center axis $O_{M2}$ or index center $O_{M2}$.

Figure 2:
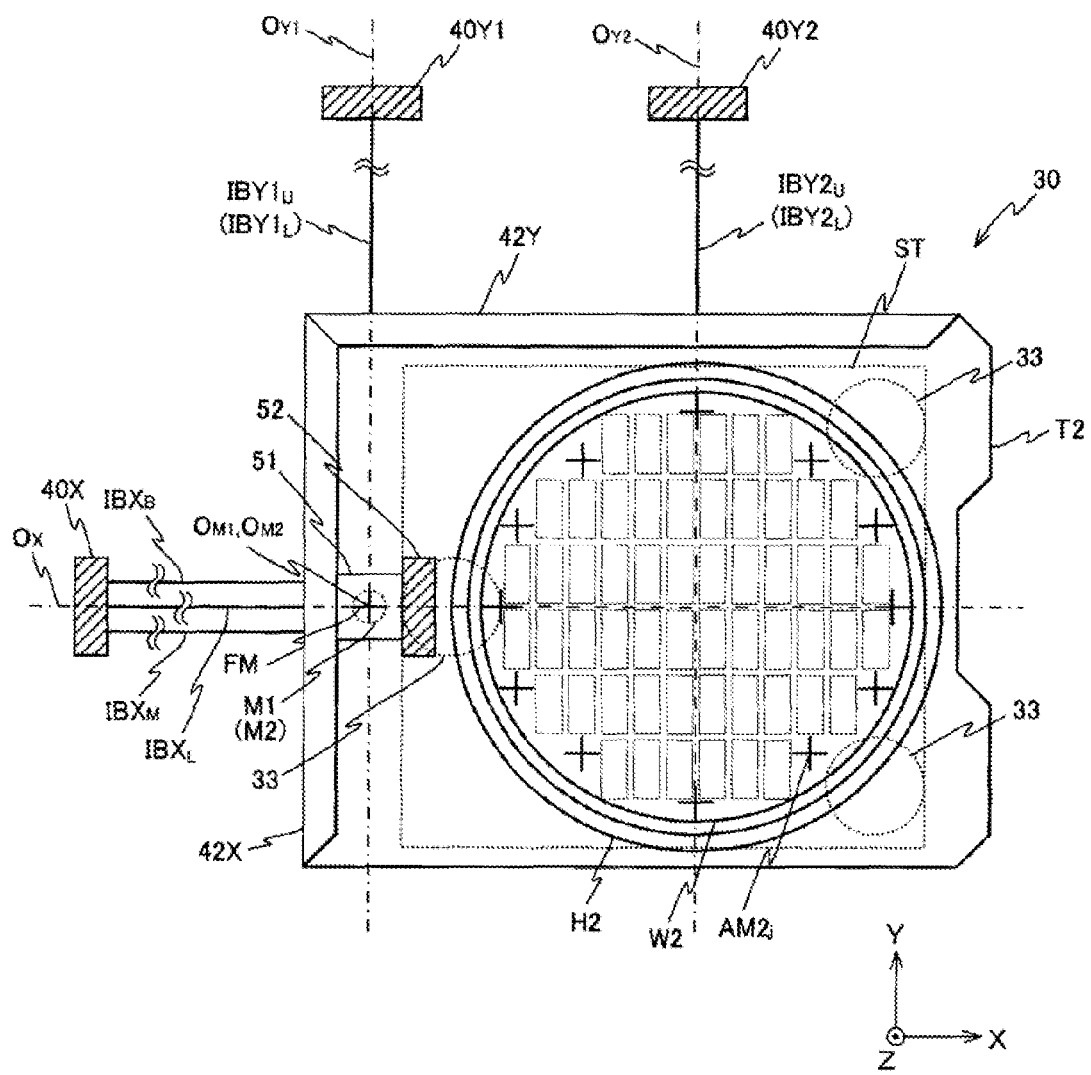
FIG. 2 is a plan view of a stage device, used to explain a placement of a second table (stage) and interferometers, and a reference coordinate system.

Incidentally, in the state shown in FIGS. 1 and 2, stage device 30 (stage ST) is positioned such that center axis $O_{M2}$ of second mark detection system M2 coincides with center axis $O_{M1}$ of first mark detection system M1, or to be more precise, the detection fields of mark detection systems M1 and M2 coincide within, for example, a range of about 100 nm.

Incidentally, the movement stroke in which stage device 30 moves to perform alignment measurement, which is described later on, needs to be at least around 2.5 to 3 folds the width of second table T2 in the X-axis and the Y-axis directions. To be more specific, the movement stroke in the X-axis direction is set to about 100 to 120 cm which is sufficiently long with respect to the length of second table T2 in the X-axis direction, e.g. about 40 cm. However, in FIG. 1, for the sake of drawing the figure, the length of stage surface plate 13 in the X-axis direction is illustrated shorter than the actual proportion, and the installed position of an X interferometer 40X to be described later is illustrated closer to second table T2.

At the −X end and the +Y end of the upper surface of second table T2, as shown in FIG. 2, an X movable mirror 42X made up of a planar mirror having a reflection surface that is perpendicular to the X-axis and a Y movable mirror 42Y made up of a planar mirror having a reflection surface that is perpendicular to the Y-axis are fixed perpendicularly to the upper surface of second table T2, respectively. Movable mirrors 42X and 42Y are used when position measurement of second table T2 (stage device 30) is performed by interferometer system 40 (see FIG. 5). Incidentally, instead of at least one of movable mirrors 42X and 42Y, a reflection surface (corresponding to the reflection surface of the movable mirror) can be formed by mirror-polishing the end surface of second table T2.

As shown in FIG. 2, interferometer system 40 includes X interferometer 40X and a first and a second interferometers 40Y1 and 40Y2, and measures the position (X, Y and θz) of second table T2 (stage device 30) within the XY plane.

As shown in FIGS. 1 and 2, X interferometer 40X irradiates X movable mirror 42X with two measurement beams $IBX_B$ and $IBX_M$ parallel to the X-axis that are the same distance apart in the ±Y direction from a reference axis $O_X$ parallel to the X-axis in a planar view (when viewed from the +Z direction), along optical paths on the same XY plane. Incidentally, in FIG. 1, measurement beams $IBX_B$ and $IBX_M$ overlap in a direction perpendicular to the page surface. Further, X interferometer 40X irradiates X movable mirror 42X with a measurement beam $IBX_L$ along an optical path that is a predetermined distance apart in the −Z direction from the optical paths of measurement beams $IBX_B$ and $IBX_M$ and is parallel to the X-axis along reference axis $O_X$ in a planar view (see FIGS. 1 and 2). Moreover, as shown in FIG. 1, X interferometer 40X irradiates an X reference mirror $42X_S$ arranged on the side surface of first mark detection system M1, with a reference beam $IBX_S$ parallel to the X-axis, as shown in FIG. 1. Then, X interferometer 40X receives the reflected beams of measurement beams $IBX_B$, $IBX_M$ and $IBX_L$ and reference beam $IBX_S$ respectively, and obtains the position in the X-axis direction (X-position) of the irradiation point of each of measurement beams $IBX_B$, $IBX_M$ and $IBX_L$ on the reflection surface of X movable mirror 42X, with the X-position of X reference mirror $42X_S$ serving as a reference. Incidentally, reference axis $O_X$ and the optical path of measurement beam $IBX_L$ are respectively orthogonal to center axis (optical axis) $O_{M1}$.

As shown in FIG. 2, first Y interferometer 40Y1 irradiates Y movable mirror 92Y with measurement beams $IBY1_U$ and $IBY1_L$ (measurement beam $IBY1_L$ overlaps with measurement beams $IBY1_U$ in FIG. 2) along two optical paths parallel to the Y-axis in a planar view, which overlap with reference axis $O_{Y1}$ and are a predetermined distance apart in the Z-axis direction. First Y interferometer 40Y1 further irradiates a reference mirror (not illustrated) arranged on the side surface of first mark detection system M1 with a reference beam (not illustrated) parallel to the Y-axis. Then, first Y interferometer 40Y1 receives the reflected beams of measurement beams $IBY1_U$ and $IBY1_L$ and the reference beam respectively, and obtains the position in the Y-axis direction (Y-position) of the irradiation point of each of measurement beams $IBY1_U$ and $IBY1_L$ on the reflection surface of Y movable mirror 42Y, with the Y-position of the reference mirror serving as a reference. Incidentally, each of reference axis $O_{Y1}$ and measurement beam $IBY1_L$ is orthogonal to reference axis $O_X$ and the optical path of measurement beam $IBX_L$ at the point on center axis (optical axis) $O_{M1}$. Further, the optical path of measurement beam $IBY1_U$ is orthogonal to an axis parallel to reference axis $O_X$, which is located on the same XY plane as with measurement beams $IBX_B$ and $IBX_M$, at a point on center axis (optical axis) $O_{M1}$.

Similarly, second Y interferometer 40Y2 irradiates Y movable mirror 42Y with measurement beams $IBY2_U$ and $IBY2_L$ (measurement beam $IBY2_L$ overlaps with measurement beam $IBY2_U$ in FIG. 2) along two optical paths parallel to the Y-axis in a planar view, which overlap with a reference axis $O_{Y2}$ and are a predetermined distance apart in the Z-axis direction. Second Y interferometer 40Y2 incorporates a reference mirror, and irradiates the reference mirror with a reference beam. Then, second Y interferometer 40Y2 receives the reflected beams of measurement beams $IBY2_U$ and $IBY2_L$ and the reference beam respectively, and obtains the Y-position of the irradiation point of each of measurement beams $IBY2_U$ and $IBY2_L$ on the reflection surface of Y movable mirror 42Y, with the Y-position of the reference mirror serving as a reference (i.e. which substantially coincides with the optical path lengths of measurement beams $IBY2_U$ and $IBY2_L$). Reference axis $O_{Y2}$ is spaced apart from reference axis $O_{Y1}$ in the +X direction by substantially the same distance as the separation distance between (the detection center of) second mark detection system M2 and (the mounting center of) wafer W2 in the X-axis direction. Incidentally, each of reference axis $O_{Y2}$ and measurement beam $IBY2_L$ is orthogonal to reference axis $O_X$ and the optical path of measurement beam $IBX_L$. Further, the optical path of measurement beam $IBY2_U$ is orthogonal to an axis parallel to reference axis $O_X$, which is located on the same XY plane as with measurement beams $IBX_B$ and $IBX_M$. Incidentally, as second Y interferometer 40Y2, an interferometer similar to first Y interferometer 40Y1 is used, and the reference mirror for the interferometer can be fixed to top board section 12 in a suspended state.

Incidentally, while all of measurement beams $IBY1_U$ and $IBY1_L$ of Y interferometer 40Y1 and measurement beams $IBY2_U$ and $IBY2_L$ of Y interferometer 40Y2 are irradiated on Y movable mirror 42Y in the state shown in FIG. 2, the situation arises where only measurement beams $IBY1_U$ and $IBY1_L$ of Y interferometer 40Y1 or only measurement beams $IBY2_U$ and $IBY2_L$ of Y interferometer 40Y2 are irradiated on Y movable mirror 42Y according to the X-position of second table T2 (stage device 30), for example, when second table T2 moves in the −X direction or the +X direction from the state shown in FIG. 2. Therefore, a controller 120 (see FIG. 5) selects and uses the interferometer whose measurement beams are irradiated on Y movable mirror 42Y from the two Y interferometers 40Y1 and 40Y2, according to the X-position of second table T2. In this case, when second table T2 moves in the X-axis direction, the Y-position of second table T2 that is measured by interferometer system 40 needs to show consecutive values. Therefore, in a state where the measurement beams from the two adjacent Y interferometers are simultaneously irradiated on Y movable mirror 42Y, controller 120 performs carry-over of the measurement values between the adjacent Y interferometers and switching of the interferometer to be used (linkage process).

Then, controller 120 computes the X-position and the position in the θz direction (rotational angle θz) of second table T2 based on the measurement result of X interferometer 40X, or more specifically, the average value and the difference of the measurement results of the X-positions of the irradiation points of measurement beams $IBX_B$ and $IBX_M$. Further, controller 120 computes the position in the θy direction (rotational angle θy) of second table T2 based on the difference between the X-position of second table T2 (or the measurement result of the X-position of the irradiation point of either of measurement beam $IBX_B$ or $IBX_M$) and the measurement result of the X-position of the irradiation point of measurement beam $IBX_L$. Further, controller 120 computes the Y-position of second table T2 from the measurement results of first and second Y interferometers 40Y1 and 40Y2, or more specifically, the measurement results of the Y-positions of the irradiation points of measurement beams $IBY1_U$ and $IBY2_U$. Further, controller 120 computes the position in the θx direction (rotational angle θx) of second table T2, based on the difference between the measurement results of the Y-positions of the irradiation points of measurement beams $IBY1_U$ and $IBY1_L$ and the difference between the measurement results of the Y-positions of the irradiation points of measurement beams $IBY2_U$ and $IBY2_L$, respectively.

Incidentally, in the case of Y interferometers 40Y1 and 40Y2, although controller 120 performs the linkage process described above between the adjacent Y interferometers according to the X-position of second table T2 (stage device 30), the explanation about this linkage process is omitted in the description below unless the explanation is needed in particular.

As shown in FIG. 1, fiducial mark device 50 has a mark plate 51 and a mark plate driving device 52 that drives the mark plate.

In substrate bonding apparatus 100 in this embodiment, since the front and back surfaces of the fiducial mark are simultaneously detected using mark detection systems M1 and M2 that are opposed to each other, the countermeasures need to be taken so as to effectively suppress or prevent the occurrence of detection error owing to the halving effect in the case when the degree of orthogonality of the mark plate with respect to the optical axes of the mark detection systems is not sufficient. Therefore, in this embodiment, mark plate 51 by a membrane method is employed.

Figure 3A:
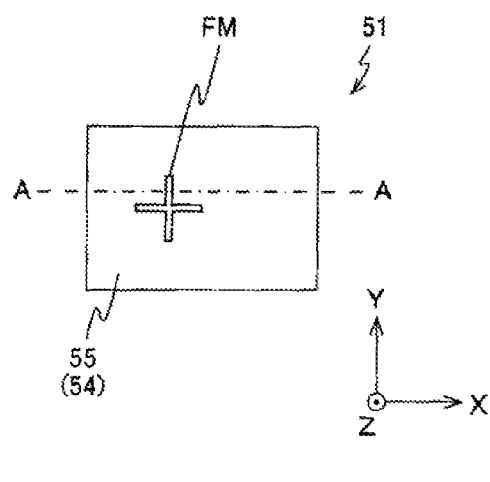
FIG. 3A is a plan view showing a mark plate.
Figure 3B:
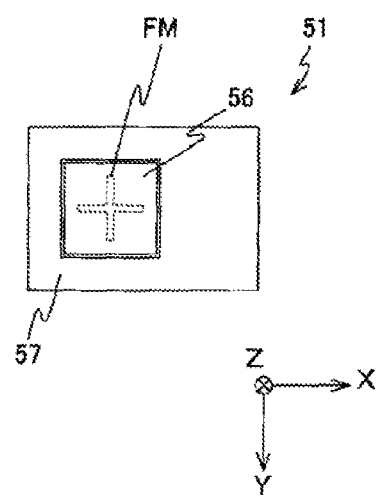
FIG. 3B is a bottom surface view showing the mark plate.
Figure 3C:
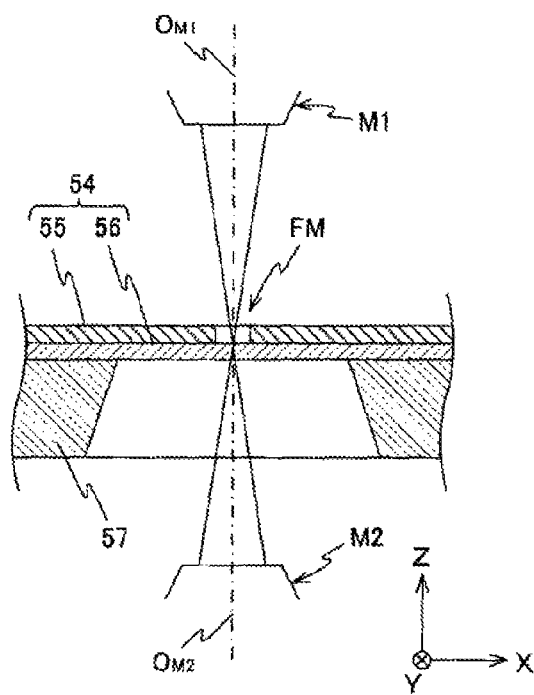
FIG. 3C is a view showing a cross section along the line A-A of the mark plate in FIG. 3A with partial omission, together with a first and a second detection systems.
Figure 3D:
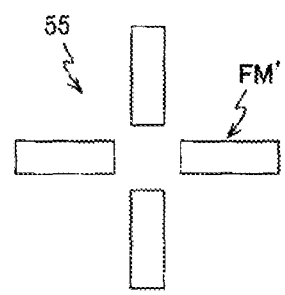
FIG. 3D is a view showing another example of a fiducial mark.
Figure 3D:
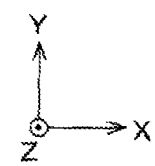

FIGS. 3A to 3C show mark plate 51 by a membrane method. Of these drawings, FIG. 3A shows a plan view of mark plate 51, FIG. 3B shows a bottom surface view of mark plate 51 and FIG. 3C shows a cross section along the line A-A of mark plate 51 in FIG. 3A with partial omission, together with first and second detection systems M1 and M2.

As can be seen when viewing FIGS. 3B and 3c together, mark plate 51 is equipped with a base member 57 that is made of a plate-shaped silicon Si having a predetermined thickness (e.g. 1 to 2 mm) in which a substantially square opening is formed whose inner periphery surface in the vicinity of one end is formed into a tapered shape and whose one side is, for example, around 1 mm, and a membrane-like mark member 54 having a predetermined thickness (e.g. less than or equal to 1 μm) attached to the upper surface of base member 57. As shown in FIG. 3C, in this case, mark member 54 is made up of a light-transmitting membrane 56 made of, for example, silicon nitride (SiN) and a light-shielding membrane 55 layered on the surface on the +Z side (the surface on the opposite side to base member 57) of light-transmitting membrane 56. As light-shielding membrane 55, while a thin membrane made up of various materials can be used, tantalum Ta is used as the material as an example. As shown in FIGS. 3A and 3B, in light-shielding membrane 55, a fiducial mark FM made up of a cross-shaped slit is formed in the opening section of base member 57. The slit of fiducial mark FM has a length of, for example, several hundreds μm and a width of around 20 to 30 μm. In this case, light-transmitting membrane 56 also serves as a reinforcing member of light-shielding membrane 55. Accordingly, if the intensity of light-shielding membrane 55 can be secured even with fiducial mark FM formed therein, the mark member can be configured of only light-shielding membrane 55.

As shown in FIG. 3C, fiducial mark FM can be simultaneously detected from one surface side (+Z side) of mark member 54 using first mark detection system M1 and from the other surface side (−Z side) using second mark detection system M2. In this case, detection of a subject mark by the mark detection system means that the subject mark is positioned within the detection field of the mark detection system by adjusting the focus (i.e. by causing the detection surface of the mark to substantially coincide with the focal point of the mark detection system), and the position of the subject mark is measured with the index center of the mark detection system serving as a reference.

In this embodiment, first mark detection system M1 is also used for detection of alignment marks on wafer W2 in addition to detection of fiducial mark FM, as described later on. Therefore, as first mark detection system M1, the type of microscope (or imaging device) is used that detects marks by receiving a reflected light from the subject mark of a probe light that is emitted from a light source to the subject mark (in the case of fiducial mark FM, a reflected light from light-transmitting membrane 56). Therefore, as the wavelength of the probe light of first mark detection system M1, a wavelength whose transmittance with respect to light-transmitting membrane 56 is less than 60% (reflectance is greater than or equal to 40%) is selected. In other words, a light source that emits a light with such a wavelength is used.

Similarly, second mark detection system M2 is also used for detection of alignment marks on wafer W1, in addition to detection of fiducial mark FM, as is described later on. Therefore, as second mark detection system M2, a microscope (or an imaging device) having a similar configuration to first mark detection system M1 is used.

Incidentally, if first mark detection system M1 and/or second mark detection system M2 detect(s) only fiducial mark FM, then as the detection system that detects only fiducial mark FM, the type of microscope that detects fiducial mark FM by receiving a probe light from another microscope via fiducial mark FM (the slit of light-shielding membrane 55, and light-transmitting membrane 56) can be used. However, in the case when first mark detection system M1 detects only fiducial mark FM, another detection system used to detect alignment marks on wafer W2 needs to be arranged separately, and in the case when second mark detection system M2 detects only fiducial mark FM, another detection system used to detect alignment marks on wafer W1 needs to be arranged separately.

In FIG. 3C, mark plate 51 and second mark detection system M2 are positioned such that membrane-like mark member 54 is orthogonal to center axes $O_{M1}$ and $O_{M2}$ of mark detection systems M1 and M2 and the detection surface of the mark coincides with the focal point (i.e. the detection point) of the probe lights of both mark detection systems M1 and M2. In this case, the thickness of mark member 54 (to be precise, light-transmitting membrane 56) is thin enough to be ignored with respect to the depth of focus of mark detection systems M1 and M2. In FIG. 3C, mark member 54 (light-transmitting membrane 56) is illustrated thicker than the actual proportion, for the sake of convenience in illustration. In the best focused state show in FIG. 3C, a distance between the end of a housing (barrel) of mark detection system M1 or M2 and the detection surface of fiducial mark FM (the upper surface of light-transmitting membrane 56) is, for example, about 7 mm, and a separation distance between the ends of the housings of mark detection systems M1 and M2 is, for example, about 14 mm.

Incidentally, instead of fiducial mark FM described above, as shown in FIG. 3D, a fiducial mark FM', which is made up of four rectangular slits placed in a roughly cross shape, can be formed in light-shielding membrane 55. Further, in the case of fiducial mark FM', since the section in the center portion of the cross is the remaining portion, the sufficient intensity is likely to be secured. Accordingly, fiducial mark FM' can be directly formed on plate-shaped silicon Si having, for example, a predetermined thickness (e.g. 1 to 2 mm). However, if such a direct formation is employed, the type of detection system that receives a transmitted light exclusively for detection of fiducial mark FM' needs to be provided as the first and second mark detection systems, respectively.

First and second mark detection systems M1 and M2 are used to also detect alignment marks on wafer W2 and W1, respectively, and when these alignment marks are detected, controller 120 (see FIG. 5) moves stage device 30 from one side of first mark detection system M1 to the other side in the X-axis direction. When this movement of stage device 30 is performed, mark plate 51 needs to be withdrawn from the position shown in FIG. 1, where fiducial mark FM can be simultaneously detected by mark detection systems M1 and M2, so as not to block the movement. Therefore, in this embodiment, mark plate driving device 52 that drives mark plate 51 is provided. Incidentally, the position of mark plate 51 where fiducial mark FM can be simultaneously detected by mark detection systems M1 and M2 is referred to as a detection position and the position to which mark plate 51 withdraws is referred to as a withdrawal position.

FIGS. 4A to 4F show three types of mark plate driving devices, as examples. Herein, the three types of mark plate driving devices are explained using reference signs 52A, 52B and 52C, for identification.

Figure 4A:
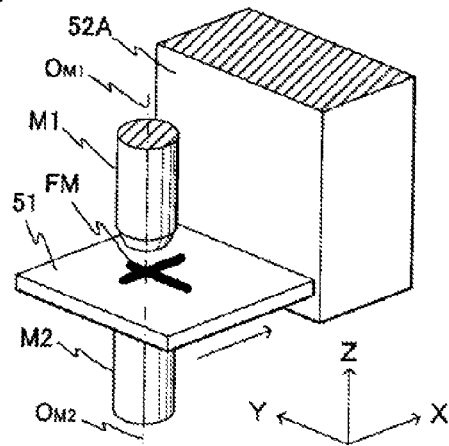
FIGS. 4A and 4B are views used to explain a configuration and the like of a mark plate driving device by a slide method.
Figure 4B:
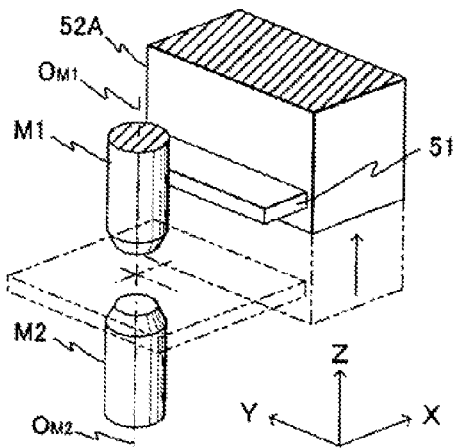

FIGS. 4A and 4B show a mark plate driving device 52A by a slide method. Mark plate driving device 52A causes mark plate 51 to slide from the position with which fiducial mark FM is positioned within the detection field of first mark detection system M1 (i.e. the detection position), in an arrowed direction (+X direction), via a drive mechanism (not illustrated) built into the main section, as shown in FIG. 4A, and mark plate driving device 52A houses mark plate 51 inside, as shown in FIG. 4B. Then, after mark plate 51 is housed, mark plate 51 withdraws to the withdrawal position by mark plate driving device 52A moving upward (moving in the +Z direction).

Figure 4C:
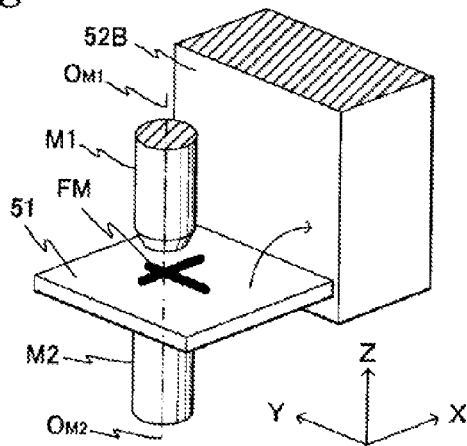
FIGS. 4C and 4D are views used to explain a configuration and the like of a mark plate driving device by a folding method.
Figure 4D:
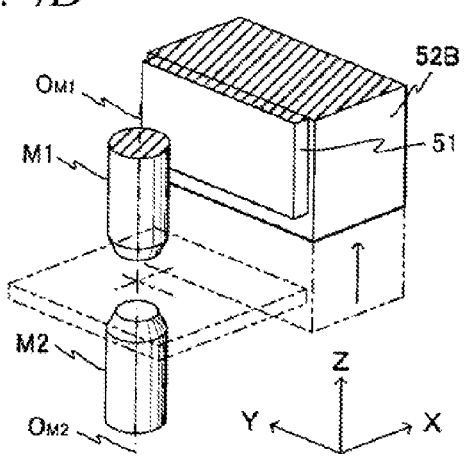

FIGS. 4C and 4D show a mark plate driving device 52B by a folding method. Mark plate driving device 52B folds mark plate 51 located at the detection position, in an arrowed direction, via a drive mechanism (not illustrated), as shown in FIG. 4C, and mark plate 51 is fixed to the side surface of mark plate driving device 52B using, for example, vacuum suction or an attachment. After mark plate 51 is fixed, mark plate 51 withdraws to the withdrawal position by mark plate driving device 52B moving upward (moving in the +Z direction).

Figure 4E:
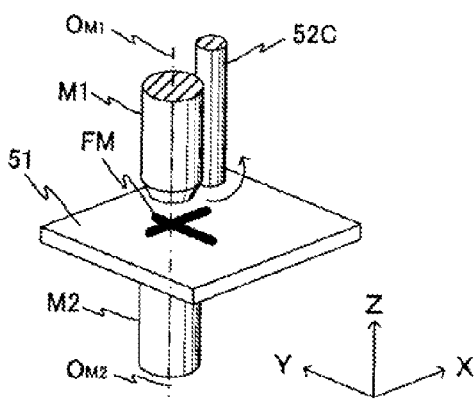
FIGS. 4E and 4F are views used to explain a configuration and the like of a mark plate driving device by a rotation method.
Figure 4F:
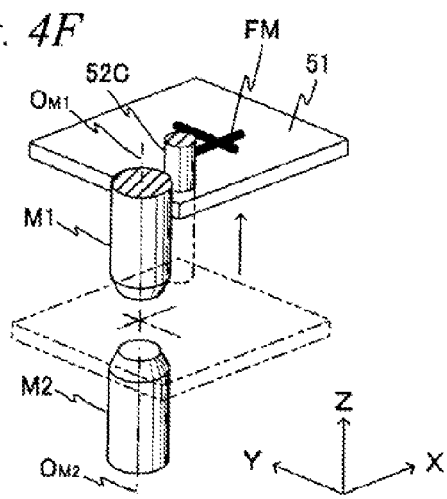

FIGS. 4E and 4F show a mark plate driving device 52C by a rotation method. As shown in FIG. 4E, mark plate 51 is integrated with mark plate driving device 52C having a cylindrical shape. Mark plate 51 located at the detection position is rotated around the center axis of mark plate driving device 52C by mark plate driving device 52C performing θz rotation in an arrowed direction. Then, after mark plate 51 is rotated, mark plate 51 withdraws to the withdrawal position by mark plate driving device 52C moving upward (moving in the +Z direction).

Either of mark plate driving devices 52A to 52C can move mark plate 51 from the withdrawal position to the detection position in the procedure inverse to the above procedure.

Incidentally, in this embodiment, while mark plate driving device 52 (either of 52A to 52C) is fixed to top board section 12 in a suspended state, this is not intended to be limiting, and the setting position of mark plate driving device 52 can be arbitrarily selected as far as mark plate 51 can be moved between the detection position and the withdrawal position as is described above. For example, mark plate driving device 52 can be fixed to stage ST or second table T2. The latter case has the advantage that the position of mark plate 51 at least in Z-axis direction can be adjusted.

Figure 5:
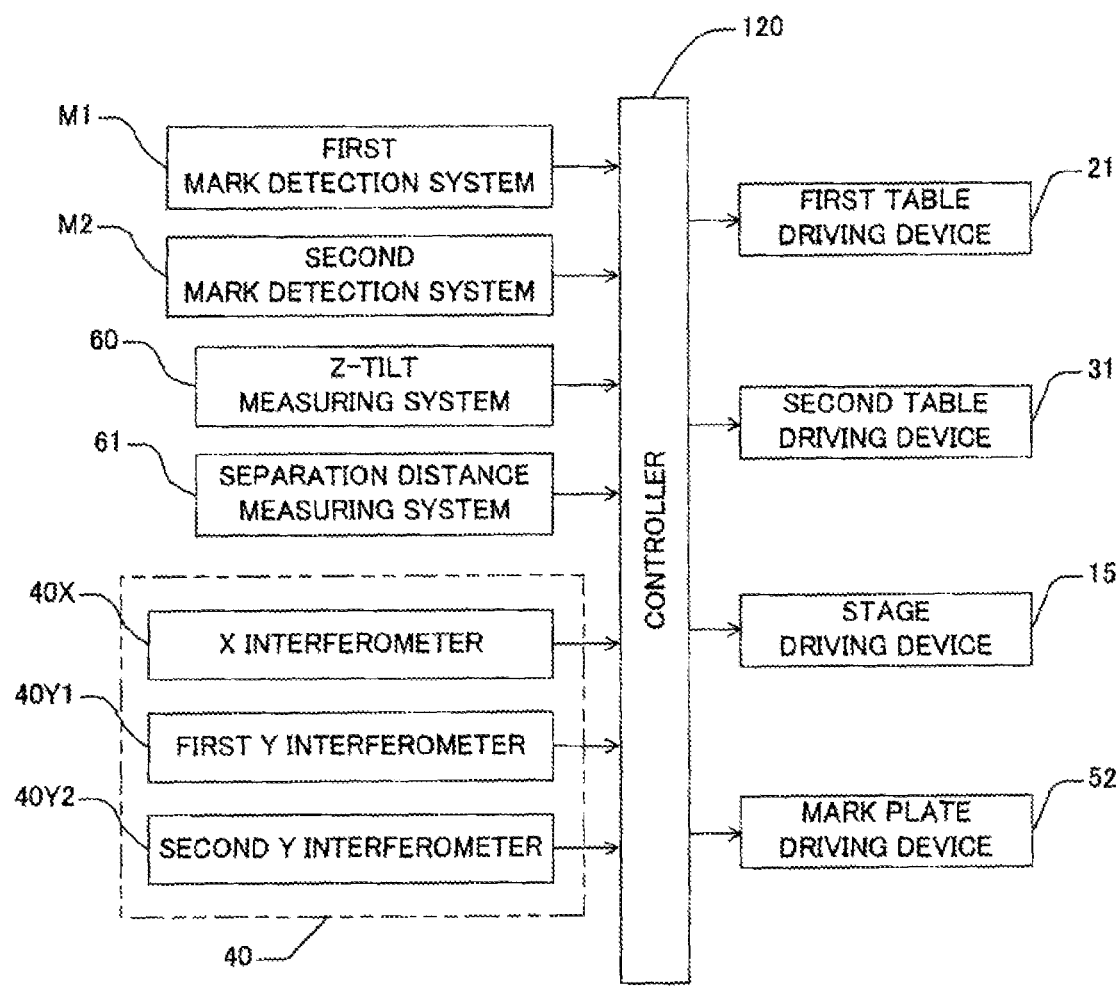
FIG. 5 is a block diagram showing a main configuration of a control system of the substrate bonding apparatus related to the first embodiment.

FIG. 5 shows a main configuration of a control system of substrate bonding apparatus 100. This control system is configured of controller 120 as the center, which is composed of a microcomputer (or a workstation) that performs overall control of the entire apparatus. Incidentally, as shown in FIG. 5, substrate bonding apparatus 100 is equipped with, as backups, a Z-tilt measuring system 60 that measures the Z-position and tilt (θx, θy) of second table T2 and a separation distance measuring system 61 that measures the separation distance between wafer W1 held by first table T1 and wafer W2 held by second table T2 (stage ST).

Figure 6:
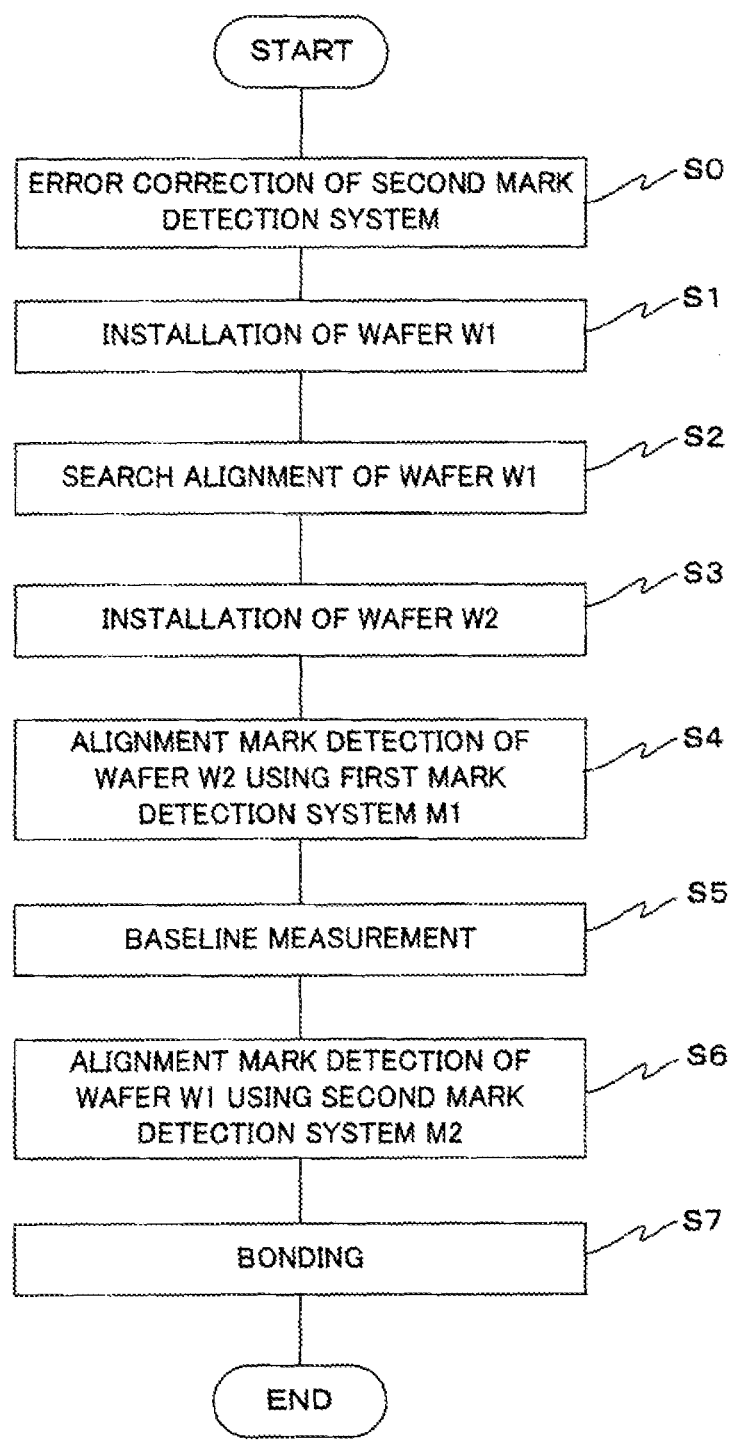
FIG. 6 is a flowchart showing the procedure of a substrate bonding method.

Next, a substrate bonding method, which is performed in substrate bonding apparatus 100 of the present embodiment, is described, along a flowchart in FIG. 6 that shows an example of the procedure of the substrate bonding method, and also referring to FIGS. 7 to 14 as needed. In this case, it is assumed that substrate bonding apparatus 100 is equipped with mark plate driving device 52B by the folding method described earlier (see FIGS. 4C and 4D). Incidentally, the position of index center (center axis) $O_{M2}$ of second mark detection system M2 with index center (center axis) $O_{M1}$ of first mark detection system M1 serving as a reference is defined as an XY position $r_{ST}(=(X_{ST}, Y_{ST}))$ of stage ST (stage device 30) on which second mark detection system M2 is mounted via second table T2. Incidentally, since error correction of second mark detection system M2 in step S0 shown in the flowchart of FIG. 6 is a process that is performed as needed, this step S0 is described later on. Further, the XY position of stage ST (stage device 30), which is described below, is defined in a reference coordinate system using index center (center axis) $O_{M1}$ of first mark detection system M1 as a reference.

Figure 7:
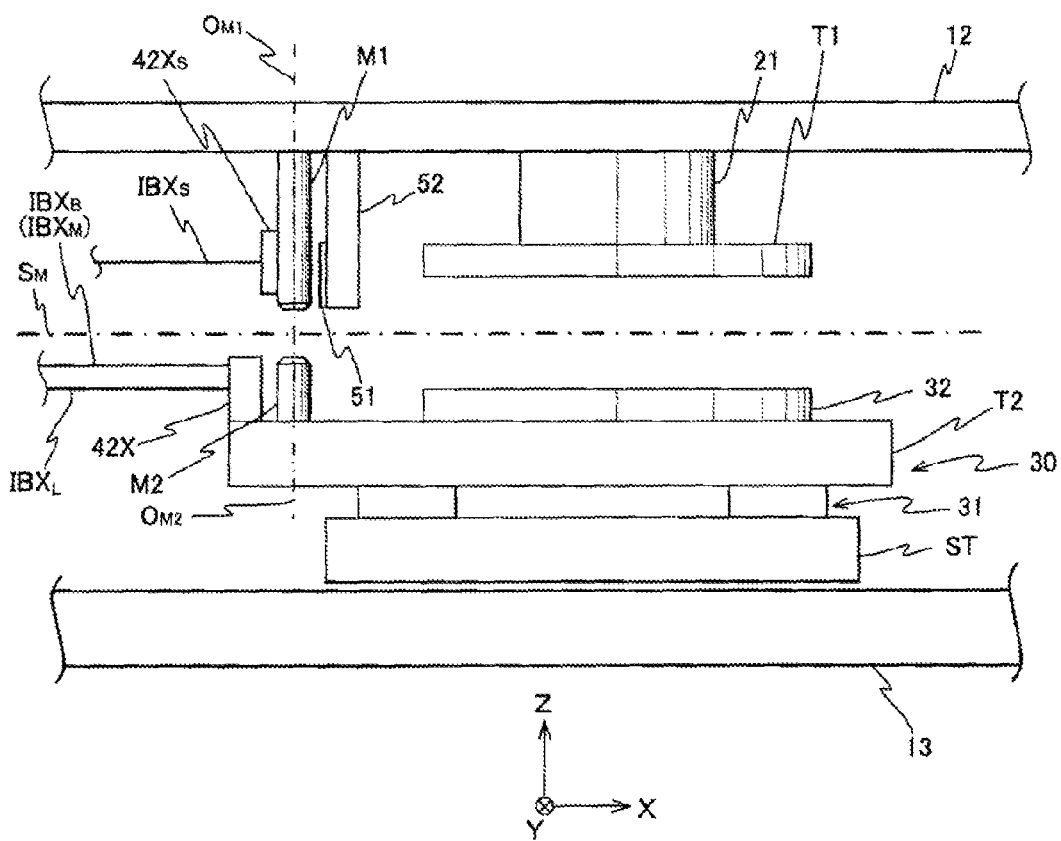
FIG. 7 is a view showing a state of the substrate bonding apparatus just before a substrate bonding process is performed.

FIG. 7 shows a state of substrate bonding apparatus 100 just before the processing of a series of substrate bonding processes is started. In the state in FIG. 7, a wafer has not yet been installed on first and second table T1 and T2. Stage device 30 waits at a standby position (which is also referred to as a loading position hereinafter, because the wafer is loaded onto second table T2 at this standby position, as is described later). And, first table T1 has been withdrawn to the second position. In substrate bonding apparatus 100, the preparatory processing as below is performed in this state. Controller 120 measures positional information (XY position $r_{ST}$) of stage device 30 within the XY plane using interferometer system 40 subsequently in all the processes of the substrate bonding method.

Figure 8:
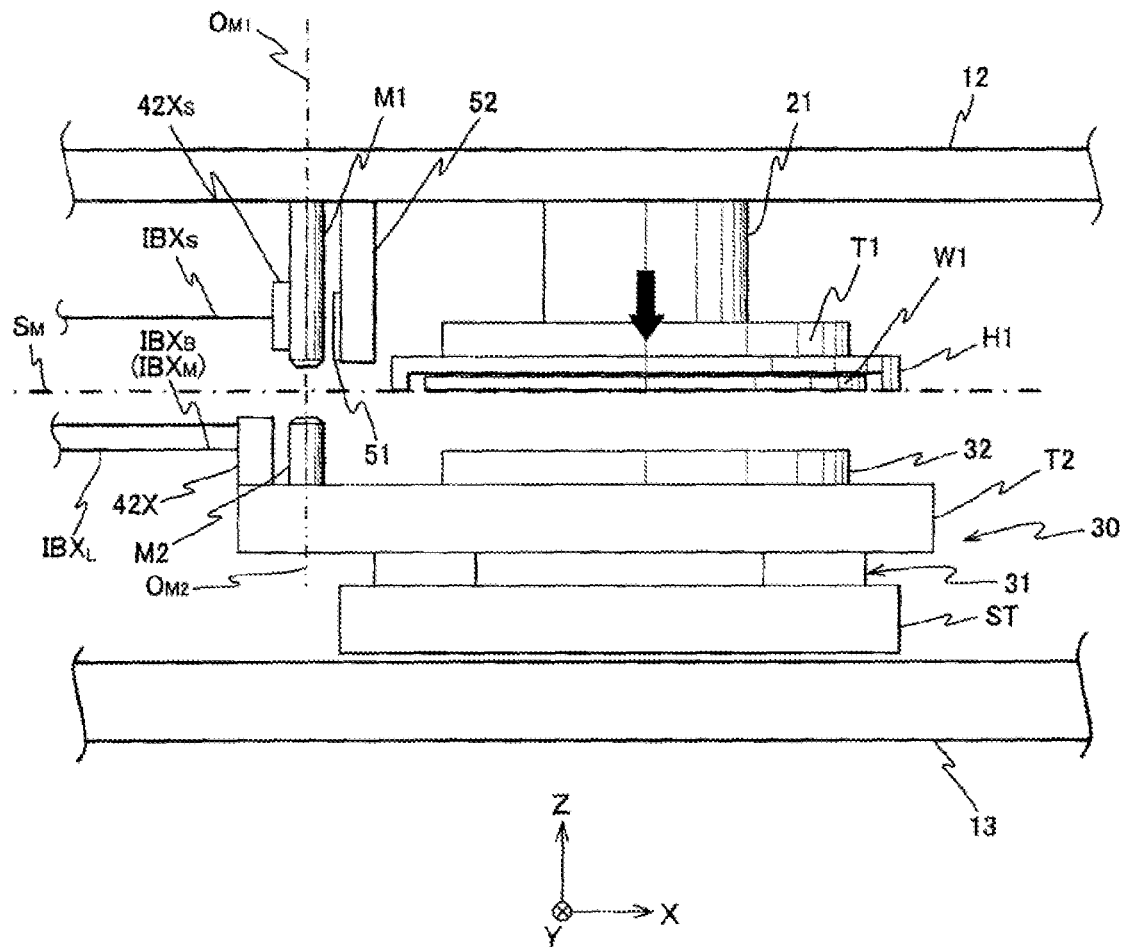
FIG. 8 is a view used to explain step S1 (a step of causing a first table to hold a wafer) of the substrate bonding method.

Prior to step S1, controller 120 resets interferometer system 40 that measures the positional information of stage device 30 (second table T2) within the XY plane. However, the positional relation between the reference point (center axis $O_{M1}$ of first mark detection system M1) in the reference coordinate system and stage device 30 is uniquely determined in an automatic manner. Further, as shown in FIG. 8, controller 120 drives first table T1 in the −Z direction indicated by a black arrow in FIG. 8 via first table driving device 21 and causes first table T1 to be located at the first position described previously.

Step S1

In step S1 in FIG. 6, controller 120 installs wafer W1 onto first table T1. More specifically, first of all, controller 120 carries holder H1 to the position shown in FIG. 8 using a carrier member (e.g. a robot arm) of a carrier system that is not illustrated, and causes first table T1 to hold holder H1 by vacuum suction via a vacuum chuck (not illustrated). Subsequently, controller 120 performs pre-alignment (alignment on the basis of the outer shape (adjustment of the center position and the θz rotation)) of wafer W1 via a pre-alignment device that is not illustrated. Next, controller 120 sends wafer W1 after the pre-alignment to a reversing device, which is not illustrated, using the carrier member. The front and back sides of wafer W1 are reversed by this reversing device. Controller 120 carries wafer W1 after the reversal to an area below holder H1 using the carrier member, and causes holder H1 to hold wafer W1 by electrostatic adsorption. Accordingly, wafer W1 is held by first table T1 with its surface facing below (the −Z direction) and horizontally. Incidentally, the surface (the lower surface) of wafer W1 is positioned on reference plane $S_M$.

Step S2

In step S2 in FIG. 6, controller 120 executes search alignment to wafer W1 installed on first table T1. In this case, it is assumed that on the surface of wafer W1, a plurality of alignment marks (which are denoted as $AM1_i$ (i=1 to N)) are formed in the vicinity of shot areas near the circumferential edge, for example, similar to wafer W2 shown in FIG. 2.

Figure 9A:
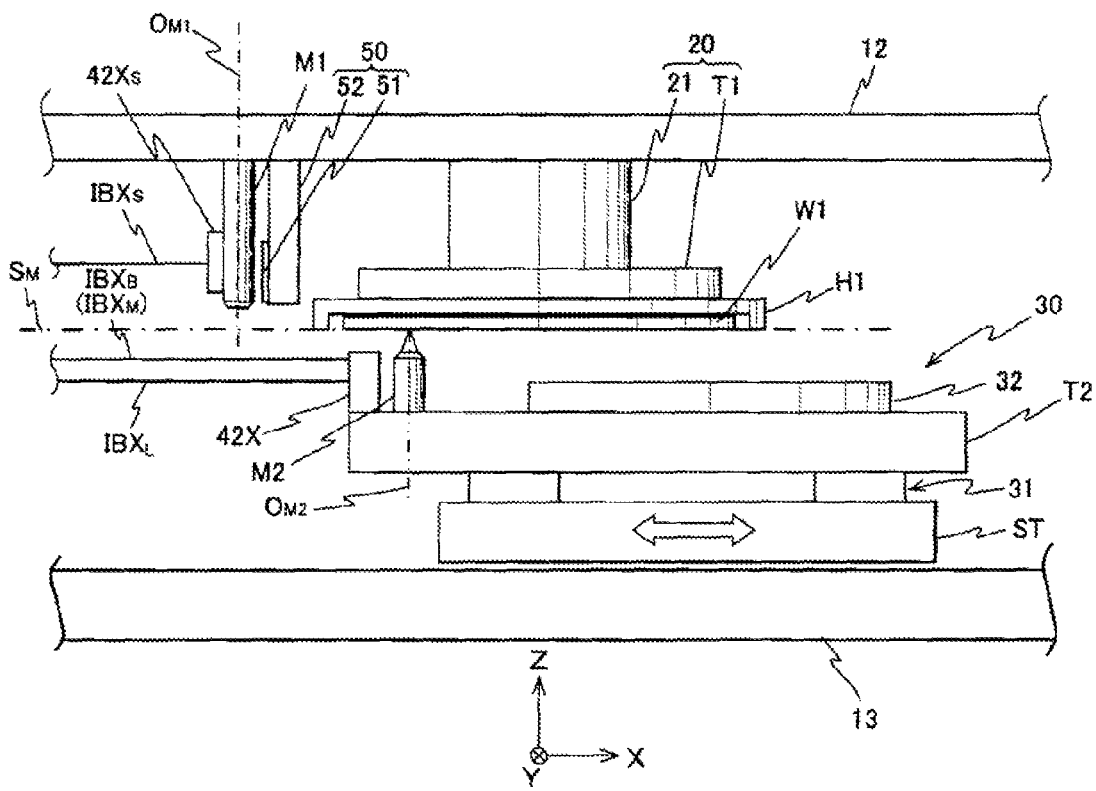
FIG. 9A is a view used to explain step S2 (a search alignment process for the wafer held by the first table) of the substrate bonding method.

To be more specific, as shown in FIG. 9A, controller 120 drives stage device 30 in a horizontal direction (a direction indicated ay an outlined arrow in the drawing) via stage driving device 15 (see FIG. 5) according to the positional information ($r_{ST}$) of stage device 30, and positions alignment mark $AM1_i$ of wafer W1 within the detection field of second mark detection system M2 fixed to second table T2. Incidentally, the drive of stage device 30 (stage ST) is performed by controller 120 via stage driving device 15, based on measurement information of interferometer system 40. Further, when this drive of stage device 30 (stage ST) is performed, the attitude of second table T2 is maintained by controller 120 via second table driving device 31 such that the rotational angles θx and θy of second table T2 are both zero (i.e. optical axis $O_{M2}$ of second mark detection system M2 is perpendicular to reference plane $S_M$). In the following processes as well, while stage device 30 (stage ST) including second table T2 is similarly driven, the explanation regarding interferometer system 40 and stage driving device 15, and second table T2 is omitted in the description below, except for the case when the explanation is especially necessary.

Figure 9B:
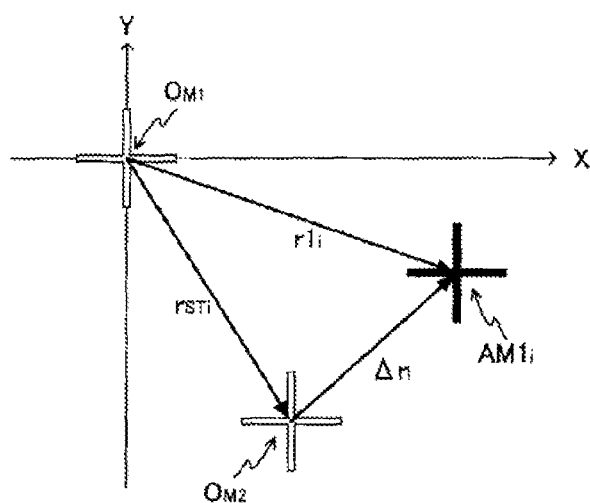
FIG. 9B is a view used to explain a positional relation between an alignment mark measured in the search alignment and an index center.

FIG. 9B shows, in a simplified manner, the positional relation between index centers $O_{M1}$ and $O_{M2}$ of mark detection systems M1 and M2 and alignment mark $AM1_i$ at this point in time. Controller 120 measures a positioning position $r_{STi}$ of stage device 30 at this point in time. And, controller 120 detects alignment mark $AM1_i$ using second mark detection system M2. More specifically, controller 120 measures a position $\Delta r_i$ of alignment mark $AM1_i$ with index center $O_{M2}$ of second mark detection system M2 serving as a reference. From the measurement result of positioning position $r_{STi}$ and the measurement result of position $\Delta r_i$, a position $r1_i$, which has detected with index center $O_{M1}$ of first mark detection system M1 serving as a reference, can be obtained as $r1_i = r_{STi} + \Delta r_i$. Controller 120 executes the above-described measurement to obtain $r1_i$ to at least two alignment marks, and obtains the rotational angle (rotational amount) θz of wafer W1 within the XY plane from those results.

Figure 10:
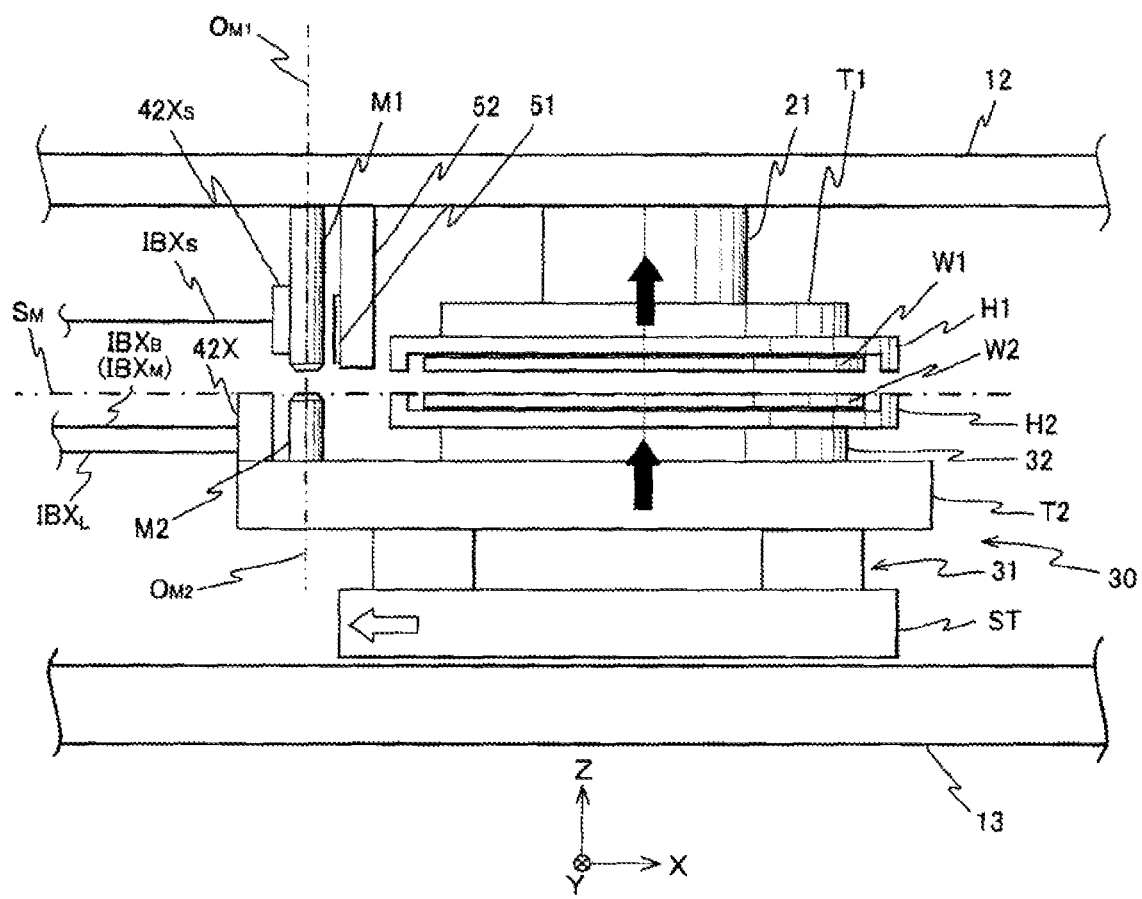
FIG. 10 is a view used to explain step S3 (a step of causing a second table to hold a wafer) of the substrate bonding method.

After the search alignment of wafer W1 described above has been completed, controller 120 drives first table T1 in a direction indicated by a black arrow (the +Z direction) in the drawing via first table driving device 21, as shown in FIG. 10, and causes first table T1 to withdraw to the second position. Further, controller 120 drives stage device 30 from the position shown in FIG. 9 in a direction indicated by an outlined arrow (the −X direction) in FIG. 10, and causes stage device 30 to be located at (to return to) the loading position described previously shown in FIG. 10, in preparation for the next step, step S3.

Step S3

In step S3 in FIG. 6, controller 120 installs wafer W2 onto second table T2. To be more specific, first of all, controller 120 carries holder H2 onto second table T2 using a carrier member of a carrier system that is not illustrated, and causes second table T2 to hold holder H2 by vacuum suction via a vacuum chuck (not illustrated). Subsequently, controller 120 performs pre-alignment (alignment on the basis of the outer shape (adjustment of the center position and the θz rotation)) of wafer W2 via a pre-alignment device that is not illustrated. Next, controller 120 loads wafer W2 after the pre-alignment onto holder H2 using the carrier member, and causes holder H2 to hold wafer W2 by electrostatic adsorption. On this operation, controller 120 installs wafer W2 on holder H2 after rotating wafer W2 within the XY plane such that the rotational (θz) position of wafer W2 substantially coincides with that of wafer W1 based on rotational amount θz of wafer W1 measured in step S2.

By the processing of step S3, wafer W2 is held by second table T2 with its surface facing above (the +Z direction) and horizontally. After installing wafer W2, controller 20 drives second table T2 in the +Z direction indicated by a black arrow in FIG. 10 via second table driving device 31 (the three Z drive sections 33), as shown in FIG. 10, and positions the surface of wafer W2 on reference plane $S_M$.

Incidentally, in the example described above, in view of the risk that rotational deviation of wafer W1 installed facing downward on first table T1 may occurs when wafer W1 is reversed prior to the installation, wafer W2 is loaded on holder H2 after wafer W2 is rotated by the carrier member based on the result of the search alignment of wafer W1 in step S2. However, this is not intended to be limiting, and holder H2 can be rotated in the θz direction by wafer mounting section 32. Accordingly, by adjusting the rotational angle in the θz direction of holder H2 via wafer mounting section 32 after wafer W2 is held by suction on holder H2, the rotational (θz) position of wafer W2 can be made to coincide with the rotational position of wafer W1. Further, because stage device 30 is also rotatable in the θz direction, the rotational (θz) position of wafer W2 can be made to coincide with the rotational position of wafer W1 by adjusting the rotational angle in the θz direction of stage device 30 as far as any problems do not occur in the measurement of interferometer system 40.

Step S4

In step S4 in FIG. 6, controller 120 performs alignment measurement of wafer W2 using first mark detection system M1. In this case, on the surface of wafer W2, for example, as shown in FIG. 2, a plurality of alignment marks $AM2_j$ (j=1 to N) are formed in the vicinity of shot areas near the circumferential edge.

Figure 11A:
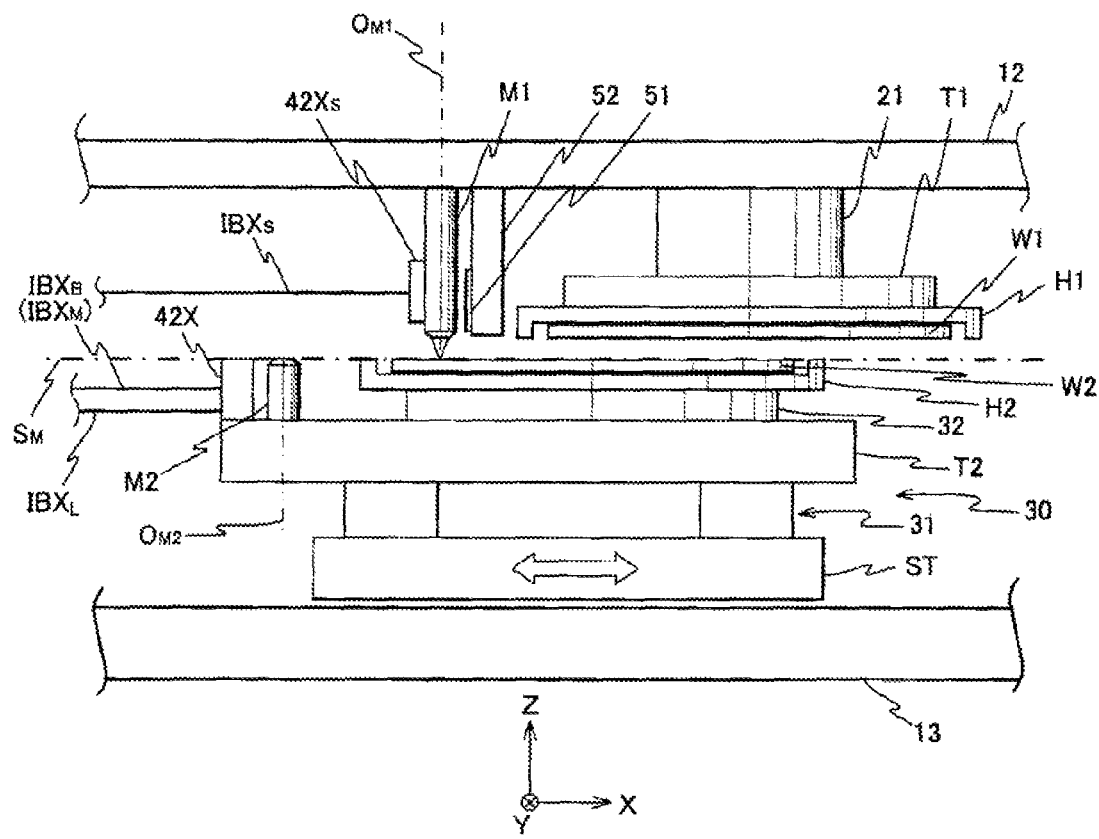
FIG. 11A is a view used to explain step S4 (a step of detecting an alignment mark on the wafer held by the second table using a first detection system) of the substrate bonding method.
Figure 11B:
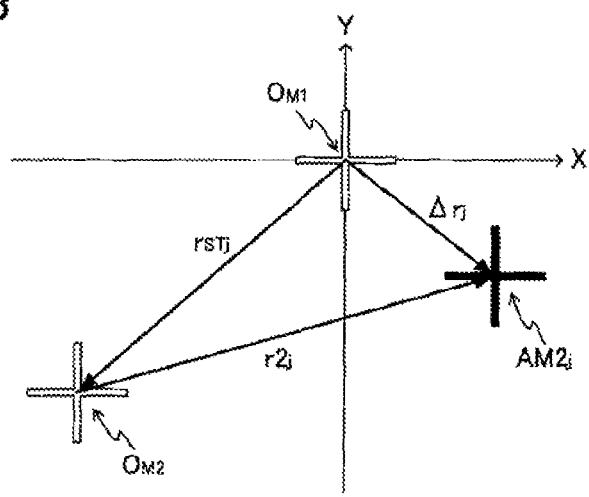
FIG. 11B is a view used to explain a positional relation between the alignment mark measured in step S4 and the index center.

To be more specific, as shown in FIG. 11A, controller 120 drives stage device 30 within the XY plane (see an outlined arrow in FIG. 11A) according to the positional information ($r_{ST}$) of stage device 30, and positions alignment mark $AM2_j$ on the surface of wafer W2 within the detection field of first mark detection system M1. FIG. 11B shows, in a simplified manner, the positional relation between index centers $O_{M1}$ and $O_{M2}$ of mark detection systems M1 and M2 and alignment mark $AM2_j$ at this point in time. Controller 120 measures positioning position $r_{STj}$ of stage device 30 at this point in time. And, controller 120 measures alignment mark $AM2_j$ using first mark detection system M1, or more specifically, a position $\Delta r_j$ of alignment mark $AM2_j$ with index center $O_{M1}$ of first mark detection system M1 serving as a reference. A position $r2_j$ of alignment mark $AM2_j$ with index center $O_{M2}$ of second mark detection system M2 serving as a reference can be obtained from the measurement result of positioning position $r_{STj}$ and the measurement result of position $\Delta r_j$, as $r2_j = r_{STj} + \Delta r_j$. Controller 120 executes the above-described measurement to obtain $r2_j$ to two or more of alignment marks.

Figure 12A:
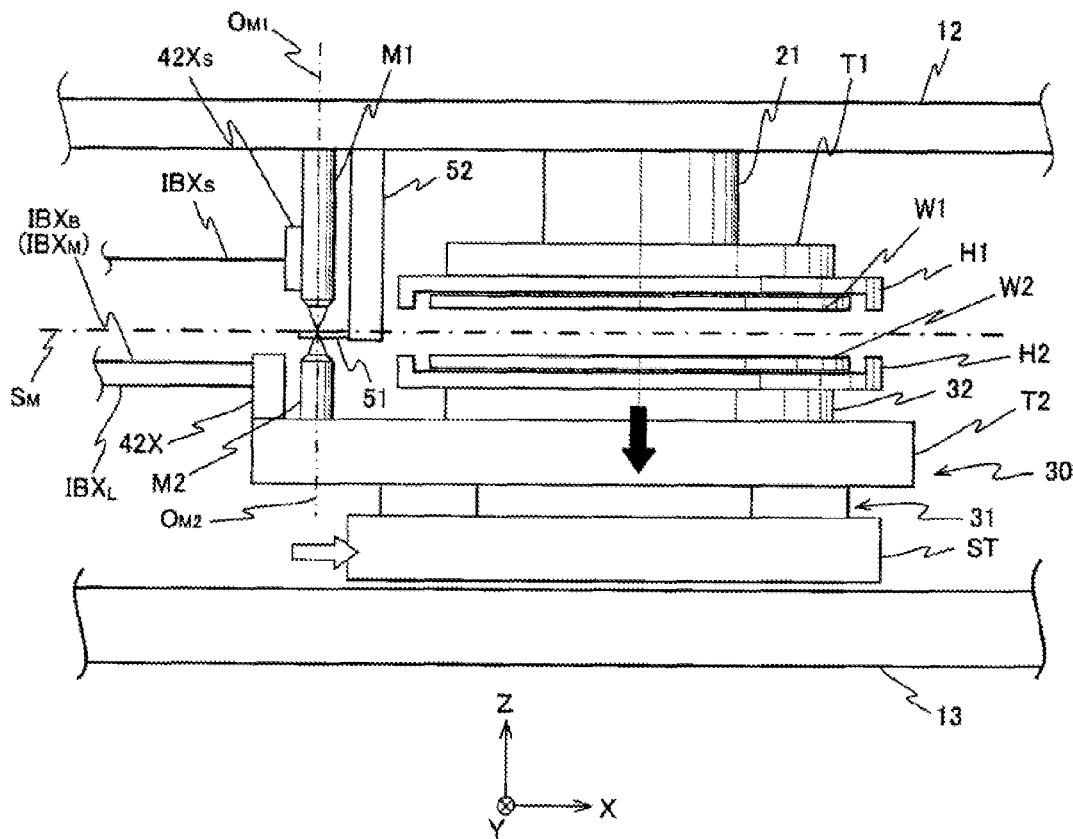
FIG. 12A is a view used to explain step S5 (a baseline measurement process) of the substrate bonding method.

Then, after the measurement has been completed, as shown in FIG. 12A, controller 120 drives stage device 30 in a direction (the +X direction) indicated by an outlined arrow in FIG. 12A, and then causes stage device 30 to be located at a position with which second mark detection system M2 is opposed to first mark detection system M1, in preparation for the next step, step S5. Furthermore, controller 120 drives second table T2 in the −Z direction indicated by a black arrow in FIG. 12A via second table driving device 31, and causes wafer W2 to withdraw from reference plane $S_M$ and causes the detection plane (detection point) of second mark detection system M2 to be located in reference plane $S_M$.

Step S5

In step S5 in FIG. 6, controller 120 performs measurement of baseline of second mark detection system M2 (the position of index center $O_{M2}$ of second mark detection system M2 with index center $O_{M1}$ of first mark detection system M1 serving as a reference). In this case, as shown in FIG. 12A, controller 120 performs detection of fiducial mark FM of mark plate 51 using first and second mark detection systems M1 and M2.

To be more specific, controller 120 drives mark plate 51 via mark plate driving device 52, and positions (the detection surface) of fiducial mark FM of mark plate 51 within the detection field of first mark detection system M1 on reference plane $S_M$. At this point in time, stage device 30 is located at a position with which second mark detection system M2 is opposed to first mark detection system M1. Therefore, controller 120 slightly drives stage device 30, where necessary, so as to position fiducial mark FM within the detection field of second mark detection system M2.

Figure 12B:
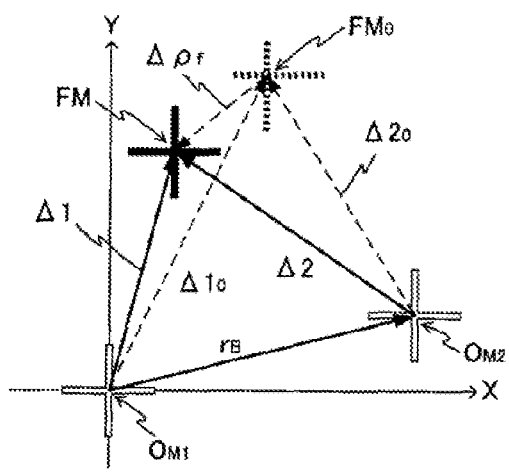
FIGS. 12B and 12C are views used to explain a measurement principle of the baseline.

FIG. 12B shows, in a simplified manner, the positional relation between index centers $O_{M1}$ and $O_{M2}$ of mark detection systems M1 and M2 and fiducial mark FM when fiducial mark FM is detected using mark detection systems M1 and M2. In this case, the extension of the detection fields of mark detection systems M1 and M2 is, for example, 100 to 900 nm, and index centers $O_{M1}$ and $O_{M2}$ of mark detection systems M1 and M2 and fiducial mark FM are located within the range of the extension. However, the index of second mark detection system M2 cannot be detected from first mark detection system M1. Further, the index of first mark detection system M1 cannot be detected from second mark detection system M2.

Next, controller 120 obtains the baseline of second mark detection system M2. By the definition of the reference coordinate system, index center $O_{M1}$ of first mark detection system M1 is located at the origin of the XY coordinate system. Within the detection field of first mark detection system M1, fiducial mark FM is detected at the position indicated by a positional vector $\Delta 1$ from index center $O_{M1}$. Meanwhile, within the detection field of second mark detection system M2, fiducial mark FM is detected at the position indicated by a positional vector $\Delta 2$ from index center $O_{M2}$. From these two detection results, controller 120 obtains the position of index center $O_{M2}$ with index center $O_{M1}$ serving as a reference, that is, a baseline $r_B = \Delta 1 - \Delta 2$. Furthermore, controller 120 measures a positioning position $r_{STB}$ of stage ST at the time of baseline measurement. Then, controller 120 stores the difference between baseline $r_B$ and positioning position $r_{STB}$ of stage device 30 (stage ST), as an offset $\Delta r_{ST} = r_B - r_{STB}$. Incidentally, in the case when a measurement error is not included in position $r_{ST}$ of stage device 30 measured using interferometer system 40, offset $\Delta r_{ST} = 0$ can be obtained.

Figure 13A:
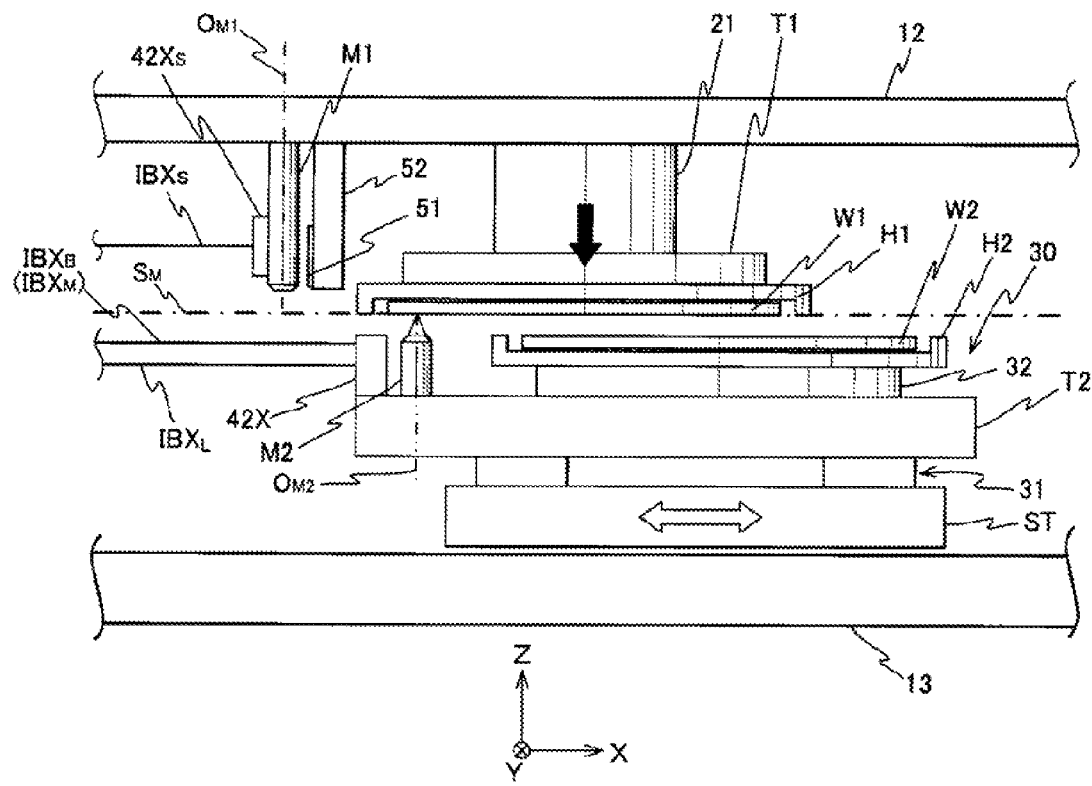
FIG. 13A is a view used to explain step S6 (a step of detecting an alignment mark of the wafer held by the first table using a second detection system) of the substrate bonding method.

After the baseline measurement has been completed, as shown in FIG. 13A, controller 120 causes mark plate 51 (fiducial mark FM) to withdraw via mark plate driving device 52, prior to the next step, step S6. In parallel with this operation, as shown in FIG. 13A, controller 120 drives first table T1 in the –Z direction indicated by a black arrow in FIG. 13A via first table driving device 21, and positions the surface of wafer W1 on reference plane $S_M$, in preparation for the next step, step S6.

Incidentally, in mark plate driving device 52, there is a possibility that the positioning precision of fiducial mark FM degrades owing to the long-time use or the like and the actual positioning position deviates from the design positioning position. Further, fiducial mark FM is positioned within the detection field of first mark detection system M1 and is withdrawn from the detection field by mark plate driving device 52, every time the baseline measurement is performed, and the positioning position of fiducial mark FM could vary every time the baseline measurement is performed.

Here, as shown in FIG. 12B, it is assumed that fiducial mark FM is positioned deviating from the design positioning position (a reference mark that is located at this position is shown as $FM_0$ in FIG. 12B) by $\Delta \tau_f$. Fiducial mark $FM_0$ is located at the position indicated by a positional vector $\Delta 1_0$ from index center $O_{M1}$ and the position indicated by a positional vector $\Delta 2_0$ from index center $O_{M2}$. Here, it is true that $\Delta 1_0 \neq \Delta 1$ and $\Delta 2_0 \neq \Delta 2$. Therefore, in this case, $\Delta 1_0 - \Delta 2_0 = \Delta 1 - \Delta 2 = r_B$ stands. Accordingly, even if the inconvenience occurs that the positioning position of fiducial mark FM deviates from the design position (the position of fiducial mark $FM_0$) or varies at every use, such inconvenience does not affect the measurement precision of the baseline measurement. However, this can be said on the condition that fiducial mark FM is not moved while the baseline measurement is being performed.

Figure 12C:
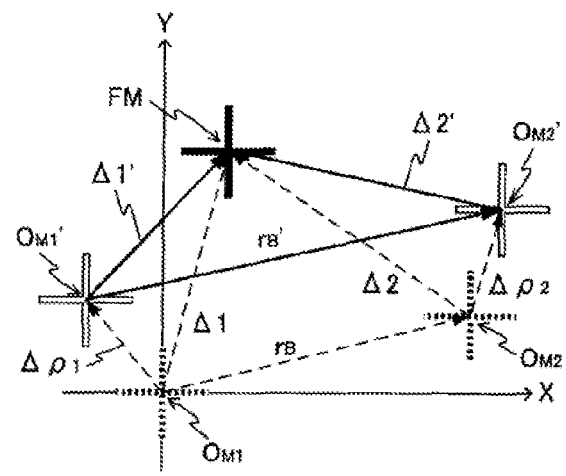

Further, because of the long-time use of substrate bonding apparatus 100 or the like, as shown in FIG. 12C, there is a possibility that index center $O_{M1}$ of first mark detection system M1, and further, index center $O_{M2}$ of second mark detection system M2 deviate from the respective design positions. Now, the case is considered where the index centers of mark detection systems M1 and M2 are located at points $O_{M1}'$ and $O_{M2}'$ that deviate from design positions $O_{M1}$ and $O_{M2}$.

The position of fiducial mark FM from index center $O_{M1}'$ is measured as $\Delta 1'$ and the position of fiducial mark FM from index center $O_{M2}'$ is measured as $\Delta 2'$. Accordingly, the position of index center $O_{M2}'$ from index center $O_{M1}'$ (the baseline in actual measurement) $r_B'$ is obtained as $r_B' = \Delta 1' - \Delta 2'$. The difference between this baseline $r_B'$ in actual measurement and (the measurement result of) positioning position $r_{STB}$ of stage device 30 is stored as an offset $r_{ST}' = r_B' - r_{STB}$. Because $\Delta 1 = \Delta 1' + \Delta \rho_1$ and $\Delta 2 = \Delta 2' + \Delta \rho_2$ stand, however, position $r_B$ of design index center $O_{M2}$ from design index center $O_{M1}$ (the design baseline) is expressed as $r_B = r_B' + (\Delta \rho_1 - \Delta \rho_2)$, which is different from baseline $r_B'$ in actual measurement.

Now, a correction amount $\Delta r_B = \Delta \rho_1 - \Delta \rho_2$ is determined. When offset $r_{ST}'$ in actual measurement is corrected using correction amount $\Delta r_B$, $\Delta r_{ST}' + \Delta r_B = \Delta r_{ST}$ stands, and design offset $r_{ST}$ can be obtained. Therefore, controller 120 should store offset $\Delta r_{ST} = \Delta r_{ST}' + \Delta r_B$, which is obtained by correcting offset $\Delta r_{ST}'$ in actual measurement using correction amount $\Delta r_B$, in the case when deviations $\Delta \rho_1$ and $\Delta \rho_2$ from the design positions of index centers $O_{M1}$ and $O_{M2}$ of mark detection systems M1 and M2 are known.

Step S6

In step S6 in FIG. 6, controller 120 performs alignment measurement of wafer W1 using second mark detection system M2. Incidentally, the alignment measurement in step S6 is substantially the same process of the search alignment measurement in step S2 described previously.

Figure 13B:
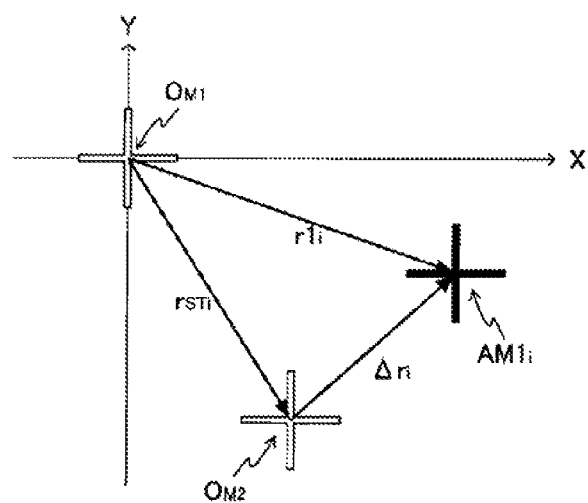
FIG. 13B is a view used to explain a positional relation between the alignment mark measured in step S6 and the index center.

To be more specific, as shown in FIG. 13A, controller 120 drives stage device 30 within the XY plane (see an outlined arrow in FIG. 13A) according to the positional information ($r_{ST}$) of stage device 30 and positions alignment mark $AM1_i$ of wafer W1 within the detection field of second mark detection system M2 fixed to second table T2. FIG. 13B shows, in a simplified manner, the positional relation between index centers $O_{M1}$ and $O_{M2}$ of mark detection systems M1 and M2 and alignment mark $AM1_i$ at this point in time. Controller 120 measures positioning position $r_{STi}$ of stage device 30 at this point in time. Further, controller 120 detects alignment mark $AM1_i$ using second mark detection systems M2. More specifically, controller 120 measures position $\Delta r_i$ of alignment mark $AM1_i$ with index center $O_{M2}$ of second mark detection system M2 serving as a reference. The position of detected alignment mark $AM1_i$ with index center $O_{M1}$ of first mark detection system M1 serving as a reference can be obtained as $r1_i = r_{STi} + \Delta r_i$, from the measurement result of positioning position $r_{STi}$ and the measurement result of position $\Delta r_i$. Controller 120 executes the above-described measurement to obtain $r1_i$ to two or more of alignment marks.

Step S7

In step S7 in FIG. 6, controller 120 performs the processing of a process of bonding wafers W1 and W2. In general, the surfaces of wafers are deformed because of the heating in the processing process of circuit devices or the like.

Therefore, in order to precisely bond two wafers W1 and W2 whose surfaces are deformed, controller 120, first of all, obtains a target position $(X_0, Y_0, \theta z_0)$ of stage device 30 that corresponds to a desired bonding position of wafers W1 and W2.

When computation of this target position is performed, position $r2_j$ of alignment mark $AM2_j$ on wafer W2 obtained in step S4 and position $r1_i$ of alignment mark $AM1_i$ on wafer W1 obtained in step S6 are used. In some cases, however, the measurement error of interferometer system 40 is included in the detection results of these positions $r1_i$ and $r2_j$ of the alignment marks. Therefore, controller 120 uses offset $\Delta r_{ST}$ obtained in the baseline measurement in step S5 to correct positions $r1_i$ and $r2_j$ of the alignment marks obtained in steps S4 and S6 ($r2_j \leftarrow r2_j - \Delta r_{ST}$, $r1_i \leftarrow r1_i + \Delta r_{ST}$).

Now, as the desired bonding position of the wafers, two positions between alignment marks $AM1_i$ and $AM2_j$ of the two wafers W1 and W2 are considered: i.e. (a) a position (a first bonding position) in which the square sum $S = \Sigma_k |r1_k - r2_k|^2$ of the relative distance within reference plane $S_M$ between alignment marks $AM1_i$ and $AM2_j$ being paired is the minimum; and (b) a position (a second bonding position) in which the absolute value $|r1_k - r2_k|$ of the relative distance within reference plane $S_M$ between alignment marks $AM1_i$ and $AM2_j$ being paired is substantially equal for all the pairs. Incidentally, it is assumed that the number (greater than or equal to two) of pairs of the alignment marks to be used is set according to the required alignment precision.

The target position $(X_0, Y_0, \theta z_0)$ of stage device 30 that satisfies the condition of the first bonding position in (a) is obtained as below. As stage device 30 moves to the position $(X, Y, \theta z)$, alignment mark $AM2_j$ of wafer W2 moves from position $r2_j = (x2_j, y2_j)$ to a position $r2'_j = (x2'_j, y2'_j)$. In this case, $(x2'_j, y2'_j)$ is expressed in the following formula (1).

$$\begin{pmatrix} x2'_j \\ y2'_j \end{pmatrix} = \begin{pmatrix} \cos\theta_z & \sin\theta_z \\ -\sin\theta_z & \cos\theta_z \end{pmatrix} \begin{pmatrix} x2_j \\ y2_j \end{pmatrix} + \begin{pmatrix} X \\ Y \end{pmatrix} \quad (1)$$

Accordingly, by the $(X, Y, \theta z)$ that satisfies $\partial S/\partial X = 0$, $\partial X/\partial Y = 0$, $\partial S/\partial \theta Z = 0$, the target position $(X_0, Y_0, \theta z_0)$ of stage device 30 at which the square sum $S = \Sigma_k |r1_k - r2_k'|^2$ is the minimum is given.

On the other hand, the target position $(X_0, Y_0, \theta z_0)$ of stage device 30 that satisfies the condition of the second bonding position in (b) is not necessarily determined uniquely. Therefore, as an example, controller 120, first of all, obtains the position $(X, Y, \theta z)$ of stage device 30 that satisfies the condition of the first bonding position. The position of alignment mark $AM2_j$ of wafer W2 obtained when stage device 30 is located at this position is assumed to be $r2j$. An average $R = \Sigma_k |r1_k - r2_k|/M$ of the relative distances between alignment marks $AM1_k$ of wafer W1 and alignment marks $AM2_k$ of wafer W2 being paired is obtained. Here, the number of the pairs of the alignment marks to be used is assumed to be M. Controller 120 obtains the position of stage device 30, with which the relative distance is substantially equal to R or less than R, for all the pairs of the alignment marks, using the Monte Carlo method or the like, and determines the obtained position as the target position $(X_0, Y_0, \theta z_0)$.

Figure 14:
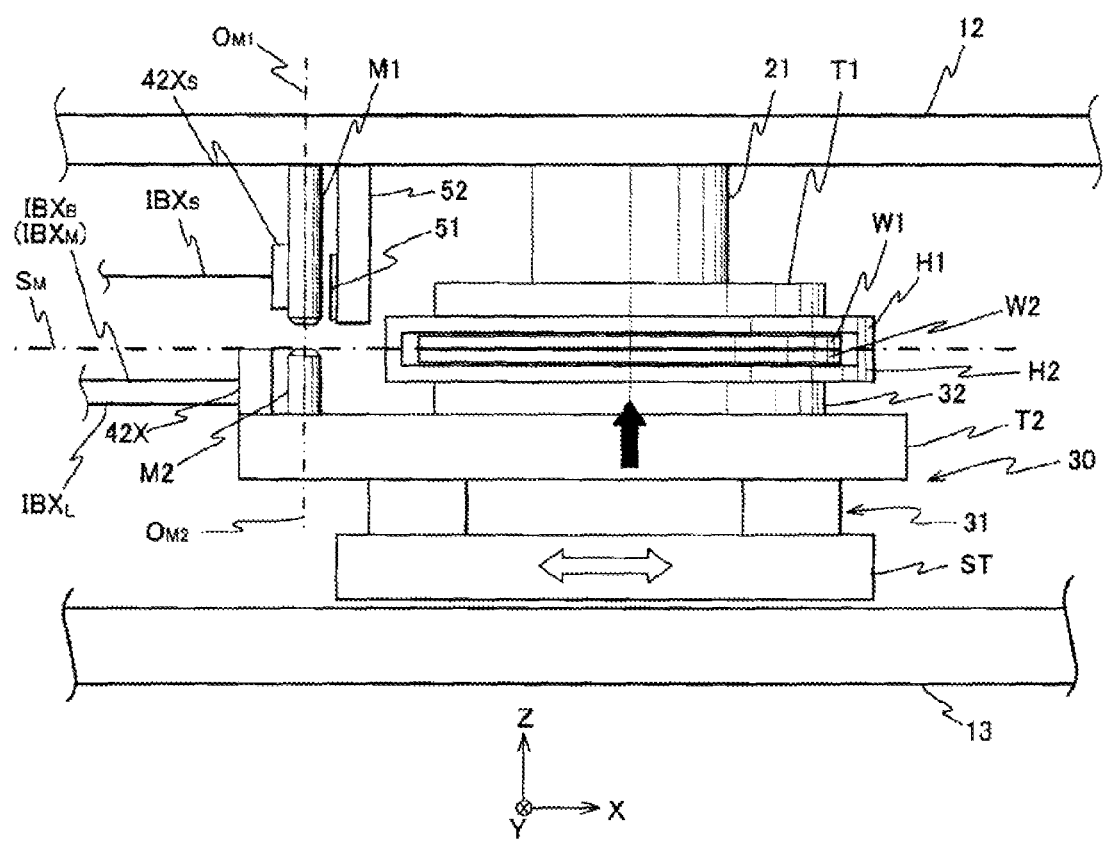
FIG. 14 is a view used to explain step S7 (a step of overlaying two wafers) of the substrate bonding method.

Finally, as shown in FIG. 14, controller 120 drives stage device 30 within the XY plane (see an outlined arrow in FIG. 14) according to the positional information $(r_{ST})$ of stage device 30, and positions stage device 30 at the target position $(X_0, Y_0, \theta z_0)$. Then, wile confirming that the tilts $\theta x$ and $\theta y$ of second table T2 do not vary using interferometers 40Y1 and 40Y2 and/or Z-tilt measuring system 60, and confirming the separation distance between the two wafers W1 and W2 using Z-tilt measuring system 60 or separation distance measuring system 61, controller 120 drives second table T2 in the +Z direction indicated by a black arrow in FIG. 14 via second table driving device 31, and causes second table T2 and first table T1 to approach in the Z-axis direction, and overlays wafers W1 and W2 installed on first and second tables T1 and T2, with reference plane $S_M$ serving as the overlaying plane. Then, controller 120 fixes holders H1 and H2 in an overlaid state that respectively hold wafers W1 and W2 that have been overlaid, using an attachment, and then detaches them from first and second tables T1 and T2. Then, the overlaid wafers W1 and W2 and holders H1 and H2 that have been integrated in the manner described above are carried using a carrier member to a preliminary heating chamber that is not illustrated. After that, the processing of a heating process and subsequent processes is performed, and the bonded wafers are manufactured, and further, a three-dimensional layered type semiconductor device using the bonded wafers is manufactured.

In substrate bonding apparatus 100 related to this embodiment, as second table T2 (stage ST) moves, its gravity center also moves. When second table T2 (stage ST) tilts because of the movement of the gravity center, center axis $O_{M2}$ of second mark detection system M2 also tilts. Consequently, for example, as shown in FIG. 12C, there is a possibility that center axis $O_{M2}$ of second mark detection system M2 deviates from the design position. If this deviation does not depend on the position of second table T2 (stage ST), then the uniform detection error occurs in detections of all the alignment marks, and therefore, the deviation does not affect the alignment precision of the two wafers W1 and W2 at all. However, if this deviation depends on the position of second table T2 (stage ST), then different detection errors occur in detections of all the alignment marks, which degrades the alignment precision. Therefore, in the description below, the existence the detection error of second mark detection system M2 that occurs depending on the position of second table T2 (stage ST) is examined and also a correction method of the detection error is considered. Incidentally, the error correction of second mark detection system M2 is the processing to be performed as needed, but in the case of performing the error correction of second mark detection system M2, controller 120 performs the error correction of second mark detection system M2 as step S0, prior to step S1 in FIG. 6.

Step S0

In the case of performing the error correction of second mark detection system M2 in this step S0, a reference wafer (assumed to be W0) is prepared on which alignment marks (assumed to be $AM0_i$) whose positional relation is known are provided. It is assumed that alignment marks $AM0_i$ of reference wafer W0 are provided at substantially the same positions as with alignment marks on wafer W1 that is actually bonded. This reference wafer W0 is installed on first table T1 via holder H1 by controller 120.

Then, while measuring the position of second table T2 (stage ST) within the movement plane (XY plane) using interferometer system 40, controller 120 moves second table T2 (stage ST) via stage driving device 15 (see FIG. 5), and positions one alignment mark $AM0_i$ of reference wafer W0 within the detection field of second mark detection system M2. On this operation, controller 120 measures position $r_{STi} = (x_{STi}, Y_{STi})$ of second table T2 (stage ST) within the movement plane (XY plane) and position $\Delta r_i = (\Delta x_i, \Delta y_i)$ of alignment mark $AM0_i$ with index center $O_{M2}$ of second mark detection system M2 serving as a reference. Controller 120 obtains position $r_i = (x_i, Y_i) = r_{STi} + \Delta r_i$ of detected alignment mark $AM0_i$, from these measurement results.

Controller 120 executes the processing as above to all alignment marks $AM0_i$, and obtains positions $r_i$ within the XY plane and relative positional relations $r_{ik}=r_i-r_k$ of all alignment marks $AM0_i$. In this case, the relative positional relations $r_{ik}$ are relative positional relations obtained with the $k^{th}$ alignment mark $AM0_k$ serving as a reference. Controller 120 compares relative positional relations $r_{ik}$ that have been obtained with a known relative positional relation $r0_{ik}$ ($=r0_i-r0_k$). In this case, $r0_i$ is the design position of alignment mark $AM0_i$. In the case when a difference $\delta_{ik}=r_{ik}-r0_{ik}$ between the relative positional relations is not small enough to be ignored, it shows that a detection error of second mark detection system M2 depending on position $r_{STi}$ of second table T2 (stage ST) occurs. In such a case, controller 120 links difference $\delta_{ik}$ as an offset with position $r_{STi}$ of second table T2 (stage ST) within the movement plane (XY plane) and stores them.

When detecting alignment mark $AM1_i$ of wafer W1 installed on first table T1, controller 120 performs offset correction ($r1_i+\delta_{ik}$) by adding offset $\delta_{ik}$ corresponding to position $r_{STi}$ of second table T2 (stage ST) within the movement plane at the time of the detection, to position $r1_i$ of alignment mark $AM1_i$ that has been measured. Incidentally, the correction result is given as $r1_i+\delta_{ik}=(r1_i+r_i-r0_i)-(r_k-r0_k)$. In this case, since the expression in the second parentheses on the right-hand side is commonly corrected in detection result $r1_i$ of every alignment mark $AM1_i$, the expression is cancelled out in relative positional relation $r1_{ij}=r1_i-r1_j$.

Incidentally, in substrate bonding apparatus 100 of the present embodiment, there is a possibility that reference wafer W0 is installed on first table W1 deviating from the design position. In such a case, the offset correction method described above can be applied, by only shifting reference wafer W0 in the XY directions if there is no rotational deviation. However, in the case when the rotational deviation is generated in the installation of reference wafer W0, offset $\delta_{ij}=(\delta x_{ij}, \delta y_{ij})$ for correction is modified to an offset $\delta'_{ij}=(\delta x'_{ij}, \delta y'_{ij})$ using a rotational deviation angle $\theta z$. In this case, $(\delta x'_{ij}, \delta y'_{ij})$ is expressed in the following formula (2).

$$\begin{pmatrix} \delta x'_{ij} \\ \delta y'_{ij} \end{pmatrix} = \begin{pmatrix} \cos\theta_z & \sin\theta_z \\ -\sin\theta_z & \cos\theta_z \end{pmatrix} \begin{pmatrix} \delta x_{ij} \\ \delta y_{ij} \end{pmatrix} + \begin{pmatrix} T_X \\ T_Y \end{pmatrix} \quad (2)$$

In offset $\delta'_{ij}$ for correction shown in the formula (2), a shift $(T_X, T_Y)$ in the X-axis and Y-axis directions is also taken into consideration. Incidentally, the rotational deviation angle $\theta z$ can be obtained from, for example, an angle made by a straight line that connects two of the alignment marks that are selected to serve as references, and the X-axis or the Y-axis.

Incidentally, in the offset correction executed in this step, step S0, if the relative positional relation between the alignment marks provided on a wafer is known, then such a wafer can be used as the reference wafer described above. In the case of using a wafer on which alignment marks whose positional relation is unknown are provided, controller 120 should detect the relative positional relation using first mark detection system M1.

To be more specific, first of all, controller 120 installs a wafer W on which alignment marks $AM_j$ whose relative positional relation is unknown are provided onto second table T2 via holder H2. Then, while measuring the position of second table T2 (stage ST) within the movement plane using interferometer system 40, controller 120 moves second table T2 (stage ST) using stage driving device 15 (see FIG. 5), and positions one alignment mark $AM_j$ of wafer W within the detection field of first mark detection system M1. On this operation, controller 120 measures position $r_{STj}$ of second table T2 within the movement plane (XY plane) and position $\Delta r_j$ of alignment mark $AM_j$ with index center $O_{M1}$ of first mark detection system M1 serving as a reference. Controller 120 obtains the position of detected alignment mark $AM_j$ as $r0_j=-r_{STj}+\Delta r_j$, from these measurement results. From the obtained result, controller 120 can compute a relative positional relation $r0_{jk}$ of the alignment marks provided on the surface of the wafer. However, in the case when this wafer W is installed on first table T1 so as to be used as reference wafer W0, the positional relation between the alignment marks is inverted because second table T2 and first table T1 are opposed. Controller 120 modifies relative positional relation $r0_{jk}$ taking this inversion into consideration. If the positional relation of the alignment marks is inverted, for example, with respect to an axis parallel to the Y-axis, then positional relation $r0_{jk}=(x0_{jk}, y0_{jk})$ is modified to $r0_{jk}=(-x0_{jk}, y0_{jk})$.

In the correction method described above, the detection error depending on position $r_{STi}$ of second table T2 (stage ST) of second mark detection system M2 is corrected by correcting the detection result of alignment mark $AM1_i$ using offset $\delta_{ik}$ stored being linked with position $r_{STi}$ of second table T2 (stage ST). However, the cause is not limited to position $r_{STi}$ of second table T2 (stage ST), but for example, the situation can be considered where center axis $O_{M2}$ of second mark detection system M2 tilts owing to the reaction force accompanying the movement, which generates a detection error.

In this case, offset $\delta_{ik}$ described above should be stored being linked with not only position $r_{STi}$ of second table T2 (stage ST) but also a movement distance, a movement direction, a movement time, a movement speed, an acceleration and the like from a stop position $r_{STm}$ of second table T2 (stage ST) just before second table T2 (stage ST) reaches position $r_{STi}$. In the case of correcting the detection result of second mark detection system M2 using the offset linked with these parameters, it becomes possible to also correct the error components that depend on the movement distance, the movement direction, the movement time, the movement speed and the acceleration from stop position $r_{STm}$ described above, in addition to the error component that depends on position $r_{STi}$ of second table T2 (stage ST).

As is described in detail above, substrate bonding apparatus 100 related to the present embodiment is equipped with: first table T1 that holds one of the two wafers W1 and W2 that are subject to bonding, i.e. wafer W1; stage device 30 that holds the other wafer, wafer W2 in an orientation capable of opposing to the one wafer, wafer W1, via second table T2 and also is movable at least within the XY plane; interferometer system 40 that measures positional information of stage device 30 within the XY plane; first mark detection system M1 that can detect subject marks including the alignment marks of wafer W2 held by stage device 30 (to be more precise, second table T2); and second mark detection system M2 that is fixed to a part (second table T2) of stage device 30 and can detect subject marks including the alignment marks of wafer W1 held by first table T1. Therefore, according to substrate bonding apparatus 100 in the present embodiment, the two wafers W1 and W2 are held by first table T1 and stage device 30 (to be more precise, second table T2) respectively. Further, the alignment marks of wafer W1 held by first table T1 can be detected by second mark detection system M2 mounted on second table T2 on stage ST that is movable within the XY plane, and also, the marks of wafer W2 held by stage device 30 (second table T2) can be detected by first mark detection system M1. Further, interferometer system 40 measures positional information (X, Y, $\theta z$) of stage device 30 at least within the XY plane. Accordingly, by using the detection results of the alignment marks of wafer W1 held by first table T1 that are obtained by second mark detection system M2, the detection results of the alignment marks of wafer W2 held by stage device 30 (to be more precise, second table T2) that are obtained by first mark detection system M1, and the measurement results (positional information (X, Y, θz) of stage ST within the XY plane) of interferometer system 40 at the time of detecting the respective alignment marks, it becomes possible to align and bond the two wafers W1 and W2 with high precision.

Further, according to the substrate bonding method that is performed in substrate bonding apparatus 100 related to the present embodiment, the two wafers N1 and W2 are made to be held, respectively, by first table T1 and second table T2 (stage device 30) to which first table T1 is opposed and which is movable within the XY plane (steps S1 and S3). Further, stage device 30 is moved within the XY plane, and a plurality of alignment marks on wafer W2 held by stage device 30 are detected using first mark detection system M1, and also positional information of stage device 30 at the time of detecting the respective alignment marks is measured (step S4). Further, stage device 30 is moved within the XY plane and a plurality of alignment marks on wafer W1 held by first table T1 are detected using second mark detection system M2, and also positional information of stage device 30 at the time of detecting the respective alignment marks is measured (step S6). Then, by detecting fiducial mark FM that is common, using first and second mark detection systems M1 and M2, the baseline of second mark detection system M2 is measured (step S5). Then, based on the detection results of fiducial mark FM (measurement results of the baseline) obtained by first and second marks detection systems M1 and M2, the detection results of a plurality of alignment marks obtained by first mark detection system M1 and the positional information of stage device 30 at the time of the detection, and the detection results of a plurality of alignment marks obtained by second mark detection system M2 and the positional information of stage device 30 at the time of the detection, the two wafers W1 and W2 are overlaid with high precision.

Further, first mark detection system M1 is fixed to frame 10 (top board section 12), and second mark detection system M2 is mounted on stage device 30 (stage ST) that is movable within the XY plane, and is fixed to second table T2 that is movable in the Z-axis direction. Therefore, the detection point of first mark detection system M1 can be set on reference plane $S_M$ where the bonding of wafers W1 and W2 is performed, and the detection point of second mark detection system M2 can be set on reference plane $S_M$. With this operation, the surface position of wafer W2 used when detecting the alignment marks on wafer W2 using first mark detection system M1 and the surface position of wafer W1 used when detecting the alignment marks provided on wafer W1 using second mark detection system M2 can be unified with the plane position used when bonding both wafers W1 and W2. Accordingly, even if the wafers each have a large diameter, the wafers can be overlaid with high precision.

Thus, according to substrate bonding apparatus 100 related to the present embodiment, it becomes possible to bond the wafers with a large diameter in a state where the wafers are accurately aligned with high precision, for example, the precision of 100 nm order, which consequently makes it possible to efficiently manufacture the three-dimensional layered type semiconductor devices having high mounting area efficiency.

Further, in the present embodiment, after positional information of wafer W1 held by first table T1 within the XY plane that includes the rotational direction (θz direction) is measured (step S2), wafer W is made to be held by stage device 30 that is movable within the XY plane (step S3), and after that, the relative position of wafer W2 held by stage device 30 with respect to wafer W1 held by first table T1 is adjusted and both wafers W1 and W2 are bonded (steps S4 to S7). Therefore, it is possible to cause stage device 30 to hold wafer W2 in a state where the position of wafer W2 is adjusted taking into consideration the measurement result of the positional information of wafer W1 held by first table T1 within the XY plane that includes the rotational direction (θz direction), or it is also possible to adjust the position of wafer W2 after wafer W is mounted on stage device 30. In either case, it becomes possible to align and bond the two wafers W1 and W2 with high precision.

Further, in the present embodiment, prior to step S1, the pre-alignment of wafer W1 by the pre-alignment device and the reversal of wafer W1 after the pre-alignment are performed. Therefore, on the reversal, there is a high probability that wafer W1 is not just reversed (rotated by 180 degrees) but the rotational deviation of wafer W1 in the θz direction occurs, with the state after the pre-alignment serving as a reference. More specifically, there is a risk that the rotational deviation (and the center position deviation) in the θz direction occur(s), although the pre-alignment has been performed once. Therefore, taking this point into consideration, the search alignment process of wafer W1 in step S2 is provided and the positional deviation of wafers W1 and W2 in the θz direction is adjusted using the result of the search alignment process. Accordingly, if the rotational deviation of wafer W hardly occurs after the pre-alignment, step S2 does not necessarily have to be provided.

Further, in this embodiment, since mark plate 51 is equipped with fiducial mark FM that is movable by mark plate driving device 52, the fiducial mark does not have to be arranged on holders H1 and H2 that hold wafers W1 and W2 respectively. Accordingly, in substrate bonding apparatus 100 of this embodiment, the inconvenience is unlikely to occur such as the inconvenience that the fiducial mark deteriorates owing to, for example, heating by the heating device or the like, and as a consequence, the measurement precision of the baseline measurement described previously degrades, which is different from the case of using the fiducial mark arranged on holders H1 and H2.

Further, substrate bonding apparatus 100 of the present embodiment is equipped with second mark detection system M2 mounted on stage device 30, separately from first mark detection system M1 fixed to frame 10. Therefore, by using first and second mark detection systems M1 and M2, the alignment marks on each of the two wafers W1 and W2 can be detected in a state where the two wafers W1 and W2 are opposed to each other. Accordingly, since it is not necessary to measure the positional relation of the alignment marks before installing wafers W1 and W2 in substrate bonding apparatus 100, the number of measurements can be restricted and also the accumulation of detection errors can be suppressed.

Incidentally, the error correction process of second mark detection system M2 in step S0 described earlier can be executed only when necessary, such as only when substrate bonding apparatus 100 is started up. Further, it is also possible that the baseline measurement process in step S5 and the alignment mark detection process in steps S4 and S6 are executed in any order. In such a case, after the baseline measurement process in step S5 has been completed, the measurement result of the baseline is to be reflected in the detection result of the alignment marks.

Second Embodiment

Next, a second embodiment of the present invention is described with reference to FIGS. 15 to 25. From the viewpoint of preventing the redundant explanation, regarding the constituents that are the same as or equivalent to those of substrate bonding apparatus 100 related to the first embodiment described above, the same reference sings are used and the explanation thereabout is omitted or simplified in the following description.

Figure 15:
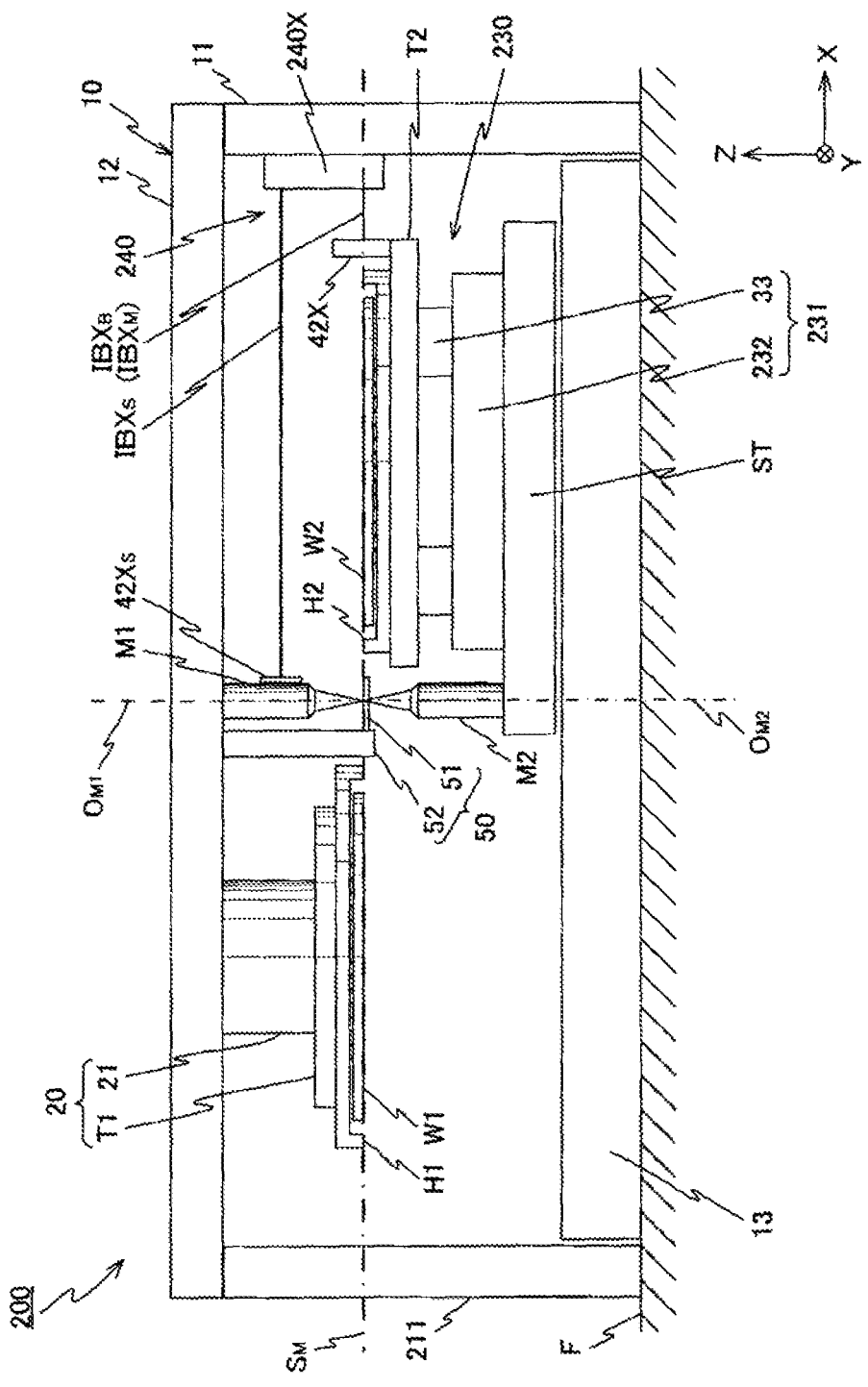
FIG. 15 is a view schematically showing a configuration of a substrate bonding apparatus related to a second embodiment.

FIG. 15 schematically shows a configuration of a substrate bonding apparatus 200 related to the second embodiment. Substrate bonding apparatus 200 is configured similar to substrate bonding apparatus 100 related to the first embodiment described earlier, except for the placement of a first table device 20 and first mark detection system M1 and configurations of a stage device 230 and an interferometer system 240. Accordingly, in the description below, substrate bonding apparatus 200 is explained, focusing on the differences from substrate bonding apparatus 100. Incidentally, in substrate bonding apparatus 200 as well, wafers W1 and W2 are overlaid such that their surfaces coincide with reference plane $S_M$.

In substrate bonding apparatus 200 of the present second embodiment, first mark detection system M1 is fixed to substantially the center of the lower surface of top board section 12. First table device 20 is arranged at a position a predetermined distance away on the –X side from first mark detection system M1, in a suspended state from top board section 12. And, between first table device 20 and first mark detection system M1 of top board section 12, mark plate driving device 50 is arranged in a suspended state.

Stage device 230 is equipped with stage ST that is supported by levitation above stage surface plate 13, a second table driving device 231 that is mounted on stage ST, and second table T2 that is almost horizontally supported by second table driving device 231. Second table driving device 231 is configured of a Z stage 232 that is mounted on stage ST and is movable back and force with a predetermined stroke in the Z-axis direction, and the three Z drive sections 33 that are respectively installed at non-collinear three points on Z stage 232. The three Z drive sections 33 configure a Z-tilt drive mechanism that finely drives second table T2 in the Z-axis direction, the θx direction and the θy direction.

Further, on second table T2, holder H2 that holds wafer W by, for example, electrostatic adsorption is held facing upward by, for example, vacuum suction. That is, on the upper surface of second table T2, wafer W2 is held via holder H2.

With the above-described configuration of stage device 230, second table T2 is drivable in all the directions of six degrees of freedom (X, Y, Z, θx, θy, θz). More specifically, wafer W2 held by second table T2 is movable in all the directions of six degrees of freedom. Incidentally, second table T2 can be driven by second table driving device 231 within a predetermined range in the Z-axis direction that includes the position of second table T2 with which the surface of wafer W2 held by second table T2 coincides with reference plane $S_M$.

As shown in FIG. 15, second mark detection system M2 is mounted facing upward (toward the +Z direction) in the vicinity of the end on the –X side of the upper surface of stage ST. In this case, second mark detection system M2 is fixed to the upper surface of stage ST.

Figure 16:
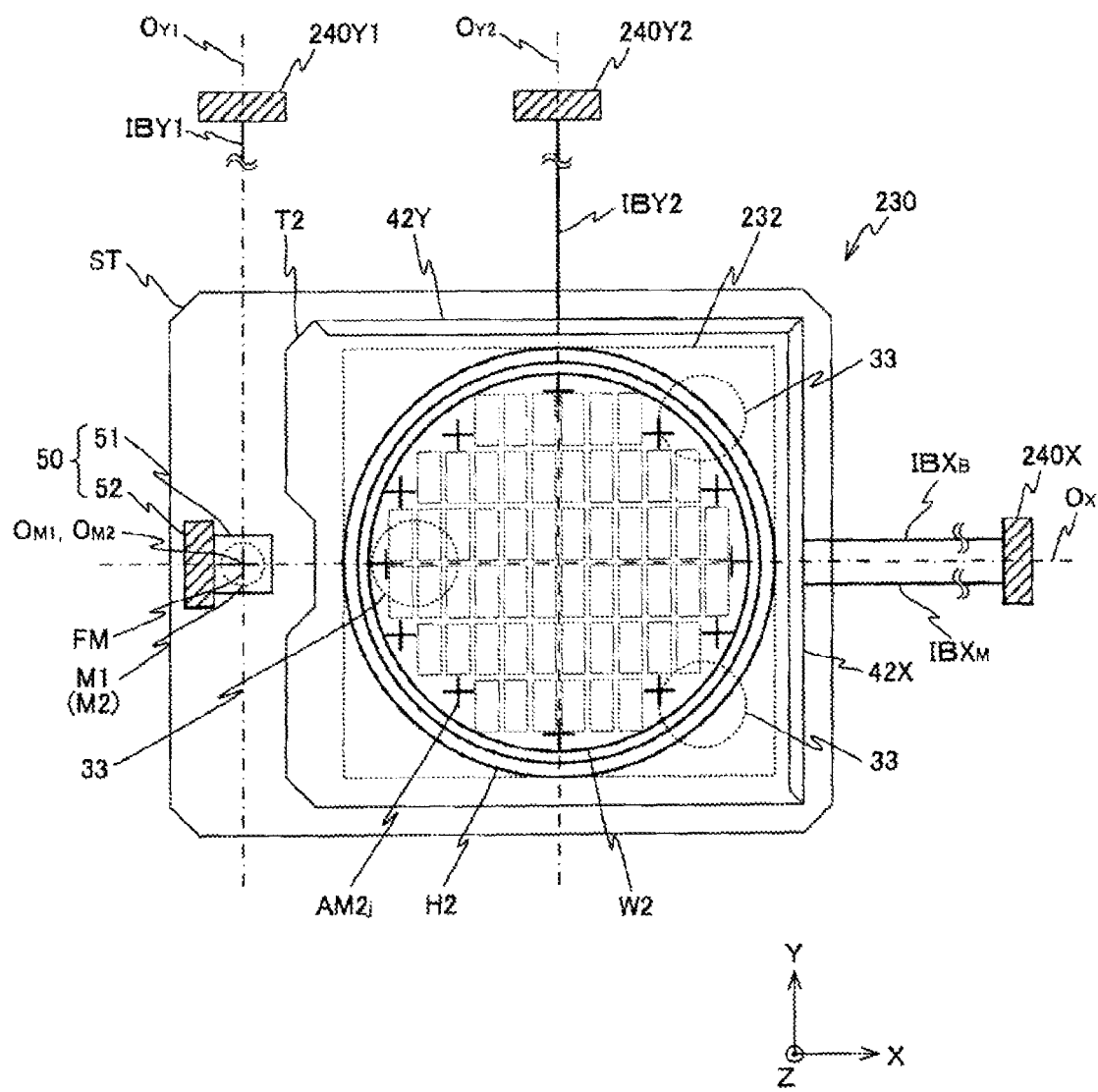
FIG. 16 is a plan view of a stage device, used to explain a placement of a stage and interferometers, and a reference coordinate system, in the substrate bonding apparatus in FIG. 15.

As shown in FIG. 16, interferometer system 240 includes an X interferometer 240X and first to third Y interferometers 240Y1 to 240Y3 (Y interferometer 240Y3 is not illustrated in FIG. 16, see FIG. 17), and measures the position (X, Y, θz) of second table T2 (stage device 230) within the XY plane.

As shown in FIGS. 15 and 16, X interferometer 240X irradiates X movable mirror 42X with two measurement beams $IBX_B$ and $IBX_M$ parallel to the X-axis that are the same distance apart in the ±Y direction from reference axis $O_X$ parallel to the X-axis within reference plane $S_M$. In FIG. 15, measurement beams $IBX_B$ and $IBX_M$ overlap in a direction perpendicular to the page surface. Furthermore, as shown in FIG. 15, X interferometer 240X irradiates X reference mirror $42X_S$ arranged on the side surface of first mark detection system M1 with reference beam $IBX_S$ parallel to the X-axis. Then, X interferometer 240X receives the reflected beams of measurement beams $IBX_B$ and $IBX_M$ and reference beam $IBX_B$ respectively, and obtains the X-position of the irradiation points of measurement beams $IBX_B$ and $IBX_M$ on the reflection surface of X movable mirror 42X with the X-position of X reference mirror $42X_S$ serving as a reference. Incidentally, reference axis $O_X$ is orthogonal to center axis (optical axis) $O_{M1}$.

As shown in FIG. 16, first Y interferometer 240Y1 irradiates Y movable mirror 42Y with a measurement beam IBY1 along reference axis $O_{Y1}$ parallel to the Y-axis. In this case, when stage device 230 (second table T2) is located in the position shown in FIG. 16, the irradiation point of measurement beam IBY1 is outside of the reflection surface of Y movable mirror 42Y. In the state in FIG. 16, a second Y interferometer 240Y2 is used, as is described later on. First Y interferometer 240Y1 further irradiates a reference mirror (not illustrated) arranged on the side surface of first mark detection system M1 with a reference beam (not illustrated) parallel to the Y-axis. Then, first Y interferometer 240Y1 receives the reflected beams of measurement beam IBY1 and the reference beam and obtains the Y-position of the irradiation point of measurement beam IBY1 on the reflection surface of Y movable mirror 42Y with the Y-position of the reference mirror serving as a reference. Incidentally, reference axis $O_{Y1}$ is orthogonal to reference axis $O_X$ and center axis (optical axis) $O_{M1}$ at the intersection point of reference axis $O_X$ and center axis $O_{M1}$.

Similarly, second Y interferometer 240Y2 irradiates Y movable mirror 42Y with a measurement beam IBY2 along reference axis $O_{Y2}$ parallel to the Y-axis. Second Y interferometer 240Y2 incorporates a reference mirror, and irradiates the reference mirror with a reference beam. Then, by receiving the reflected beams of measurement beam IBY2 and the reference beam, second Y interferometer 240Y2 obtains the Y-position of the irradiation point of Y measurement beam IBY2 on the reflection surface of Y movable mirror 42 with the Y-position of the reference mirror serving as a reference (i.e. which is substantially coincides with the optical path length of measurement beam IBY2). Reference axis $O_{Y2}$ is spaced apart in the +X direction from reference axis $O_{Y1}$ by substantially the same distance as the separation distance between (the detection center of) second mark detection system M2 and (the mounting center of) wafer W2 in the X-axis direction. Incidentally, it is also possible that an interferometer that is similar to first Y interferometer 240Y1 is used as second interferometer 240Y2 and a reference mirror for the interferometer is fixed to top board section 12 in a suspended state.

Third Y interferometer 240Y3 (not illustrated in FIG. 16, see FIG. 17) is also configured similar to second Y interferometer 240Y2. However, third Y interferometer 240Y3 is installed apart in the –X direction from first Y interferometer 240Y1, and a measurement axis (to be a reference axis $O_{Y3}$) that is an optical path of its measurement beam is orthogonal to reference axis $O_X$ at the center of first table T1 (which substantially coincides with the center of wafer W1 held by first table T1).

Incidentally, in the state shown in FIG. 16, only measurement beam IBY2 of Y interferometer 240Y2 is irradiated on Y movable mirror 92Y. According to the X-position of second table T2 (stage device 230), for example, when second table T2 (stage device 230) moves in the −X direction from the state shown in FIG. 16, the situation arises where only measurement beam IBY2 of Y interferometer 240Y2, both of measurement beams IBY2 and IBY2 of Y interferometers 240Y2 and 240Y1, only measurement beam IBY1 of Y interferometer 240Y1, both of measurement beams IBY1 and IBY3 of Y interferometers 240Y1 and 240Y3 or only measurement beam IBY3 of Y interferometer 240Y3 is/are irradiated, in order, on Y movable mirror 42Y. Therefore, a controller 220 (see FIG. 17) selects and uses the interferometer(s) whose measurement beam(s) is/are irradiated on Y movable mirror 42Y from among the three Y interferometers 240Y1, 240Y2 and 240Y3, according to the X-position of second table T2 (stage device 230). Here, in the case when second table T2 (stage device 230) moves in the X-axis direction, the Y-position of second table T2 (stage device 230) that is measured by interferometer system 240 needs to show consecutive values, similar to the first embodiment descried earlier. Therefore, in a state where the measurement beams from the two adjacent Y interferometers are simultaneously irradiated on Y movable mirror 42Y, controller 220 performs carry-over of the measurement values between the adjacent Y interferometers and switching of the interferometer to be used (linkage process).

Then, controller 220 computes the X-position and the position in the θz direction (rotational angle θz) of second table T2 from the measurement result of X interferometer 240X, or more specifically, the average value and the difference of the measurement results of the X-positions of the irradiation points of measurement beams $IBX_B$ and $IBX_M$. Further, controller 220 computes the Y-position of second table T2 (stage device 230) from the measurement results of first to third Y interferometers 240Y1 to 240Y3. Incidentally, in the case of Y interferometers 240Y1 to 240Y3, although controller 220 performs the linkage process described above between the adjacent Y interferometers according to the X-position of second table T2 (stage device 230), the explanation about this linkage process is omitted in the description below.

In substrate bonding apparatus 200 related to the present second embodiment, as is described earlier, second table T2 is supported by the three Z drive sections 33 mounted on stage ST via Z stage 232, X movable mirror 42X is fixed to the +X side end of the upper surface of second table T2, and second mark detection system M2 is mounted on (fixed to) the −X side end (i.e. the end on the opposite side to X movable mirror 42X) of the upper surface of stage ST. Accordingly, in substrate bonding apparatus 200, reference axes $O_X$ and $O_{Y1}$ to $O_{Y3}$, which coincide with the substantial measurement axes of the four interferometers 240X and 240Y1 to 240Y3, can be located on reference plane $S_M$. More specifically, the X, Y and θz positions of second table T2 (stage device 230) are defined on reference plane $S_M$. Further, in substrate bonding apparatus 200, since second mark detection system M2 is mounted on the upper surface of stage ST separately from Z stage 232, the position of second mark detection system M2 in the Z-axis direction is not changed even if second table T2 (wafer W2) is moved in the Z-axis direction via the three Z drive sections 33.

As shown in FIG. 15, fiducial mark device 50 related to the second embodiment is installed on top board section 12 in an orientation opposite to the fiducial mark device of the first embodiment, but is configured similar to fiducial mark device 50 (see FIG. 4) of the first embodiment.

Figure 20:
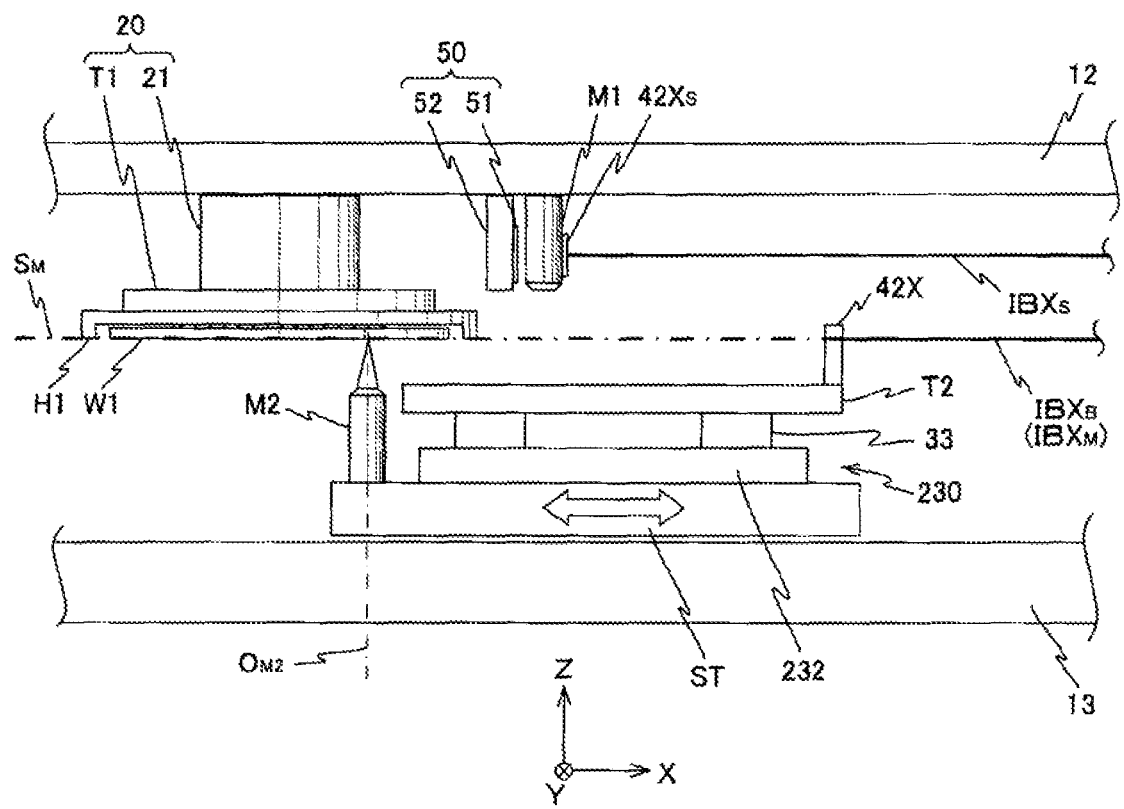
FIG. 20 is a view used to explain step S2 (a search alignment process for the wafer held by the first table) of the substrate bonding method in the second embodiment.

In the present embodiment, as a result of employing the configurations of the respective sections as is described above, as shown in FIG. 15, when stage device 230 is positioned such that center axes (optical axes) $O_{M1}$ and $O_{M2}$ of first and second mark detection systems M1 and M2 coincide, first table T1 and second table T2 are located on the sides opposite to each other (the −X side and the +X side) with center axes $O_{M1}$ and $O_{M2}$ serving as the center. To use another expression, for example, as shown in FIG. 20, when stage device 230 is positioned at a position with which first mark detection system M1 is opposed to a wafer held by second table T2 (in FIG. 20, there is no wafer on second table T2), first table device 20 is placed at a position with which second mark detection system M2 is opposed to wafer W1 held by first table T1. By employing such a placement relation between first and second tables T1 and T2, the movement stroke, in which stage device 230 moves to perform alignment measurement to be described later, can be shortened, compared with a substrate bonding apparatus in which first and second tables T1 and T2 are located on the same side with respect to center axes $O_{M1}$ and $O_{M2}$ when the stage device is positioned such that center axes (optical axes) $O_{M1}$ and $O_{M2}$ of first and second mark detection systems M1 and M2 coincide. In the present second embodiment, the movement stroke in the X-axis and Y-axis directions of stage device 230 (stage ST) is set to about 100 cm, with respect to the width in the X-axis and Y-axis directions of second table T2, e.g. about 40 cm.

Figure 17:
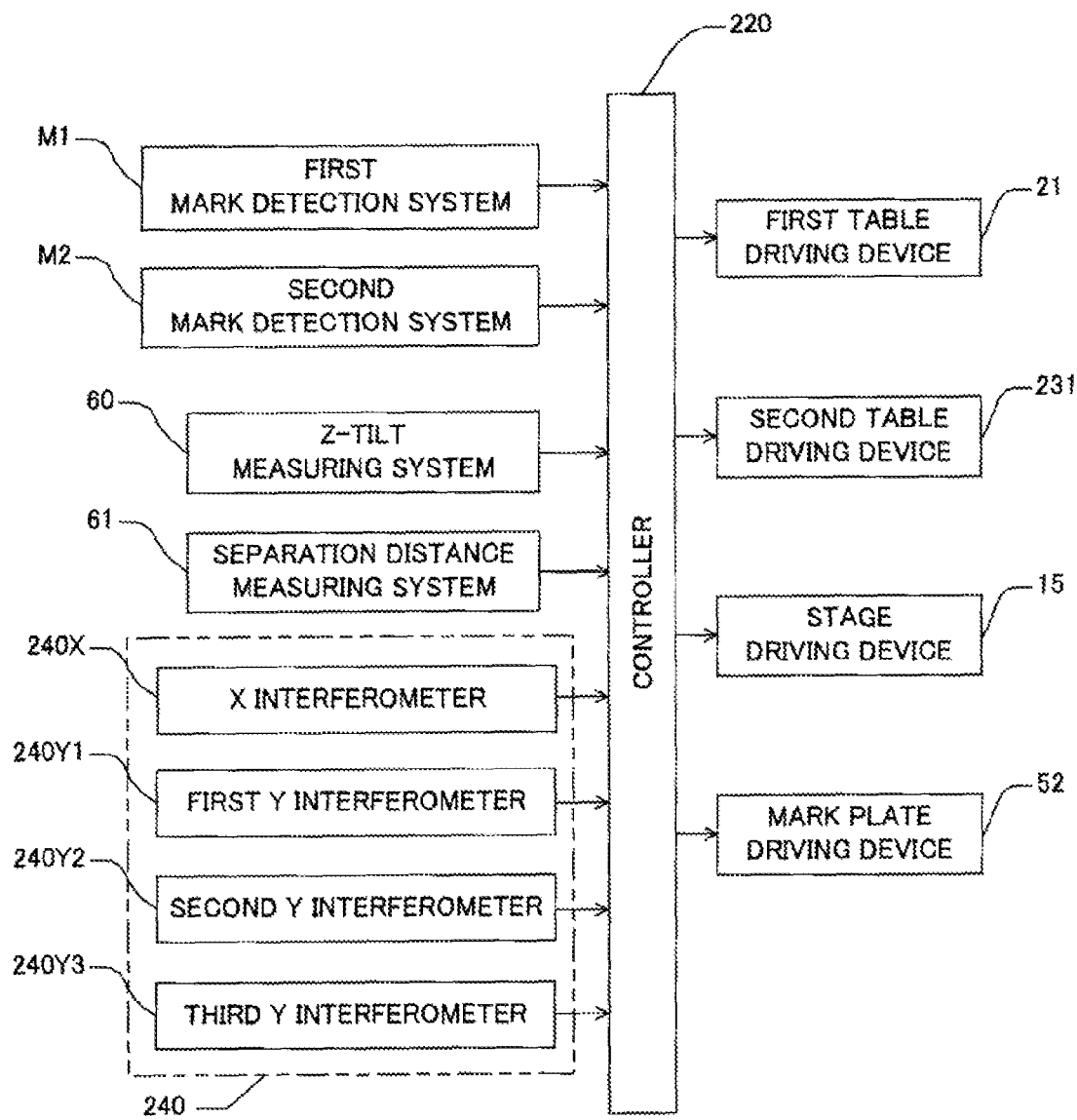
FIG. 17 is a block diagram showing a main configuration of a control system of the substrate bonding apparatus related to the second embodiment.

FIG. 17 shows a main configuration of a control system of substrate bonding apparatus 200. This control system is configured of controller 220 as the center, which is composed of a microcomputer (or a workstation) that performs overall control of the entire apparatus, similar to the first embodiment described above.

In substrate bonding apparatus 200 related to the present second embodiment that is configured as described above, basically, substrates are bonded in the procedure similar to the first embodiment described previously. Accordingly, in the description below, a substrate bonding method that is performed in substrate bonding apparatus 200 is briefly explained using the flowchart in FIG. 6. Incidentally, as the premise, it is assumed that substrate bonding apparatus 200 is equipped with mark plate driving device 52B by a folding method described earlier (see FIGS. 4C and 4D).

Figure 18:
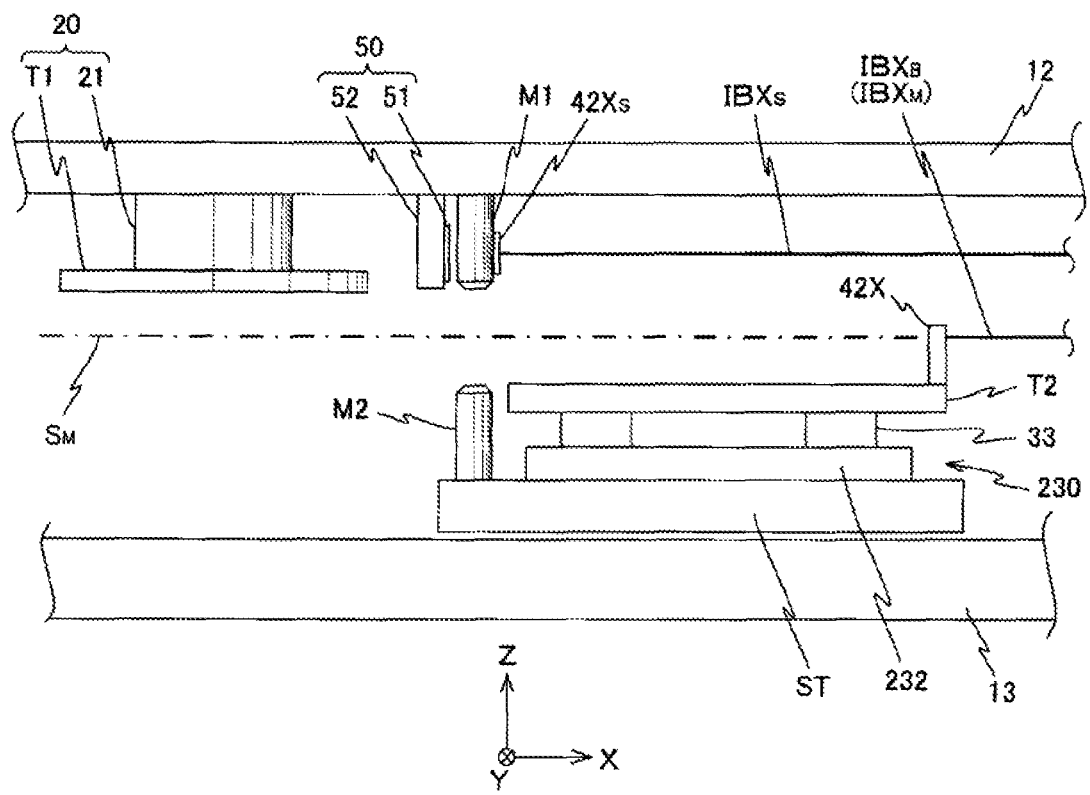
FIG. 18 is a view showing a state of the substrate bonding apparatus just before a substrate bonding process is performed in the second embodiment.

FIG. 18 shows a state of substrate bonding apparatus 200 just before the processing of a series of substrate bonding processes is performed, where stage device 230 waits at the loading position and also first table T1 has withdrawn to the second position. As can be seen from FIG. 18, in the present second embodiment, when stage device 230 is located at the loading position, first table T1 and second table T2 are not opposed to each other.

First of all, controller 220 resets interferometer system 240 prior to step S1. Further, controller 220 drives first table T1 in the −Z direction indicated by a black arrow in FIG. 19 via first table driving device 21, and causes first table T1 to be located at the first position described previously.

Figure 19:
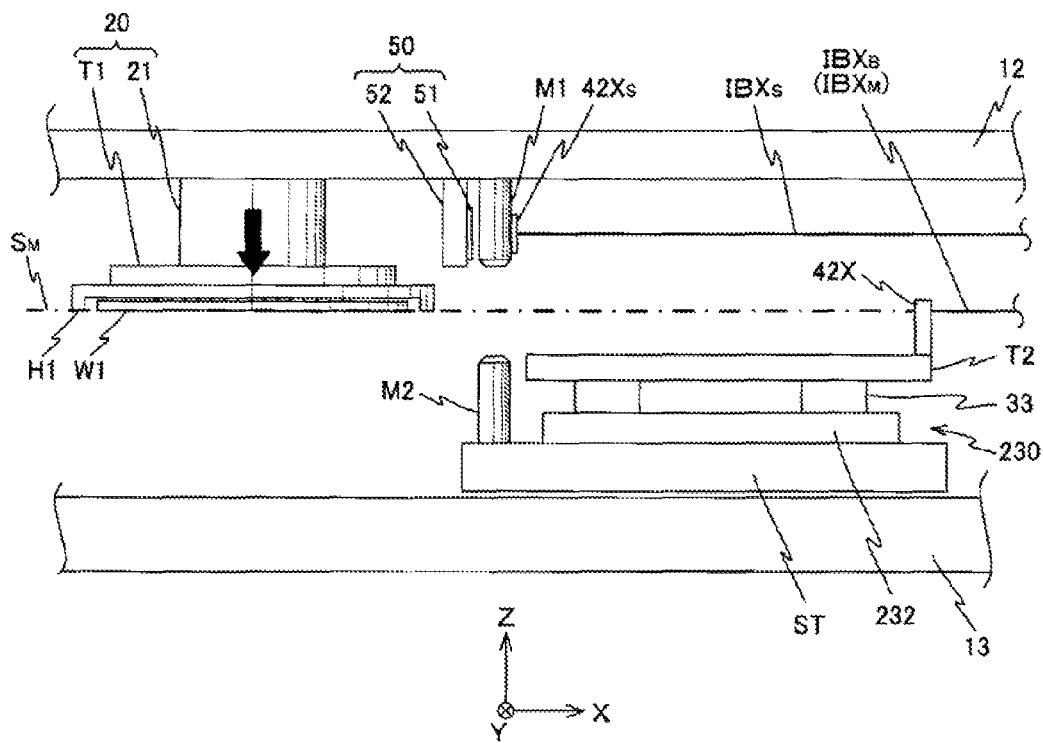
FIG. 19 is a view used to explain step S1 (a step of causing a first table to hold a wafer) of the substrate bonding method in the second embodiment.

Then, controller 220 performs the processing in the procedure similar to step S1 described earlier, and installs wafer W1 on first table T1 via holder H1. FIG. 19 shows a state where this installation has been completed and wafer W1 is held facing downward (in the −Z direction) and horizontally, by first table T1. Incidentally, at this point in time, the surface (lower surface) of wafer W1 is positioned on reference plane $S_M$.

Next, controller 220 executes search alignment to wafer W1 installed on first table T1 in the procedure similar to step S2 described earlier. FIG. 20 shows a state where the search alignment is performed to wafer W1 using second mark detection system M2, while stage device 230 moves within the XY plane as shown by an outlined arrow in FIG. 20. BY this search alignment, rotational amount θz of wafer W1 within the XY plane is obtained.

After the search alignment of wafer W1 described above has been completed, as shown in FIG. 21, controller 220 drives first table T1 in a direction (+Z direction) indicated by a black arrow in FIG. 21 via first table driving device 21 and causes first table T1 to withdraw to the loading position described earlier.

In this state, controller 220 performs the processing in the procedure similar to step S3 described earlier, and as shown in FIG. 21, wafer W2 is installed on second table T2 via holder H2 with its surface facing upward (the +Z direction) and horizontally. In this case as well, based on the result of the search alignment, wafer W2 is installed on second table T2 via holder H2 in a state where rotation of wafer W2 in the XY plane is adjusted so as to coincide with rotational amount θz of wafer W1. In this case as well, similar to the first embodiment described earlier, the rotational position of wafer W2 can be made to coincide with the rotational (θz) position of wafer W1 by adjusting the rotation angle of stage device 230 in the θz direction, as far as any problems do not occur in the measurement of interferometer system 240.

Figure 21:
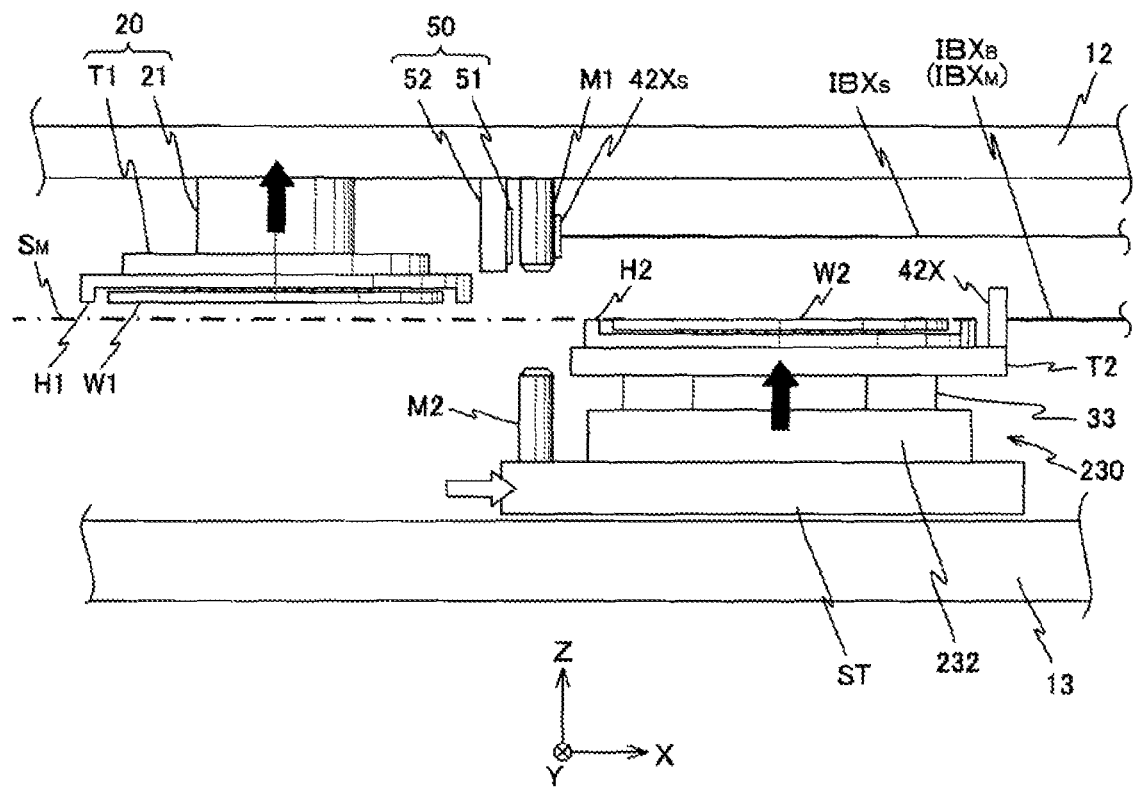
FIG. 21 is a view used to explain step S3 (a step of causing a second table to hold a wafer) of the substrate bonding method in the second embodiment.

After the installation of wafer W2, controller 220 drives second table T2 in the +Z direction indicated by a black arrow in FIG. 21 via Z stage 232 (and the three Z drive sections 33) of second table drive device 231, and positions the surface of wafer W2 on reference plane $S_M$.

Figure 22:
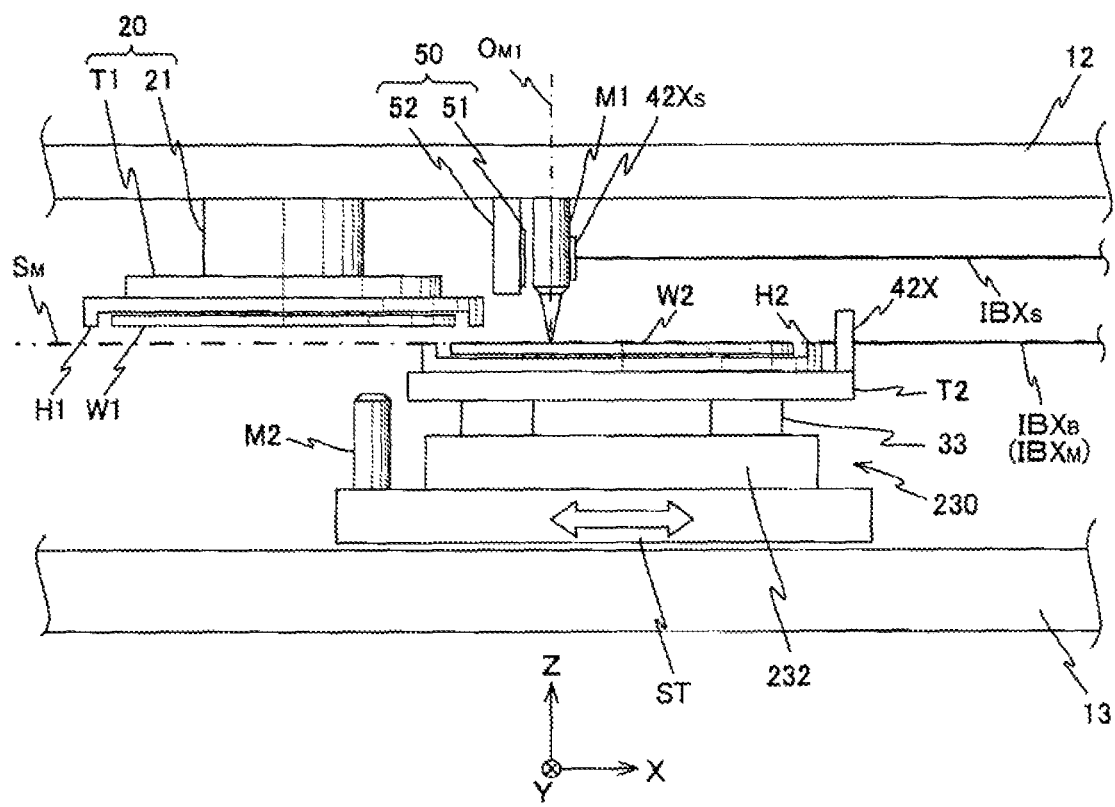
FIG. 22 is a view used to explain step S4 (a step of detecting an alignment mark of the wafer held by the second table using a first detection system) of the substrate bonding method in the second embodiment.

Subsequently, controller 220 executes detection of alignment mark $AM2_j$ arranged on the surface of wafer W2 using first mark detection system M1, in the procedure similar to step S4 described earlier. FIG. 22 shows a state where controller 220 drives stage device 230 within the XY plane (see an outlined arrow in FIG. 22), and performs position measurement of alignment mark $AM2_j$ arranged on the surface of wafer W2.

Figure 23:
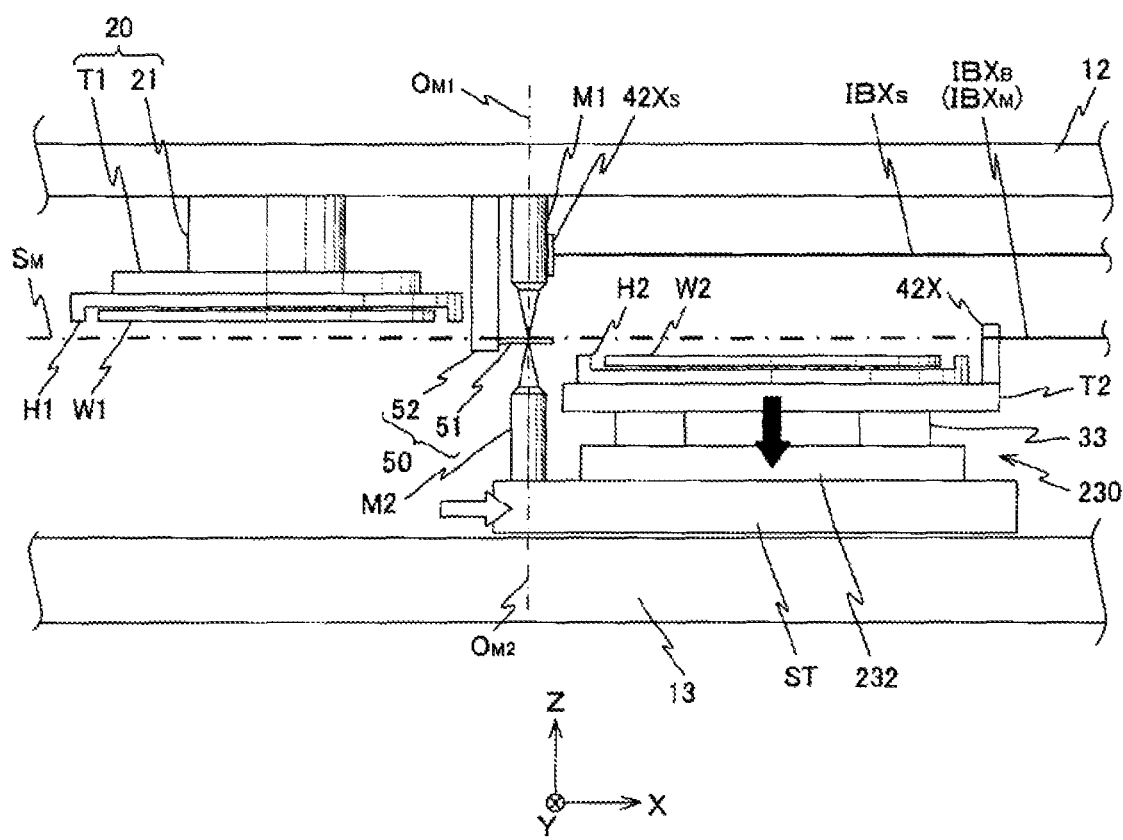
FIG. 23 is a view used to explain step S5 (a baseline measurement process) of the substrate bonding method in the second embodiment.

Then, after the measurement has been completed, controller 220 drives stage device 230 in a direction (the +X direction) indicated by an outlined arrow in FIG. 23, and moves stage device 230 to a position with which second mark detection system M2 is opposed to first mark detection system M1, in preparation for the following baseline measurement. Furthermore, controller 220 drives second table T2 in the −Z direction indicated by a black arrow in FIG. 23 via second table driving device 231 and causes wafer W2 to withdraw from reference plane $S_M$, and also positions the detection plane (detection point) of second mark detection system M2 in reference plane $S_M$.

Then, controller 220 performs measurement of the baseline of second mark detection system M2 in the procedure similar to step S5 described previously. FIG. 23 shows a state where the baseline measurement is performed.

Figure 24:
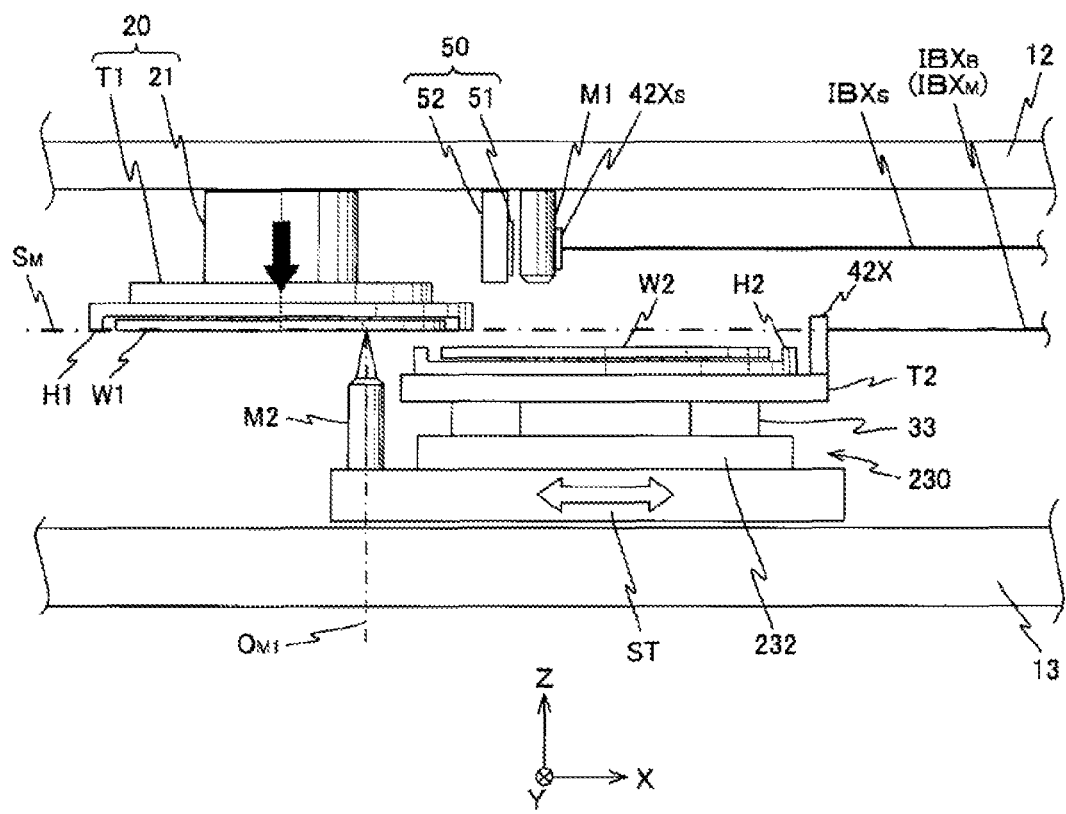
FIG. 24 is a view used to explain step S6 (a step of detecting an alignment mark of the wafer held by the first table using a second detection system) of the substrate bonding method in the second embodiment.
Figure 25:
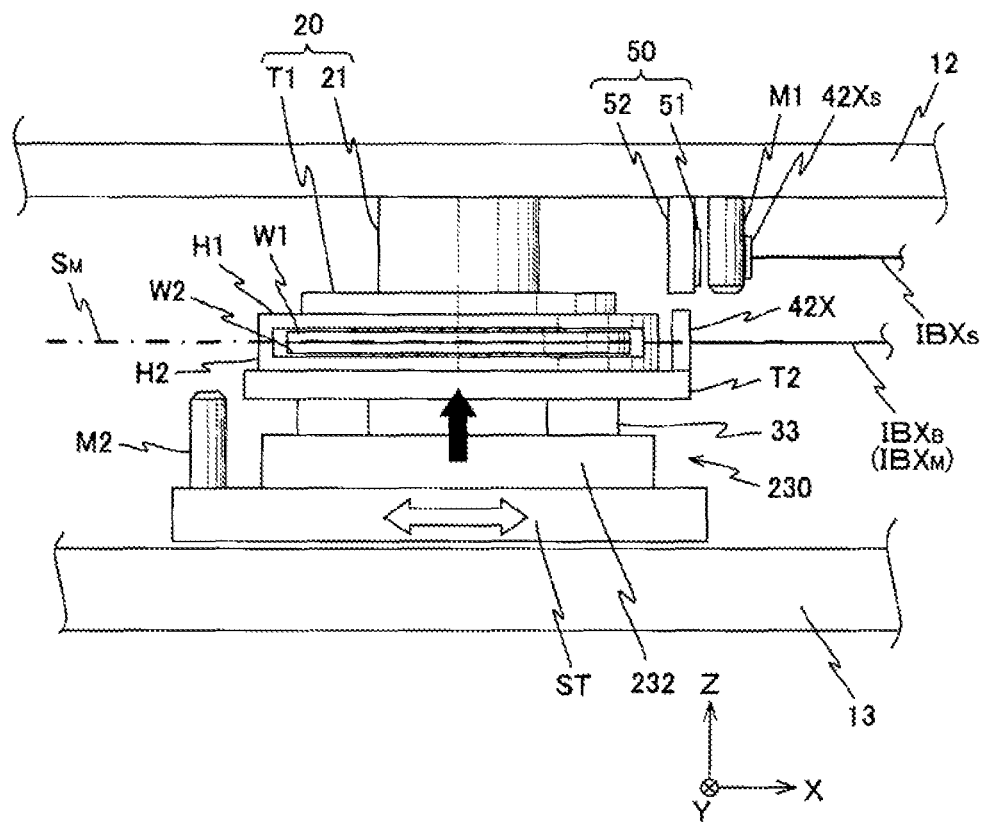
FIG. 25 is a view used to explain step S7 (a step of overlaying two wafers) of the substrate bonding method in the second embodiment.

After the baseline measurement has been completed, as shown in FIG. 24, controller 220 causes mark plate 51 (fiducial mark FM) to withdraw via mark plate driving device 52, prior to detection of alignment marks on the next wafer W1. In parallel with this operation, as shown in FIG. 24, in preparation for the detection of the alignment marks on the next wafer W1, controller 220 drives first table T1 in the −Z direction indicated by a black arrow in FIG. 24 via first table driving device 21 and causes first table T1 to be located at the first position, and positions the surface of wafer W1 on reference plane $S_M$.

Subsequently, controller 220 executes detection of alignment mark $AM1_i$ arranged on the surface of wafer W1 using second mark detection system M2, in the procedure similar to step S6 described earlier. FIG. 24 shows a state where controller 220 drives stage 230 within the XY plane (see an outlined arrow in FIG. 24), and performs position measurement of alignment mark $AM1_i$ arranged on the surface of wafer W1.

Then, after the position measurement of alignment mark $AM1_j$ arranged on the surface of wafer W1 has been completed, controller 220 performs the processing of a process of bonding wafers W1 and W2 in the procedure similar to step S7 described previously. In this case as well, controller 220 obtains a target position $(X_0, Y_0, θz_0)$ of stage device 230 that satisfies predetermined bonding conditions, based on the results of step S4 to S6, drives stage device 230 within the XY plane (see an outlined arrow in FIG. 25), and positions stage device 230 at the target position $(X_0, Y_0, θz_0)$. Then, controller 220 drives second table T2 in the +Z direction indicated by a black arrow in FIG. 25, and first table T1 and second table T2 approach in the Z-axis direction, and wafers W1 and W2 installed on both tables T1 and T2 are overlaid using reference plane $S_M$ as the overlaying plane. In this case, when wafers W1 and W2 are overlaid, controller 220 causes second table T2 to approach first table T1, while confirming that the tilts θx and θy of second table T2 do not vary using Z-tilt measuring system 60, and also confirming the separation distance between the two wafers W1 and W2 using Z-tilt measuring system 60 or separation distance measuring system 61.

Since the processes after the overlaying described above are similar to those of the first embodiment, the explanation thereabout is omitted here.

As is described in detail above, according to substrate bonding apparatus 200 related to the present second embodiment, the basic configuration and the procedure of bonding the substrates are similar to those of substrate bonding apparatus 100 related to the first embodiment descried previously, and therefore, the equivalent effect to the first embodiment described previously can be obtained. More specifically, according to substrate bonding apparatus 200, by using the detection result of the alignment marks on wafer W1 held by first table T1 that are obtained by second mark detection system M2, detection results of the alignment marks on wafer W2 held by stage device 230 (to be more specific, second table T2) that are obtained by first mark detection system M1, and the measurement results of interferometer system 240 (positional information (X, Y, θz) of stage ST within the XY plane) at the time of detection of the respective alignment marks, it becomes possible to precisely align and bond the two wafers W1 and W2.

Further, first mark detection system M1 is fixed to frame 10 (top board section 12) and second mark detection system M2 is mounted separately from second table T2, on stage ST of stage device 30 that is movable within the XY plane. Therefore, the detection point of first mark detection system M1 can be set on reference plane $S_M$ where the bonding of wafers W1 and W2 is performed and the detection point of second mark detection system M2 can constantly be set on reference plane $S_M$ regardless of the position of second table T2 in the Z-axis direction. Consequently, the surface position of wafer W2 used when detecting the alignment marks on wafer W2 using first mark detection system M1 and the surface position of wafer W1 used when detecting the alignment marks provided on wafer W1 using second mark detection system M2 can be unified with the plane position used when bonding both wafers W1 and W2. Accordingly, even the wafers having a large diameter can be overlaid with high precision.

Further, according to substrate bonding apparatus 200 related to the present second embodiment, first mark detection system M1 fixed to frame 10 is opposed to wafer W2 held by stage device 230 (second table T2) when second mark detection system M2 fixed to stage device 230 (stage ST) is opposed to wafer W1 held by first table T1. In other words, first and second mark detection systems M1 and M2 and first table T1 and second table T2 are placed such that when stage device 230 is located at a position with which detection center (center axis) $O_{M1}$ of first mark detection system M1 and detection center (center axis) $O_{M2}$ of second mark detection system M2 substantially coincide, first table T1 and second table T2 are located on the sides opposite to each other with respect to detection center (center axis) $O_{M1}$ of first mark detection system M1. Accordingly, the movement stroke of stage device 230 on detection of the alignment marks can be shortened, compared with the case when first table T1 and second table T2 are located on the same side with respect to detection center (center axis) $O_{M1}$ when stage device 230 is located at a position with which detection center (center axis) $O_{M1}$ and detection center (center axis) $O_{M2}$ substantially coincide.

Further, substrate bonding apparatus 200 of the present second embodiment, since the measurement axes of the respective interferometers of interferometer system 240 can be made to coincide with reference plane $S_M$, it becomes possible to measure the positional information of wafer W2 (stage device 230) within the XY plane without the so-called Abbe error, and therefore, the respective interferometers do not need the measurement axes used to measure the tilt (θx or θy) of second table T2.

Further, in substrate bonding apparatus 200 related to the present second embodiment, even if second table T2 tilts, stage ST does not tilt, and therefore, correction of the result of the alignment measurement of wafer W1 taking the tilt of the optical axis of second mark detection system M2 into consideration hardly needs to be performed.

Incidentally, in substrate bonding apparatus 200 related to the present second embodiment, the processing time is optimized to be the shortest by executing the processing of the respective steps of steps S4, S5 and S6 in order, as shown in the flowchart in FIG. 6. However, this is not intended to be limiting, and steps S4, S5 and S6 can be performed in any order. For example, the processing of the respective steps can be performed in the order of steps S5, S4 and S6 or in the order of steps S5, S6 and S4. In addition, for example, as shown in FIG. 22, during the alignment mark detection of wafer W2 using first mark detection system M1 in step S4, second mark detection system M2 is opposed to wafer W1 held by first table T1. Therefore, the alignment mark detection of wafer W1 using second mark detection system M2 in step S6 can be performed at least partially in parallel with step S4. Alternatively, the baseline measurement in step S5 can be performed in the middle of step S4 or step S6.

Third Embodiment

Next, a third embodiment of the present invention is described with reference to FIGS. 26 and 27. Here, regarding the constituents that are the same as or equivalent to those of substrate bonding apparatus 100 of the first embodiment or substrate bonding apparatus 200 of the second embodiment described earlier, the same reference sings are used and also the explanation thereabout is omitted or simplified in the following description.

Figure 26:
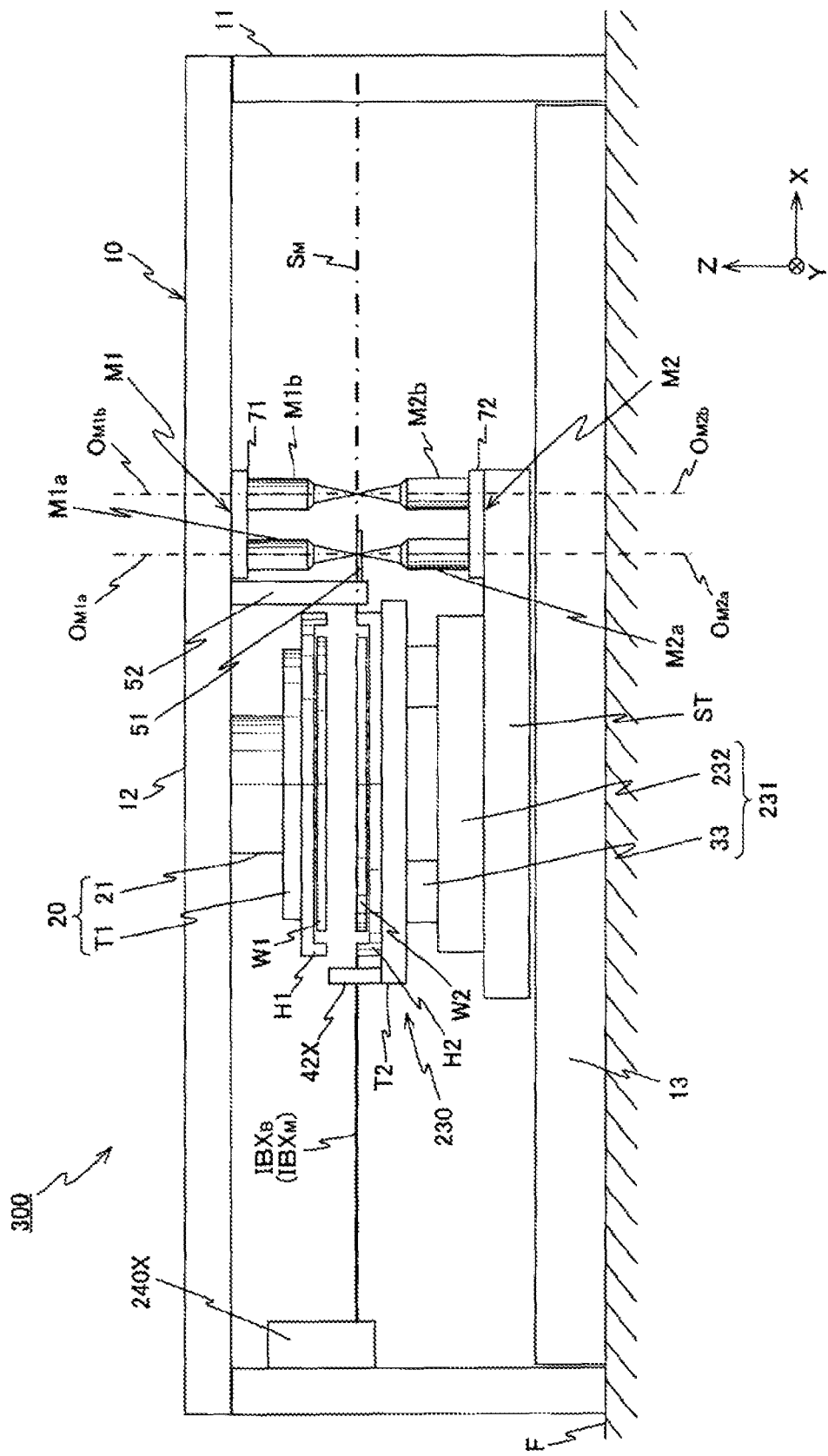
FIG. 26 is a view schematically showing a configuration of a substrate bonding apparatus related to a third embodiment.

FIG. 26 schematically shows a substrate bonding apparatus 300 related to the present third embodiment. In substrate bonding apparatus 300, while configurations of first and second mark detection systems M1 and M2 and placement of some constituents are different from those in the substrate bonding apparatuses of the respective embodiments, the configurations of the other sections, the substrate bonding method and the like are similar to those in the substrate bonding apparatus of the first or second embodiment. Accordingly, in the description below, the third embodiment is explained focusing on the different points.

Substrate bonding apparatus 300 has a configuration like a combination of the first embodiment and the second embodiment described earlier, except for the configurations of first and second mark detection systems M1 and M2. More specifically, while the positional relation among first table device 20, mark plate driving device 50 and first mark detection system M1 is similar to that in the first embodiment described previously, stage device 230 of the second embodiment is used as the stage device, and accordingly interferometer system 240 is used as the interferometer system.

Figure 27:
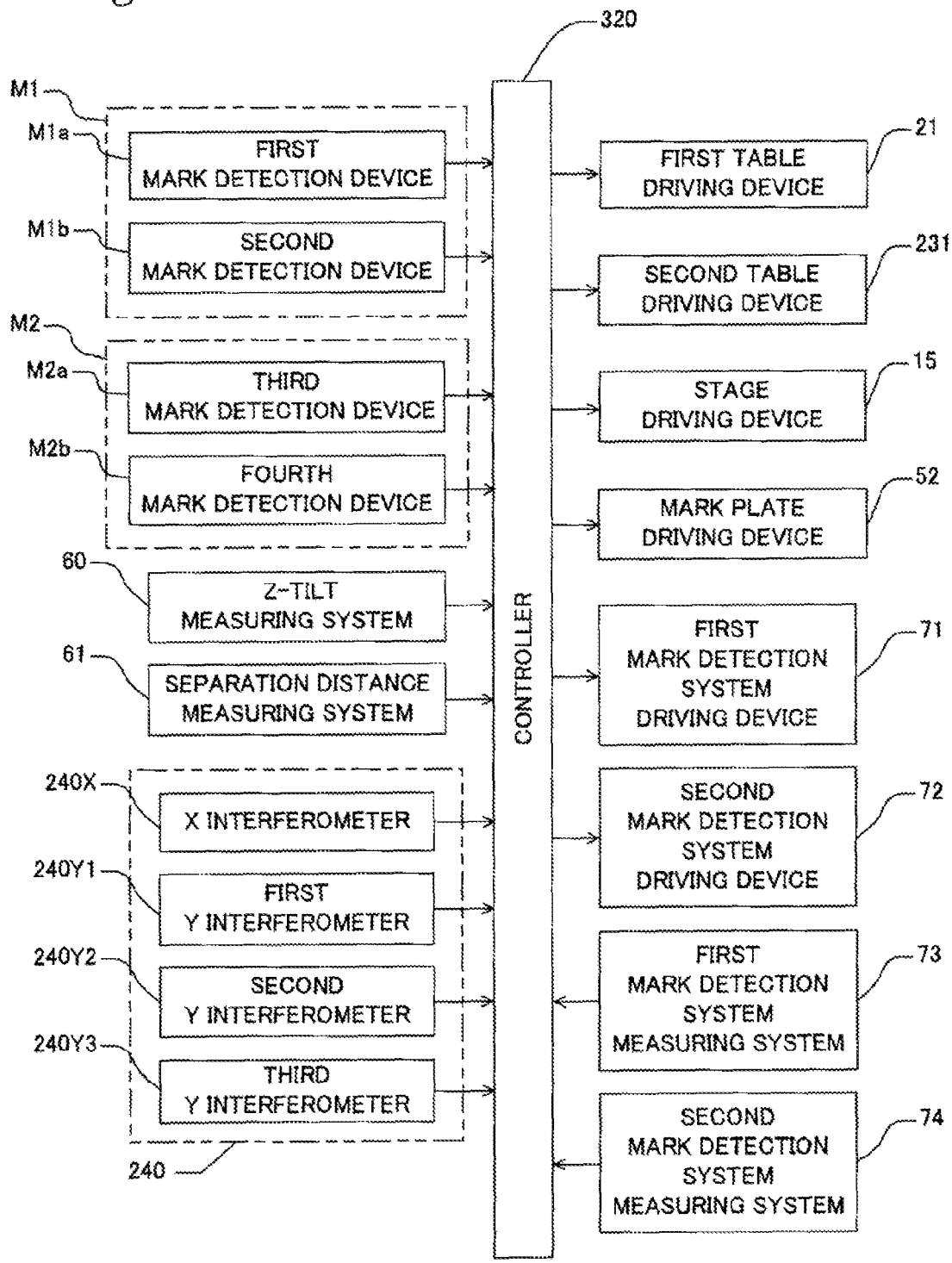
FIG. 27 is a block diagram showing a main configuration of a control system of the substrate bonding apparatus related to the third embodiment.

First mark detection system M1 equipped in substrate bonding apparatus 300 is equipped with a first detection device M1a and a second detection device M1b, as shown in FIG. 27. As shown in FIG. 26, first and second detection devices M1a and M1b are installed facing downward (toward the −Z direction) at positions that are a predetermined distance away on the +X side from the substantial center of the lower surface of top board section 12, via a first mark detection system driving device 71. As each of first and second detection devices M1a and M1b, a microscope (or an imaging device) having a configuration similar to that of first mark detection system M1 of the first embodiment is used. Center axes (optical axes or index centers) $O_{M1a}$ and $O_{M1b}$ of first and second detection devices M1a and M1b are parallel to each other and are orthogonal to reference plane $S_M$.

Further, second mark detection system M2 equipped in substrate bonding apparatus 300 is equipped with a third detection device M2a and a fourth detection device M2b, as shown in FIG. 27. As shown in FIG. 26, third and fourth detection devices M2a and M2b are mounted facing upward (toward the +Z direction) in the vicinity of the end in the +X direction of the upper surface of stage ST, via a second mark detection system driving device 72. As each of third and fourth detection devices M2a and M2b, a microscope (or an imaging device) having a configuration similar to that of second mark detection system M2 of the first embodiment is used. Center axes (optical axes or index centers) $O_{M2a}$ and $O_{M2b}$ of the two detection devices M2a and M2b are parallel to each other and are orthogonal to reference plane $S_M$. Accordingly, optical axes $O_{M1a}$ and $O_{M1b}$ of first and second detection devices M1a and M1b and optical axes $O_{M2a}$ and $O_{M2b}$ of third and fourth detection devices M2a and M2b are parallel to one another. Incidentally, since the configuration of stage device 230 except for second mark detection system M2 is similar to that of the second embodiment, the explanation thereabout is omitted here.

First mark detection system driving device 71 drives first and second detection devices M1a and M1b via a drive mechanism that is not illustrated and second mark detection system driving device 72 drives third and fourth detection devices M2a and M2b via a drive mechanism that is not illustrated, within a predetermined range in the XY plane, independently from each other.

When first and second detection devices M1a and M1b relatively move within the XY plane via first mark detection system driving device 71 and when third and fourth detection devices M2a and M2b relatively move within the XY plane via second mark detection system driving device 72, optical axes $O_{M1a}$, $O_{M1b}$, $O_{M2a}$ and $O_{M2b}$ of the respective detection devices are maintained perpendicular to reference plane $S_M$. Incidentally, since first and second detection devices M1a and M1b that configure first mark detection system M1 are each movable, interferometer system 240 irradiates, for example, a fixed mirror (not illustrated) fixed to top board section 12 with a reference beam (not illustrated).

As shown in FIG. 27, in substrate bonding apparatus 300, a first mark detection system measuring system 73 that measures positional information of each of first and second detection devices M1a and M1b within the XY plane, and a second mark detection system measuring system 74 that measures positional information of each of third and fourth detection devices M2a and M2b within the XY plane are arranged. First and second mark detection system measuring systems 73 and 74 each include, for example, an optical interferometer system (or an encoder system), and can detect the positional information of each of first and second detection devices M1a and M1b or the positional information of each of third and fourth detection devices M2a and M2b with the accuracy equivalent to that of interferometer system 240. The positional information of first and second detection devices M1a and M1b detected by first mark detection system measuring system 73 and the positional information of third and fourth detection devices M2a and M2b detected by second mark detection system measuring system 74 are supplied to a controller 320 respectively. Controller 320 obtains the target position of stage device 230 in which the bonding of the two wafers W1 and W2 is performed, by using the detection results of the alignment marks on wafer W1, the detection results of the alignment marks on wafer W2, the measurement results of interferometer system 240 at the time of each of the alignment mark detections, and relative positional information of the respective detection devices at the time of each of the alignment mark detections.

In the present third embodiment, as a result of employing the configurations of the respective sections as described above, when the alignment marks on wafer W2 are detected (see step S4 in FIG. 6), the two alignment marks on wafer W2 can be simultaneously detected using first and second detection devices M1a and M1b. Further, when the search alignment of wafer W1 (see step S2 in FIG. 6) is performed, and when the alignment marks on wafer W1 are detected (see step S6 in FIG. 6), the two alignment marks on wafer W1 can be simultaneously detected using third and fourth detection devices M2a and M2b. In substrate bonding apparatus 300 related to the present third embodiment, the configuration is employed in which a plurality of alignment marks can be simultaneously detected with a plurality of detection devices, which allows the time required for the alignment measurement (steps S2, S4 and S6 in FIG. 6) to be shortened, compared with the case of individually detecting a plurality of marks using a single mark detection system while driving stage device 230 within the XY plane. Consequently, the throughput can be improved. Further, the movement stroke in which stage device 230 moves in order to perform the alignment measurement described above can be shortened, compared with the case of positioning a single mark detection system with respect to each alignment mark while driving stage device 230 within the XY plane.

Further, according to substrate bonding apparatus 300 of the present third embodiment, the configuration in which the two alignment marks can be simultaneously detected is employed, and therefore, in the case of setting the movement stroke of first and second detection devices M1a and M1b (or third and fourth detection devices M2a and M2b) longer than or equal to a predetermined distance, the alignment measurement described above can be completed, by only driving stage device 230 to a position with which first and second detection devices M1a and M1b (or third and fourth detection devices M2a and M2b) are opposed to wafer W2 (or wafer W1) respectively, without driving stage device 230 afterwards. Accordingly, the throughput can be improved in this point as well.

Incidentally, in substrate bonding apparatus 300 related to the third embodiment above, while the two detection devices M1a and M1b are independently movable within the XY plane and also the two detection devices M2a and M2b are independently movable within the XY plane, this is not intended to be limiting, and a configuration can be employed in which one of the detection devices, e.g. first detection device M1a is fixed to top board section 12 and only the other detection device, detection device M1b is configured movable within the XY plane. Similarly, a configuration can be employed in which one of the detection devices, e.g. third detection device M2a is fixed to stage ST and only the other detection device, detection device M2b is configured movable within the XY plane. The point is that the two alignment marks arranged on a wafer can simultaneously be detected. In this regard, all of detection devices M1a, M1b, M2a and M2b can be fixed to top board section 12 or stage ST, as far as the detection field of each of the detection devices is sufficiently large and the two alignment marks can be simultaneously detected via the two detection devices in a state where stage device 230 is positioned in a predetermined position. To the similar effect, in the first and second embodiments described earlier, it is also possible to employ a configuration in which the detection field of each of first and second mark detection systems M1 and M2 is set large enough and the two alignment marks can simultaneously be detected by mark detection system M1 or M2.

Figure 28:
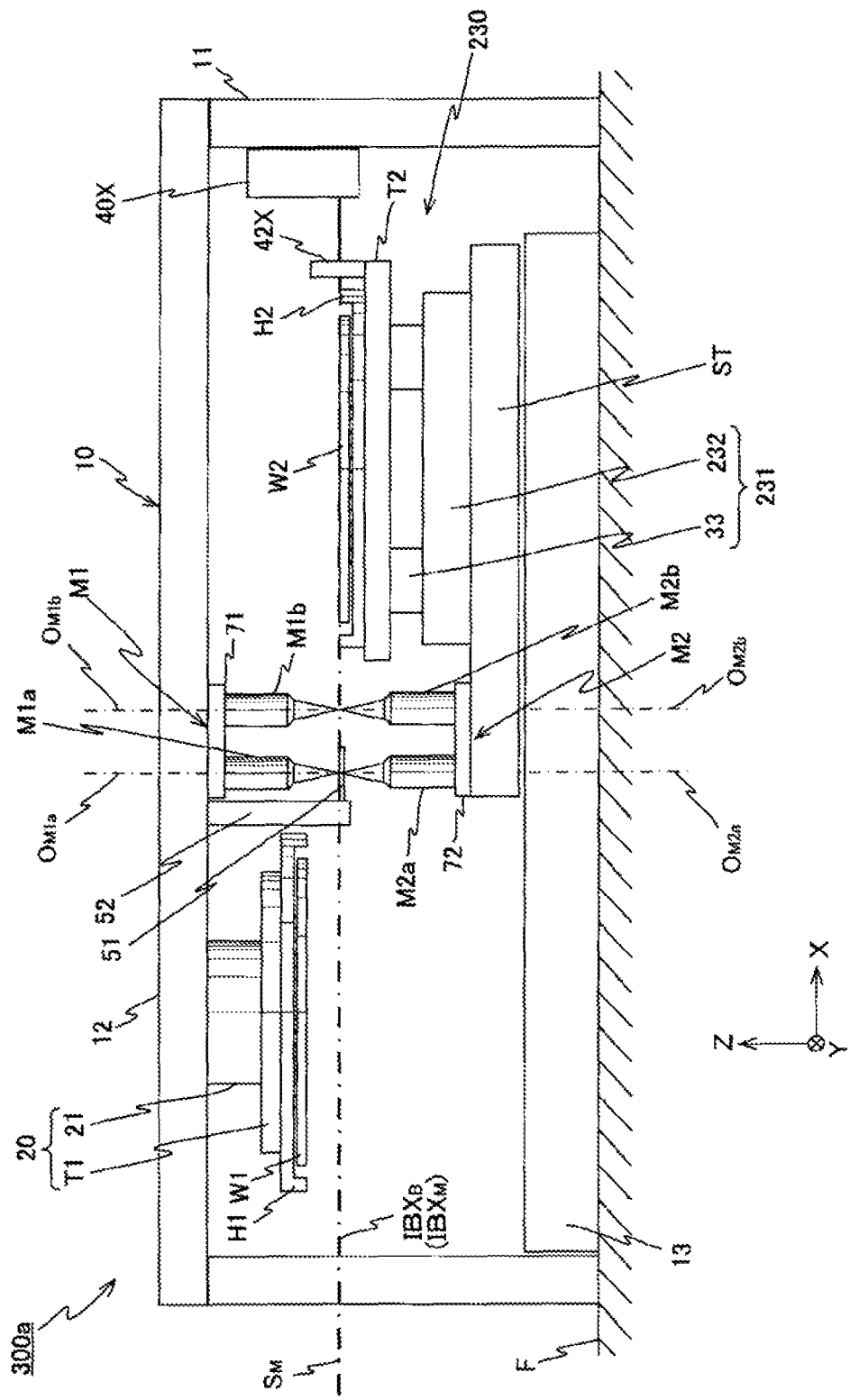
FIG. 28 is a view schematically showing a configuration of one of modified examples of the substrate bonding apparatus related to the third embodiment.

Further, in the third embodiment above, while the configuration is employed in which first mark detection system M1 (first and second detection devices M1a and M1b) and second mark detection system M2 (third and fourth detection devices M2a and M2b) are opposed in a state where wafers W1 and W2 are opposed, the configuration of the substrate bonding apparatus related to the present invention is not limited thereto as a matter of course. FIG. 28 shows a modified example of substrate bonding apparatus 300 of the third embodiment. In a substrate bonding apparatus 300a shown in FIG. 28, wafer W1 (first table T1) and wafer W2 (second table T2) are located on the sides opposite to each other (the −X side and the +X side) with respect to the center of the opposed section of first mark detection system M1 and second mark detection system M2 in a state where at least a part of first mark detection system M1 and at least a part of second mark detection system M2 are opposed, which is similar to the second embodiment. By employing such a configuration, the movement distance of stage device 230 during the alignment measurement can be shortened, which allows the throughput to further be improved.

Incidentally, in each of the embodiments above, while a plurality of alignment marks are formed on the surfaces of wafers W1 and W2 in the placement as representatively shown in FIG. 2 regarding wafer W2, the wafer that is a bonding subject of the substrate bonding apparatus of each of the embodiments above is not limited thereto. For example, on a wafer after exposure by a stepper or the like that is used in a lithography process for manufacturing a semiconductor device (integrated circuit) or the like, many shot areas (circuit pattern areas) are formed, by the exposure, in the matrixshaped placement and alignment marks are simultaneously formed (arranged) at the respective shot areas. In the case of using two of such wafers as the bonding subjects, the alignment marks arranged at the respective shot areas are preferably made to be detection subjects of first and second mark detection systems M1 and M2. Since the alignment marks arranged at the respective shot areas are formed on a wafer concurrently with the respective shot areas by the exposure, the similar influence are given to the alignment marks by the processing of the similar process. Further, in this case, alignment marks do not have to newly be provided when the bonding of the wafers is performed.

Further, in the case when the bonding subjects are the wafers after exposure by a stepper or the like, as a method of obtaining a desired bonding position of wafers W1 and W2 described previously, the EGA (Enhanced Global Alignment) parameter in the EGA, which is disclosed in detail in, for example, U.S. Pat. No. 4,780,617 or the like, is obtained for each wafer and the desired bonding position can be computed from the obtained result. In this case, the EGA measurement (position measurement of alignment marks arranged at sample shot areas (sample marks)) is performed to each wafer in steps S4 and S6, respectively.

Further, in each of the embodiments above, while the case has been described where the same fiducial mark FM is detected by first and second mark detection systems M1 and M2, the present invention is not limited thereto. More specifically, in the substrate bonding apparatus, the detection subject of the first detection system (first mark detection system M1 in each of the embodiments above corresponds thereto) can include a first fiducial mark in addition to the marks on the second substrate (wafer W2 in each of the embodiments above corresponds thereto), and the detection subject of the second detection system (second mark detection system M2 in each of the embodiments above corresponds thereto) can include a second fiducial mark, which is separate from the first fiducial mark, in addition to the marks on the first substrate (wafer W1 in each of the embodiments above corresponds thereto). In this case, the first fiducial mark and the second fiducial mark can be formed on different members, but it is preferable that the first and second fiducial marks are formed on the same mark member, from the viewpoint of maintaining the baseline measurement precision at a high level. Further, it is preferable that the second detection system can detect the second fiducial mark concurrently with the first detection system detecting the first fiducial mark, from the viewpoint where the time required for the baseline measurement can be shortened.

Incidentally, similar to interferometer system 40 of the first embodiment, the X interferometer that can also measure the rotation angle (tilt angle) θy around the Y-axis of second table T2 and the first to third Y interferometers that can measure the rotation angle (tilt angle) θx around the X-axis of second table T2 can employed in interferometer system 240 used in the substrate bonding apparatuses related to the second and third embodiments and the modified example above.

Further, in each of the embodiments above, while the case has been described where a single controller (see FIGS. 5, 17 and 27) controls the respective sections of the substrate bonding apparatus, a computing system to compute the position of stage device 30 or 230 within the XY plane from the measurement result of interferometer system 40 or 240, and a control system to control stage driving device 15 (see FIGS. 5, 17 and 27) using the computation result of the computing system can be provided, instead of the single controller. Further, a computing system can be provided that computes the target position (X0, Y0, θz0) of stage device 30 or 230 that satisfies the conditions of the desired bonding position of wafers W1 and W2 to be bonded, from detection results of alignment marks $AM1_i$ and $AM2_j$.

Further, in each of the embodiments above, while first table T1 is driven by first table driving device 21 and is movable only in the vertical (Z-axis) direction, this is not intended to be limiting, and first table T1 can be movable further within the XY plane (X, Y, θz) or in all the directions of six degrees of freedom (X, Y, Z, θx, θy, θz). And, a position measuring system that measures the position of first table T1 can be provided. Further, this position measuring system can be configured similarly to interferometer system 40.

Further, the configuration of the stage device described in each of the embodiments above is merely an example, and the present invention is not limited to the configuration. For example, it is enough that the stage device is movable at least within the two-dimensional plane. Accordingly, for example, in the second embodiment, second table driving device 231 does not necessarily have to be provided, and in the case when it is provided, second table driving device 231 can have a configuration different from the configuration of the second embodiment above. For example, if the drive stroke of the three Z drive sections 33 is long enough, then second table driving device 231 can be configured of only the three Z drive sections 33 that can individually perform the driving without being equipped with Z stage 232.

Incidentally, in each of the embodiments above, while the case has been described where first table T1 and first mark detection system M1 are fixed to frame 10 and second table T2 and second mark detecting system M2 are mounted on stage device 30 or 230 that is movable within the XY plane, the present invention is not limited thereto. For example, a configuration, which is obtained by vertically reversing the configuration in each of the embodiments above, can be employed. More specifically, a configuration can be employed in which first table T1 and first mark detection system M1 are fixed facing upward to stage surface plate 13, and stage device 30 or 230 on which second table T2 and second mark detection system M2 are arranged facing downward, is movable along the lower surface of top board section 12 of frame 10. Alternatively, a configuration can be employed in which the respective constituents excluding frame 10 of each of the embodiments above are placed sideways. In this case, stage device 30 or 230 moves along the YZ plane, and first table T1 is configured movable back and forth in the X-axis direction and second table T2 is configured drivable in the X-axis direction and the tilt direction with respect to the YZ plane.

Further, in each of the embodiments above, while the substrate bonding apparatus (100, 200, 300) has only one common fiducial mark FM that can be detected using mark detection systems M1 and M2, this is not intended to be limiting, and a plurality of fiducial marks can be provided. Further, as the mark plate driving device, a configuration and a placement need to be employed that do not block the processing in the processes other than step S5 and do not cut off the measurement beams and the reference beams of the respective interferometers that configure interferometer system 40 or 240, but if such conditions can be satisfied, then whatever configuration and placement can be employed.

Further, in each of the embodiments above, wafers W1 and W2 are installed on the substrate bonding apparatus using holders H1 and H2, but by using a holder for a semiconductor chip that is obtained by dicing a wafer, instead of the holder for wafer, the bonding from a chip-level to a wafer-level becomes possible. Further, not only a wafer of a single layer (or a semiconductor chip of a single layer) but also a semiconductor member on which a plurality of wafers (a plurality of semiconductor chips) have already been layered can be handled.

Furthermore, the present invention can be applied not only to the bonding of semiconductor substrates such as wafers described above or the bonding of semiconductor chips, but also to the bonding of other substrates, e.g. glass substrates for liquid crystal displays or the like. In this case, the substrate holders do not necessarily have to be used. If plate-shaped members are included in the concept of the other substrates, such plate-shaped members can be included in the bonding subjects in the substrate bonding apparatus and the bonding method of each of the embodiments above.

Figure 29A:
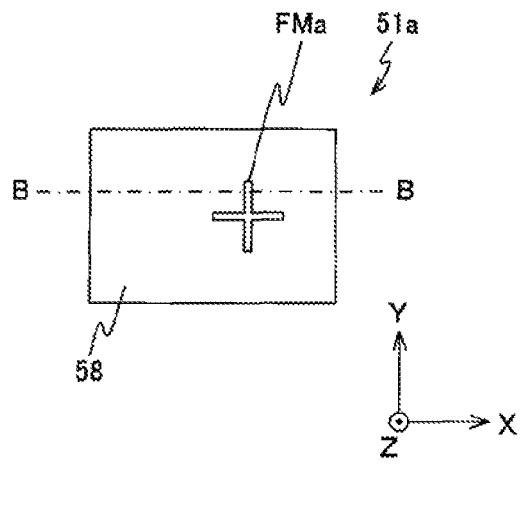
FIGS. 29A to 29C are views used to explain one of modified examples of the mark plate.
Figure 29B:
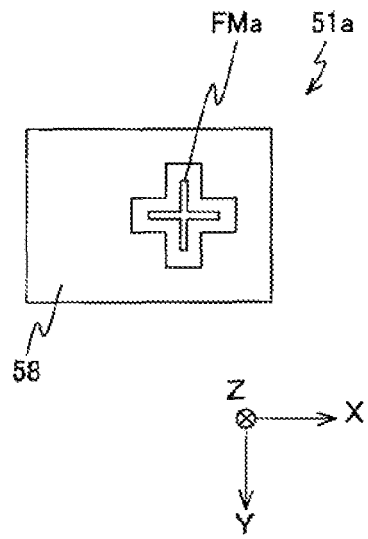
Figure 29C:
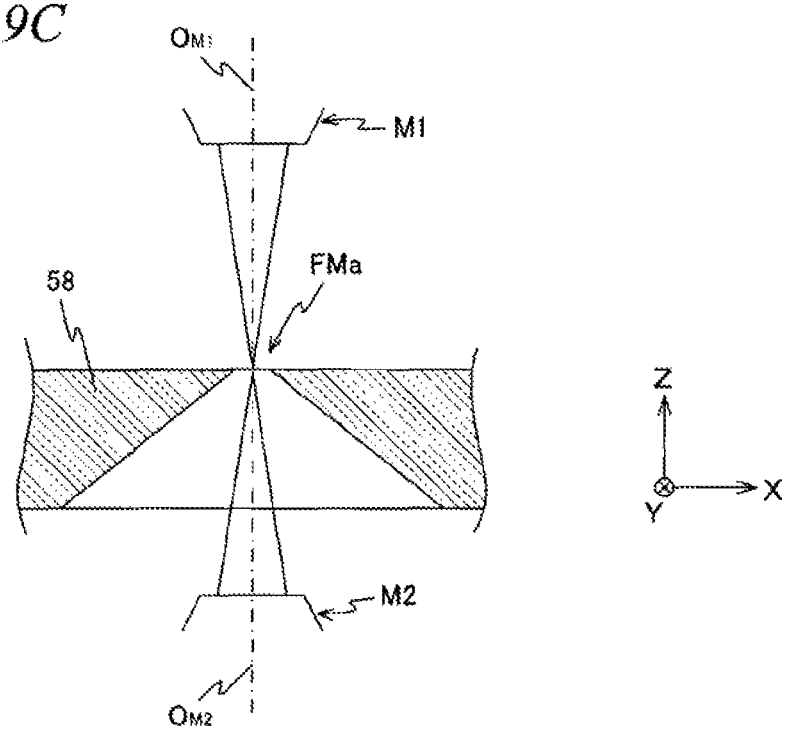

Further, in each of the embodiments above, while fiducial mark FM is formed on the membrane-like member, mark plate 51 related to each of the embodiments above is merely one example, and another mark plate can be used, as a matter of course, in the substrate bonding apparatus (100, 200, 300) in each of the embodiments above. FIGS. 29A to 29C show an example of a mark plate 51a by a knife-edge method that can be used instead of mark plate 51 described previously. Of these figures, FIG. 29A shows a plan view of mark plate 51a, FIG. 29B shows a bottom surface view of mark plate 51a, and FIG. 29C shows a cross section along the line B-B of mark plate 51a in FIG. 29A with partial omission, together with the first and second detection systems.

As can be seen when viewing FIGS. 29A to 29C together, mark plate 51a is equipped with a plate-shaped mark member 58 made of silicon Si having a predetermined thickness, e.g. 1 to 2 mm. In mark member 58, a fiducial mark FMa composed of a cross-shaped slit is formed. One side of the slit has a length of, for example, several hundreds μm and a width of around 20 to 30 μm. As shown in FIG. 29C, the inner periphery surface (sidewall surface) of the slit of mark member 58 makes an acute angle with respect to the upper surface.

As shown in FIG. 29C, fiducial mark FMa can be detected simultaneously from one surface side of mark member 58, on which the fiducial mark is formed, using first mark detection system M1 and from the other surface side using second mark detection system M2. In this case, since fiducial mark FMa of a light-transmitting type (slit method) as is described above is employed, first mark detection system M1 detects fiducial mark FMa by receiving a probe beam emitted from a light source, which second mark detection system M2 has, via the slit (i.e. fiducial mark FMa) formed on mark member 58, which is different from the case of using mark plate 51. Second mark detection system M2 detects fiducial mark FMa by receiving a probe beam emitted from a light source, which first mark detection system M1 has, via the slit (i.e. fiducial mark FMa).

Figure 30A:
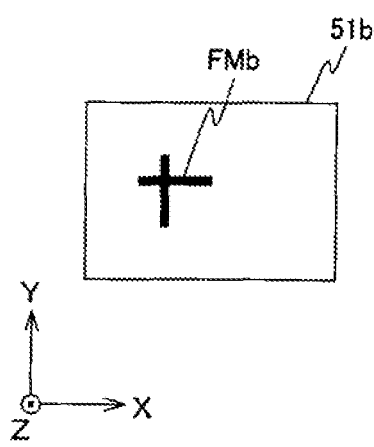
FIGS. 30A to 30E are views used to explain another example of the modified examples of the mark plate.
Figure 30B:
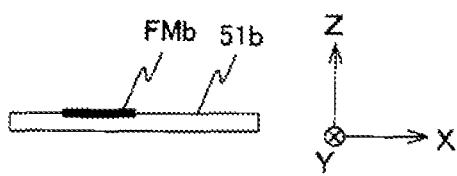
Figure 30C:
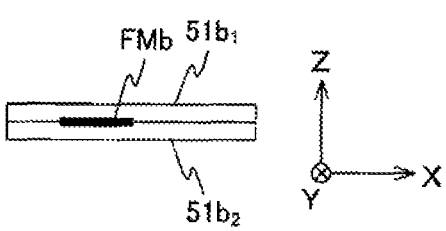

Further, FIGS. 30A to 30E show an example of another mark plate 51b that can be used instead of mark plate 51. As shown in FIGS. 30A and 30B, mark plate 51b is composed of a plate member made of a transparent material that transmits a probe beam of mark detection systems M1 and M2, e.g. a silica glass or the like, and on the surface of the plate member, a fiducial mark FMb with a variant cross shape, which is made of a material that reflects a probe beam, is formed. Further, from the viewpoint of preventing damage of fiducial mark FMb, as shown in FIG. 30C, fiducial mark FMb can be arranged in between two mark plates 51b$_1$ and 51b$_2$. Incidentally, the thickness of mark plate 51b is, for example, about 1 mm.

Figure 30D:
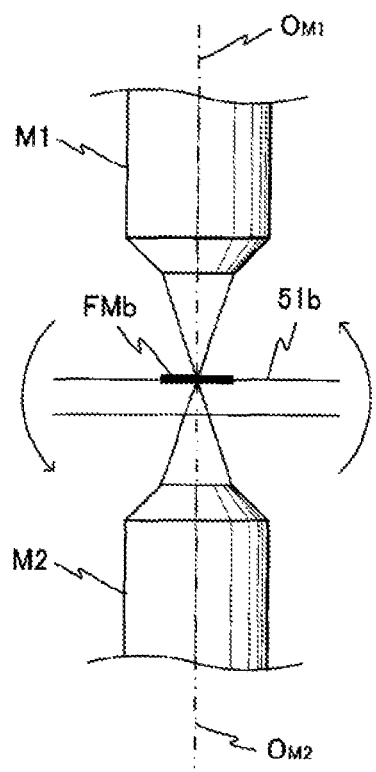

As shown in FIG. 30D, one surface of fiducial mark FMb and the other surface of fiducial mark FMb can simultaneously be detect by first mark detection system M1 and second mark detection system M2, respectively. Since fiducial mark FMb is formed on the one surface of mark plate 51b, a probe beam of first mark detection system M1 is directly irradiated on the one surface of fiducial mark FMb and a probe beam of second mark detection system M2 is transmitted through mark plate 51b and irradiated on the other surface of fiducial mark FMb, in FIG. 30D. As a matter of course, it is also possible that the one surface of mark plate 51 on which fiducial mark FMb is formed is made to face the side of second mark detection system M2 and a probe beam of second mark detection system M2 is directly irradiated on the one surface of fiducial mark FMb and a probe light of first mark detection system M1 is transmitted through mark plate 51b and irradiated on the other surface of fiducial mark FMb, which is inverse to the above described case. This arrangement is desirable in a viewpoint of preventing adhesion of a foreign material on fiducial mark FMb.

In the state shown in FIG. 30D, mark plate 51b and second table T2 are positioned such that the both surfaces of fiducial mark FMb are orthogonal to center axes $O_{M1}$ and $O_{M2}$ of both mark detection systems M1 and M2, and the surface positions of the both surfaces coincide with the focal points of both mark detection systems M1 and M2. In the state shown in FIG. 30D, when fiducial mark FMb is made to coincide with the index center of first mark detection system M1 and further the index center of second mark detection system M2 is made to coincide with fiducial mark FMb, center axes $O_{M1}$ and $O_{M2}$ of first and second mark detection systems M1 sand M2 perfectly coincide with each other.

Figure 30E:
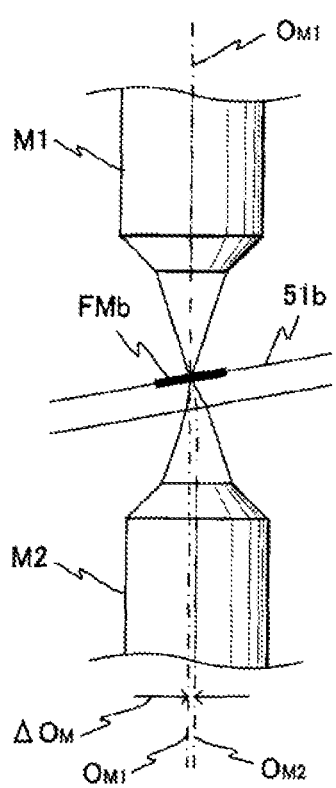

As shown in FIG. 30E, it is assumed that mark plate 51b tilts. In this state, it is assumed that fiducial mark FMb is detected with first and second mark detection systems M1 and M2 and the index center (i.e. the center axis) is made to coincide with fiducial mark FMb within the detection field of each of the mark detection systems. At this point in time, center axis $O_{M1}$ of first mark detection system M1 that directly irradiates a probe beam on fiducial mark FMb intersects fiducial mark FMb at the center of fiducial mark FMb. However, center axis $O_{M2}$ of second mark detection system M2 that makes a probe beam be transmitted through mark plate 51 and irradiates the probe beam on fiducial mark FMb deviates from the center of fiducial mark FMb, because of the halving effect (the effect of refraction of the probe beam by mark plate 51). As a consequence, center axes $O_{M1}$ and $O_{M2}$ of both mark detection systems M1 and M2 are displaced.

Deviation $\Delta O_M$ (see FIG. 30E) between center axes $O_{M1}$ and $O_{M2}$ owing to the halving effect causes, for example, measurement error of the baseline measurement described earlier. However, if the tilt of mark plate 51b is obtained, then deviation $\Delta O_M$ can be corrected from the thickness and the refractive index of mark plate 51b. Therefore, a tilt measuring system that measures a tilt angle θx around the X-axis and a tilt angle θy around the Y-axis of mark plate 51b can be installed. As a measurement instrument that configures this tilt measuring system, for example, a focal point position detecting system (an AF sensor) by an oblique incidence method is suitable.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A substrate bonding apparatus that bonds two substrates, the apparatus comprising:
   a first stage that holds one substrate of the two substrates;
   a second stage that holds the other substrate of the two substrates in an orientation capable of being opposed to the one substrate, and is movable relative to the first stage at least within a two-dimensional plane;
   a position measuring system that measures positional information of the second stage at least within the two-dimensional plane;
   a first detection system thatcan detect a subject mark that includes a mark on the substrate held by the second stage; and
   a second detection system mounted on the second stage and integrally moveable therewith, which can detect a subject mark that includes a mark on the substrate held by the first stage.

2. The substrate bonding apparatus according to claim 1, wherein the second detection system is fixed to the second stage.

3. The substrate bonding apparatus according to claim 1, wherein
   at least one of the first detection system and the second detection system can simultaneously detect a plurality of marks arranged on the substrate that is subject to the detection.

4. The substrate bonding apparatus according to claim 3, wherein
   at least one of the first detection system and the second detection system includes a plurality of detection devices that can individually detect each of the plurality of marks.

5. The substrate bonding apparatus according to claim 4, wherein
   of the plurality of detection devices, one detection device and the other detection device are relatively movable within the two-dimensional plane.

6. The substrate bonding apparatus according to claim 5, wherein
   one of the one detection device and the other detection device is fixed to a member serving as a base on which the one detection device and the other detection device are installed, and the other is movable within the two-dimensional plane with respect to the member serving as the base.

7. The substrate bonding apparatus according to claim 6, further comprising:
   a relative position measuring system that measures a relative position of the one detection device and the other detection device within the two-dimensional plane.

8. The substrate bonding apparatus according to claim 5, wherein
   the one detection device and the other detection device are independently movable within the two-dimensional plane.

9. The substrate bonding apparatus according to claim 8, further comprising:
   a detection system position measuring system that measures positional information of the one detection device and the other detection device within the two-dimensional plane.

10. The substrate bonding apparatus according to claim 1, wherein
    the first detection system is opposed to the substrate held by the second stage when the second detection system is opposed to the substrate held by the first stage.

11. The substrate bonding apparatus according to claim 1, wherein
    when at least a part of the first detection system and at least a part of the second detection system are opposed to each other, the first stage and a section, on which the substrate is mounted, of the second stage are located on sides opposite to each other with respect to a center of an opposed section of the first detection system that is opposed to the second detection system.

12. The substrate bonding apparatus according to claim 1, wherein
    the second stage includes a stage main section that is movable within the two-dimensional plane and a table that is movable at least in a direction orthogonal to the two-dimensional plane on the stage main section and holds the other substrate, and the second detection system is arranged on the stage main section.

13. The substrate bonding apparatus according to claim 12, wherein
    the table is movable in a predetermined range in the direction orthogonal to the two-dimensional plane that includes a position with which a surface of the substrate held by the table is positioned at a detection point of the first detection system, and
    the position measuring system can further measure positional information of the table in the direction orthogonal to the two-dimensional plane.

14. The substrate bonding apparatus according to claim 12, wherein
    the table is movable in a tilt direction with respect to the two-dimensional plane, on the second stage, and
    the position measuring system can further measure tilt information of the table.

15. The substrate bonding apparatus according to claim 1, further comprising:
    a separation distance measuring system that measures a separation distance between the substrate held by the first stage and the substrate held by the second stage.

16. The substrate bonding apparatus according to claim 1, wherein
    the position measuring system includes a plurality of interferometers each of which irradiates a reflection surface arranged on a part of the stage with a measurement beam.

17. The substrate bonding apparatus according to claim 1, wherein
    a detection subject of the first detection system further includes a first fiducial mark, and
    a detection subject of the second detection system further includes a second fiducial mark.

18. The substrate bonding apparatus according to claim 17, wherein
    the first fiducial mark and the second fiducial mark are formed on a same mark member.

19. The substrate bonding apparatus according to claim 18, wherein
    the second detection system can detect the second fiducial mark concurrently with the first detection system detecting the first fiducial mark.

20. The substrate bonding apparatus according to claim 19, wherein
    the first fiducial mark and the second fiducial mark are a same mark.

21. The substrate bonding apparatus according to claim 20, wherein
the same mark includes a slit-shaped light-transmitting section formed in a membrane member that is arranged on a part of the mark member.

22. The substrate bonding apparatus according to claim 21, wherein
the slit-shaped light-transmitting section is formed by removing a part of a light-shielding membrane formed on a surface of a transparent film.

23. The substrate bonding apparatus according to claim 21, wherein
the slit-shaped light-transmitting section is formed by forming a slit-shaped opening in a part of a plate-shaped light-shielding member.

24. The substrate bonding apparatus according to claim 18, wherein the mark member transmits a probe beam of the first and second detection systems.

25. The substrate bonding apparatus according to claim 24, further comprising:
a tilt measuring system that measures a tilt of the mark member.

26. The substrate bonding apparatus according to claim 18, wherein
the mark member is movable between a position with which a corresponding fiducial mark is positioned within a detection field of at least one the first and second detection systems, and a withdrawal position to which the mark member withdraws from the position.

27. The substrate bonding apparatus according to claim 26, further comprising:
a mark driving device that drives the mark member.

28. The substrate bonding apparatus according to claim 27, wherein
the mark driving device is arranged on the second stage.

29. The substrate bonding apparatus according to claim 1, wherein
the first detection system includes one of a transmissive microscope that detects a beam transmitted through a subject mark and a reflective microscope that detects a reflected beam from the subject mark, and
the second detection system includes one of the transmissive microscope and the reflective microscope.

30. The substrate bonding apparatus according to claim 1, wherein
the first stage is movable in the direction orthogonal to the two-dimensional plane.

31. The substrate bonding apparatus according to claim 30, wherein
the first stage is movable between a first position with which a surface of the substrate held by the first stage is positioned in a plane parallel to the two-dimensional plane that includes a detection point of the second detection system, and a second position to which the first stage withdraws from the first position.

32. The substrate bonding apparatus according to claim 1, wherein
the first stage and the second stage each hold the substrate via a substrate holding member.

33. A substrate bonding apparatus that bonds a first substrate having a first alignment mark and a second substrate having a second alignment mark, the apparatus comprising:
a first detection system that detects the first alignment mark;
a second detection system that is placed so as to be being opposed to the first detection system in a direction of an optical axis of the first detection system, is moveable with respect to the first detection system within a plane orthogonal to the optical axis of the first detection system and an optical axis of the second detection system, and detects the second alignment mark; and
an adjustment section that adjusts a relative positional deviation between the optical axis of the first detection system and the optical axis of the second detection system.

34. The substrate bonding apparatus according to claim 33, further comprising:
a positional deviation amount computing section that computes a positional deviation amount, from a fiducial mark, of each of the optical axis of the first detection system and the optical axis of the second detection system, wherein
based on the positional deviation amount computed by the positional deviation amount computing section, the second detection system is moved in a direction orthogonal to the optical axis of the second detection system.

35. The substrate bonding apparatus according to claim 33, further comprising:
a positional deviation amount computing section that computes a positional deviation amount, from a fiducial mark, of each of the optical axis of the first detection system and the optical axis of the second detection system, wherein
when the first substrate and the second substrate are bonded, the positional deviation amount computed by the positional deviation amount computing section is added, as a correction value, to detection results of the first detection system and the second detection system.

36. The substrate bonding apparatus according to claim 33, wherein
the first substrate and the second substrate are bonded after the optical axis of the first detection system and the optical axis of the second detection system are aligned.

37. A substrate bonding apparatus that bonds a first substrate having a first alignment mark and a second substrate having a second alignment mark, the apparatus comprising:
a first detection system that detects the first alignment mark;
a second detection system that is placed being opposed to the first detection system in a direction of a center axis of the first detection system, is relatively movable with respect to the first detection system within a plane orthogonal to the center axis of the first detection system and a center axis of the second detection system, and detects the second alignment mark; and
a positional deviation amount computing section that computes a positional deviation amount between the center axis of the first detection system and the center axis of the second detection system.

38. The substrate bonding apparatus according to claim 37, wherein
based on the positional deviation amount computed by the positional deviation amount computing section, at least one of the first detection system and the second detection system is moved in a direction orthogonal to the center axis of the second detection system.

39. The substrate bonding apparatus according to claim 37, wherein
the positional deviation amount computed by the positional deviation amount computing section is stored as a correction value, and when the first substrate and the second substrate are bonded, the correction value is added to a detection result of at least one of the first detection system and the second detection system.

40. The substrate bonding apparatus according to claim 37, wherein the positional deviation amount computed by the positional deviation amount computing section is stored as a correction value, and when the first substrate and the second substrate are bonded. the correction value is added to at least one of a movement distance of a stage that holds the first substrate and a movement distance of a stage that holds the second substrate.

41. The substrate bonding apparatus according to claim 37, wherein the positional deviation amount computing section computes a positional deviation amount based on a relative position of the center axis of the first detection system and the center axis of the second detection system, with respect to a fiducial mark.

* * * * *